United States Patent [19]

Hatakenaka

[11] Patent Number: 5,539,344
[45] Date of Patent: Jul. 23, 1996

[54] PHASE-LOCKED CIRCUIT AND INTERATED CIRCUIT DEVICE

[75] Inventor: Makoto Hatakenaka, Itami, Japan

[73] Assignee: Mitsubishi Denki Kabushiki Kaisha, Tokyo, Japan

[21] Appl. No.: 225,885

[22] Filed: Apr. 11, 1994

[30] Foreign Application Priority Data

Apr. 13, 1993 [JP] Japan ..................................... 5-086182

[51] Int. Cl.$^6$ ....................................................... H03L 7/00
[52] U.S. Cl. ........................... 327/147; 327/156; 327/159; 327/161; 327/292
[58] Field of Search ..................................... 327/141, 144, 327/146, 147, 149–153, 155, 156, 158–163, 231, 233, 235, 236, 241–244, 250, 251, 292, 2, 3, 7, 10, 12; 375/376

[56] References Cited

U.S. PATENT DOCUMENTS

| | | | |
|---|---|---|---|
| 4,267,514 | 5/1981 | Kimsey .......................................... | 327/7 |
| 4,443,765 | 4/1984 | Findeisen et al. ........................ | 327/277 |
| 4,604,582 | 8/1986 | Strenkowski et al. ................... | 327/147 |
| 4,675,612 | 6/1987 | Adams et al. ............................ | 327/152 |
| 4,713,621 | 12/1987 | Nakamura et al. ...................... | 327/163 |
| 4,755,704 | 7/1988 | Flora et al. . | |
| 4,789,996 | 12/1988 | Butcher .................................... | 327/159 |
| 4,847,870 | 7/1989 | Butcher .................................... | 327/156 |
| 4,868,514 | 9/1989 | Azevedo et al. ......................... | 327/155 |
| 4,868,522 | 9/1989 | Popat et al. . | |
| 5,079,519 | 1/1992 | Ashby et al. ............................. | 327/231 |
| 5,087,829 | 2/1992 | Ishihashi et al. ........................ | 307/269 |
| 5,223,755 | 6/1993 | Richley .................................... | 307/603 |
| 5,307,381 | 4/1994 | Ahuja ....................................... | 375/107 |
| 5,396,111 | 3/1995 | Frangiosu ................................. | 327/141 |

FOREIGN PATENT DOCUMENTS

| | | |
|---|---|---|
| 3818089 | 12/1989 | Germany . |
| 62-261216 | 11/1987 | Japan . |
| 2-123412 | 5/1990 | Japan . |

OTHER PUBLICATIONS

IEEE Journal of Solid–State Circuits, vol. 23, No. 5, Oct. 1988, pp. 1218–1223, Mark G. Johnson, et al., "A Variable Delay Line PLL For CPU–Coprocessor Synchronization".

*Primary Examiner*—Timothy P. Callahan
*Assistant Examiner*—T. Lam
*Attorney, Agent, or Firm*—Oblon, Spivak, McClelland, Maier & Neustadt

[57] ABSTRACT

The objects are to speed up the operation of an integrated circuit device having a sequential circuit and increase margin of phase synchronization for performing data processing of time sequential circuit. The phase-locked circuit (57) is provided in the integrated circuit (50), and the clock signal (CK7) which is inputted from the outside through the phase-locked circuit is supplied to the sequential circuit (52). The data outputted from the sequential circuit (52) is fed back from the output end of the buffer (Bu56) to the phase-locked circuit (57). In the phase-locked circuit (57), the clock signal (CK7) inputted through the buffer (Bu50) and the output data of the sequential circuit (52) are compared in phase and the phase of the clock signal outputted to the sequential circuit (52) is adjusted so that the phases thereof agree. The output data (DO7) outputted from the sequential circuit (52) is not delayed with respect clock signal (CK7). Accordingly, the data processing in the integrated circuit (70) can be speeded up.

18 Claims, 30 Drawing Sheets

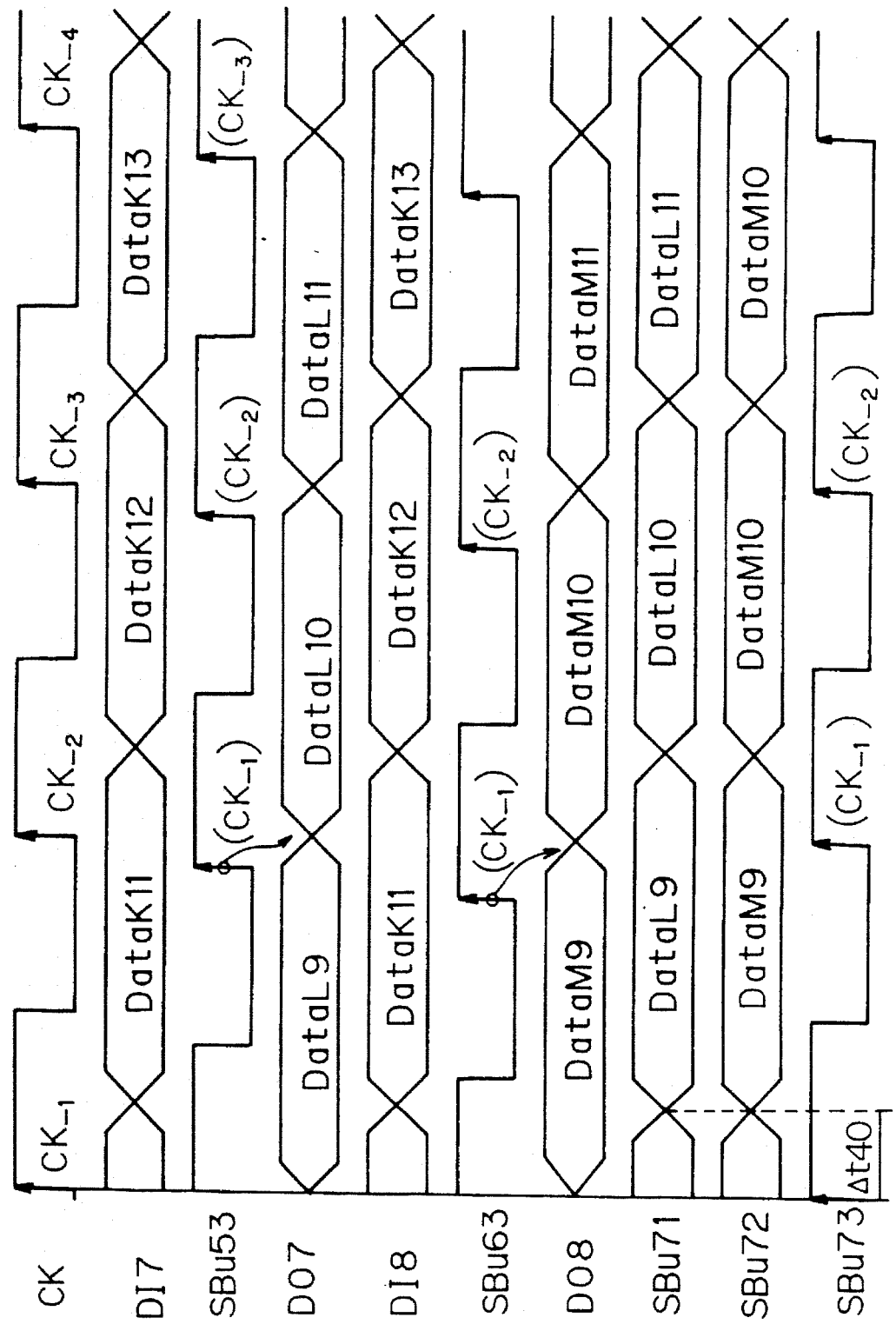

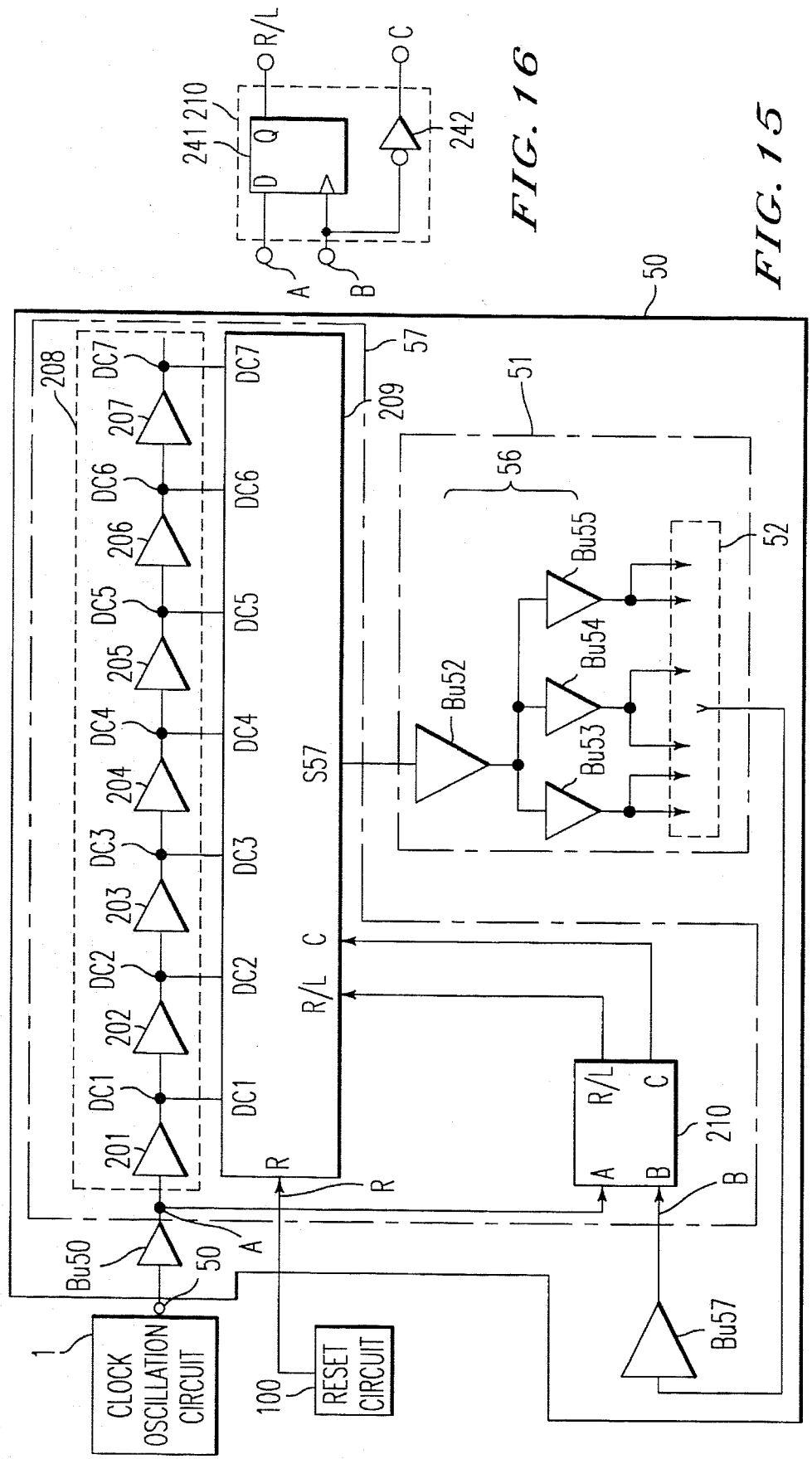

5,539,344

PHASE-LOCKED CIRCUIT AND INTERATED CIRCUIT DEVICE

BACKGROUND OF THE INVENTION

1. Field of the invention

The present invention relates to phase-locked circuits for preventing delay of clock signals distributed in integrated circuits and integrated circuit devices including the phase-locked circuits, and particularly to a phase-locked circuit for automatically adjusting the propagation delay time to avoid the difficulty in data transmission and reception in the synchronous digital data processing system and an integrated circuit device including the phase-locked circuit.

2. Description of the Background Art

Description will be made on the difficulty in data transmission and reception due to the propagation delay time in the digital data processing system. Especially, the propagation delay time occurring in the clock signals in the integrated circuits is a serious problem. One cycle of a clock signal is approximately 25 nS at 40 MHz. In integrated circuits, inputted external clock signals are generally distributed in the integrated circuits as internal clock signals after they have passed through an input buffer and a plurality of internal buffers connected in parallel. The plurality of stages of buffers are required because there is a limitation in the driving ability for the next stage of the buffers.

In this case, the external clock signal passes through the plural stages of buffers, so that the propagation delay time occurs between the internal clock signal and the external clock signal. For example, a delay of about 1–2 nS is caused when it passes through the input buffer. Now let us consider the case in which the data outputted from the first integrated circuit group in synchronization with the external clock signal is captured in synchronization with the external clock signal on the second integrated circuit.

FIG. 29 is a diagram showing a conventional integrated circuit. In the figure, 2 denotes an integrated circuit, 3 denotes a logic circuit provided in the integrated circuit 2, 4 denotes a sequential circuit provided in the logic circuit 3, 5 denotes a clock input terminal for receiving a clock signal CK1 inputted to the integrated circuit 2 from the outside, 6 denotes a data input terminal for receiving input data DI1 inputted to the integrated circuit 2 from the outside, 7 denotes a data output terminal for externally outputting the data processed in the integrated circuit 2, Bu1 denotes a buffer having its input end connected to the clock input terminal 5 to capture the clock signal CK1 inputted from the outside into the integrated circuit 2, Bu2 denotes a buffer having its input end connected to the data input terminal 6 to capture the input data DI1 inputted from the outside into the integrated circuit 2, Bu3 denotes a main buffer provided in the logic circuit 3 having its input end connected to an output end of the buffer Bu1 for supplying the clock signal to the sequential circuit 4, Bu4 through Bu6 denote buffers having their input ends connected to the output end of the buffer Bu3 and their output ends connected to the sequential circuit 4 for directly supplying the clock signal CK1 to the sequential circuit 4, 8 denotes a clock buffer including the buffers Bu3 through Bu6, and Bu7 denotes a buffer having its input end connected to the sequential circuit 4 and its output end connected to the data output terminal 7 for outputting the data DO1 processed in the sequential circuit 4 to the outside.

Now, a signal outputted from the buffer Bu1 is represented as SBu1, a signal outputted from the buffer Bu2 is represented as SBu2, a signal outputted from the buffer Bu4 is represented as SBu4, and a signal outputted from the sequential circuit 4 is represented as S4.

Next, the operation of the integrated circuit 2 shown in FIG. 29 will be described referring to FIG. 30. The input data DI1 is inputted from the data input terminal 6 in synchronization with the clock signal CK1 inputted to the clock input terminal 5. The input data DI1 includes a plurality of data such as DataA1, DataA2, and DataA3, which are sequentially inputted.

The inputted clock signal CK1 is captured into the integrated circuit 2 through the buffer Bu1. That is, the buffer Bu1 outputs the signal SBu1 into the integrated circuit 2. The signal SBu1 has a delay of a certain time $\Delta t1$ added in the buffer Bu1 with respect to the clock signal CK1. Furthermore, the clock buffer 8 receiving the signal SBu1 which is an output of the buffer Bu1 finally outputs the signal SBu4 and the like from the buffers Bu4 through Bu6 to the sequential circuit 4. For example, at this time, the signal SBu4 has a delay of a certain time $\Delta t2$ with respect to the signal SBu1. The delay time $\Delta t2$ is the signal delay in the buffer Bu3 and the buffer Bu4.

On the other hand, the inputted input data DI1 is captured into the integrated circuit 2 through the buffer Bu2. That is, the buffer Bu2 outputs the signal SBu2 into the integrated circuit 2. The signal SBu2 has a delay of a certain time added in the buffer Bu2 with respect to the clock signal CK1. Now, the first transitions of the clock signal CK1 for each clock are sequentially represented as $CK1\text{-}_1$, $Ck1\text{-}_2$, and $CK1\text{-}_3$. The data DataA1 is captured in the sequential circuit 4 at the first transition ($CKI\text{-}_1$) of the signal SBu4 corresponding to the first transition $CK1\text{-}_1$ of the clock signal CK1 and processed.

Then, the data processed in the sequential circuit 4 is outputted to the buffer Bu7 as the signal S4 which is synchronous with the signal SBu4. The timing of outputting the signal S4 has a delay of a certain time $\Delta t3$ with respect to the signal SBu4. Due to the delay in the buffer Bu7, the output data DO1 outputted from the data output terminal 7 is further delayed by a certain time $\Delta t4$ with respect to the signal S4.

Next, the relations among each clock signal, input data and output data in the case where a plurality of above-described integrated circuits are connected will be described using FIG. 31. In FIG. 31, 1 denotes a clock oscillation circuit for outputting a signal CK, 2 denotes a circuit having a function equivalent to the integrated circuit 2 shown in FIG. 29, and 9 and 16 denote integrated circuits having sequential circuits. In FIG. 31, the same characters as those in FIG. 29 denote corresponding parts in FIG. 29, respectively.

In the figure, 11 and 18 denote sequential circuits provided in the integrated circuits 9 and 16, respectively, 12 and 19 denotes clock input terminals receiving clock signals CK2 and CK3 inputted into the integrated circuits 9 and 16 from the outside, respectively, 13 denotes a data input terminal receiving input data DI2 inputted into the integrated circuit 9 from the outside, 20 and 21 denote data input terminals receiving input data inputted into the integrated circuit 16 from the outside, 14 and 22 denote data output terminals for outputting data processed in the integrated circuits 9 and 16 to the outside, Bu8 and Bu15 denote buffers having input ends connected to the clock input terminals 12 and 19 to capture the clock signals CK2 and CK3 inputted from the outside into the integrated circuits 9 and 16, Bu9 denotes a buffer having its input end connected to the data input terminal 13 to capture the input data DI2 inputted from the outside into the integrated circuit 9, Bu16 and Bu17 denote buffers having input ends respectively connected to the data input terminals 20 and 21 to, capture the input data inputted from the outside into the integrated circuit 16, respectively, Bu 10 and Bu 18 denote main buffers respectively provided in the integrated circuits 9 and 16 having input ends connected to the output ends of the buffers Bu8 and Bu15 for supplying the clock signals respectively to the sequential circuits 11 and 18, Bu11 through Bu13 and Bu19 through Bu21 respectively denote buffers having input ends connected to the output terminals of the buffers Bu10 and Bu18 and output ends connected to the sequential circuits 11 and 18 for directly supplying the clock signals to the sequential circuits 11 and 18, 15 and 23 respectively denote clock buffers including the buffers Bu10 through Bu13 and the buffers Bu18 through Bu21, Bu14 denotes a buffer having its input end connected to the sequential circuit 11 and its output end connected to the data output terminal 14 to output the output data DO2 processed in the sequential circuit 11 to the outside from the integrated circuit 9, and 22 denotes a data output terminal having its input end connected to the sequential circuit 18 through a buffer for outputting output data DO3 processed in the sequential circuit 18 from the integrated circuit 16 to the outside.

A signal outputted from the buffer Bu8 is represented as SBu8, and a signal outputted from the buffer Bu11 is represented as SBu11. Also, signals outputted from the buffers Bu16 and Bu17 are respectively represented as SBu16 and SBu17, and a signal outputted from the buffer Bu19 is represented as SBu19.

Now, the integrated circuit 2 and the integrated circuit 9 form the first integrated circuit group. The integrated circuit 16 is the second integrated circuit. The integrated circuit 2 captures the input data DI1 from the data input terminal 6 in synchronization with the clock signal CK1 supplied to the clock input terminal 5 from the outside, processes the data in the sequential circuit 4, and outputs the output data DO1 produced in the sequential circuit 4 from the data output terminal 7 to the outside. The integrated circuit 9 captures the input data DI2 from the data input terminal 13 into the sequential circuit 11 in synchronization with the clock signal CK2 supplied to the clock input terminal 12 from the outside, processes the data in the sequential circuit 11, and outputs the output data DO2 produced in the sequential circuit 11 from the data output terminal 14 to the outside. The clock signals CK1 and CK2 differ from the clock signal CK outputted from the clock oscillation circuit 1 because the waveforms become dull and slight delays occur during the propagation, but they are treated as the same signals as the clock signal CK since the differences are very small.

The integrated circuit 16 has its data input terminal 21 connected to the data output terminal 7 of the integrated circuit 2 and its data input terminal 20 connected to the data output terminal 14 of the integrated circuit 9. The integrated circuit 16 receives the data DO1 and DO2 respectively processed in the integrated circuit 2 and the integrated circuit 9 as input data from the data input terminal 21 and the data input terminal 20, respectively. The inputted data DO1 and DO2 are inputted into the sequential circuit 18 as the signals SBu17 and SBu16 through the buffer Bu17 and the buffer Bu16, respectively. The sequential circuit 18 is driven by the signal SBu19 to process the inputted signals SBu16 and SBu17.

The operations of the integrated circuit 2, the integrated circuit 9 and the integrated circuit 16 described above are shown in FIG. 32. In the sequential circuit 4 of the integrated circuit 2, the input data DI1 including the data DataA11, dataA12 and DataA13 and the like which are inputted from the data input terminal 6 are processed in synchronization with the signal SBu4, and the output data DO1 including produced data DataB9, DataB10 and DataB11 and the like are outputted from the data output terminal 7 in synchronization with the signal SBu4. The signal SBu4 has a delay of a certain time Δt10 with respect to a first transition of the clock signal CK. The delay is caused in the buffer Bu1 and the clock buffer 8. The timings at which respective data of the output data DO1 are outputted delay with respect to the first transitions of the signal SBu4 due to processing in the sequential circuit 4 and passing through the buffer Bu7. Accordingly, the output data DO1 delays by a certain time Δt11 from the clock signal CK.

Similarly, in the sequential circuit 11 of the integrated circuit 9, the input data DI2 inputted from the data input terminal 13 is processed in synchronization with the signal SBu11 and the produced output data DO2 is outputted from the data output terminal 14 in synchronization with the signal SBu11. The timing at which the signal SBu11 is outputted has a delay of a certain time Δt12 with respect to the first transition of the clock signal CK. The delay occurs in the buffer Bu8 and the clock buffer 15. Being processed in the sequential circuit 11 and passing through the buffer Bu14, the output data DO2 is outputted from the integrated circuit 9 at the timing which is delayed from the first transition of the signal SBu11. Accordingly, the timing at which the output data DO2 is outputted is delayed by a certain time Δt13 with respect to the first transition of the clock signal CK.

The output data DO1 and the output data DO2 inputted to the data input terminals 20 and 21 of the integrated circuit 16 from the sequential circuits 4 and 11 are transmitted to the sequential circuit 18 through the buffer Bu17 and the buffer Bu16, so that they are further delayed by a certain time when arriving at the sequential circuit 18. The signal SBu16 inputted to the sequential circuit 18 from the sequential circuit 11 is added with the delay in the clock buffer 15, the sequential circuit 11 and the buffers Bu8, Bu14 and Bu16, and is delayed by a certain time Δt15 with respect to the first transition of the clock signal CK. Also the signal SBu17 inputted to the sequential circuit 18 from the sequential circuit 4 is added with the delay in the clock buffer 8, the sequential circuit 4 and the buffers Bu1, Bu7 and Bu17, and is therefore delayed by a certain time Δt14 with respect to the first transition of the clock signal CK. Now, since the delay times Δt15 and Δt14 of the signals SBu16 and SBu17 inputted to the sequential circuit 18 differ, the range in which the fluctuation in timing of the internal clock signal (the signal SBu19) for capturing and processing the signals SBu16 and SBu17 in the sequential circuit 18 can be permitted is narrowed to make the data transmission/reception difficult. Also, the processing speed of the integrated circuit 16 is slow because the data processings and the like are performed with the skew between the signals SBu16 and SBu17, which causes a trouble in speeding-up.

Especially, in the high speed data transfer in which the period of a external clock cycle is roughly equal to the level of the propagation delay times, there is a necessity of eliminating the propagation delay time between the internal clock signal and the external clock signal to eliminate difference in phase as the first measure to precisely transfer and receive data.

As an example, there is the clock distributing circuit disclosed in Japanese Patent Laying-Open No. 62-261216. This example has a phase-locked circuit including a delay circuit having external clock signals as input and having a plurality of delay elements connected in series, a selection circuit for sequentially selecting respective tap outputs of the delay circuit corresponding to output of a counter, a buffer circuit for distributing clock signals selected by the selection circuit, and a control circuit for counting up a value of the counter if there is a phase difference between the buffer circuit output and the external clock signal.

In the integrated circuit having the phase-locked circuit provided therein, the value counted by the counter increases until the phase of the buffer circuit output, i.e., the internal clock signal agrees with the external clock signal, where the phase of the internal clock signal is delayed, and the counting operation is stopped when the external clock and the internal clock agree in phase to determine the phase of the internal clock signal.

The structure has some weak points, such as, the operation speed of the counter is slow, such a circuit for coding the counter output and selecting the outputs from the taps is required, so that it is not suitable for speeding up and miniaturizing of the circuits.

Furthermore, in the integrated circuit using the clock distribution circuit disclosed in Japanese Patent Laying-Open. No. 62-26126, the difference in phase of the external clock signal and the internal clock signal is made small so that the propagation delay time caused in the clock buffer can be neglected for precise data transmission and reception, but the propagation delay time in the sequential circuit, the output buffer and the like added to the output data can not be removed in this case, either.

In the conventional integrated circuit devices having such structures as described above, there has been a problem that the time required for the phase-locked circuit provided in the integrated circuit to determine the phase of the internal clock is long, so that it has been difficult to transmit and receive data with integrated circuits performing high-speed data processings being connected to each other.

Also, The output timing of the data outputted from the integrated circuits 2, 9, 16 has a considerably large delay time from a first transition of the clock signal CK supplied to the integrated circuits 2, 9, 16, and the skews differ in respective integrated circuits 2 and 9. Accordingly, there have been problems that the data transmission and receipt are difficult and the processing speed of the integrated circuit 16 which receives and processes the data is slow not to enable high speed data processings.

SUMMARY OF THE INVENTION

According to the first aspect of the present invention, an integrated circuit device and having an integrated circuit receiving a reference clock signal as input and including a sequential circuit operating in response to a clock signal synchronized with the reference clock signal, comprises: feed back means for feeding back an output signal of the sequential circuit; and a phase-locked circuit connected to the feed back means and receiving the output signal of the sequential circuit and also supplying the clock signal to the sequential circuit in synchronization with the reference clock signal while controlling the phase of the clock signal so that the skew of the output signal of the sequential circuit in accordance with the reference clock signal is made small.

According to the first aspect of the present invention, the phase-locked circuit can supply the clock for driving the sequential circuit while controlling the phase of the clock signal for driving the sequential circuit so that the phase of the output signal of the sequential circuit approaches the phase of the reference clock signal by comparing, for example, the output signal of the sequential circuit inputted by the feed back means and the reference clock signal. Accordingly, because the phase of the output signal outputted from the sequential circuit is close to the phase of the reference clock signal, it can be adapted to the high-speed signal processings by processing the output signal of the sequential circuit in accordance with the reference clock signal in the integrated circuit in the integrated circuit device.

According to the first aspect of the present invention, the integrated circuit device includes the feed back means for feeding back the output signal of the sequential circuit and the phase-locked circuit connected to the feed back means to receive the output signal of the sequential circuit and receiving also the reference clock signal to control the phase of the clock signal which drives the sequential circuit so that the phase of the output signal of the sequential circuit approaches the phase of the reference clock signal for supplying the clock signal driving the sequential circuit to the sequential circuit, so that the delay occurring when the output signal of the sequential circuit is outputted can be made small with respect to the reference signal, resulting in the effect that the phase synchronization with high degree of freedom can be obtained to speed up the operation of the integrated circuit device.

Preferably, according to the second aspect of the present invention, the phase-locked circuit in the integrated circuit device comprises; a delay circuit having a plurality of stages of delay elements connected in series, a clock signal input terminal connected to an input end of the first stage of delay element and to which the reference clock signal is inputted and a plurality of delay clock output terminals connected to respective output ends of the plurality of delay elements, a selection circuit having a plurality of delay clock input terminals respectively connected to corresponding ones of the plurality of delay dock output terminals of the delay circuit, an output terminal and a first and a second control terminals for selecting any of the plurality of clock signals inputted from the delay clock input terminals according to the signals inputted to the first and the second control terminals to output the signal to the sequential circuit from the output terminal, and a phase comparison circuit having a first input terminal connected to the feed back means and to which the output signal of the sequential circuit is inputted, a second input terminal receiving the reference clock signal from the clock signal input terminal of the delay circuit, and a first and a second control signal output terminals respectively corresponding to the first and second control terminals of the selection circuit, for comparing phases of the signals inputted respectively from the first input terminal and the second input terminal to output a phase comparison signal indicating a result of checking advance/delay in phase to the first control terminal from the first control signal output terminal and outputting a phase switch signal indicating timing of selection to the second control terminal from the second control signal output terminal.

According to the second aspect of the present invention, the phase comparison circuit compares the phase of the clock signal inputted to the input end of the delay element at the first stage of the delay circuit and the phase of the output signal of the sequential circuit by the feed back means to output the phase comparison signal indicating the result of checking the advance/delay in phase and the phase switch signal indicating timing of selection to the selection circuit corresponding to the result of the comparison. The delay circuit having the plurality of delay elements can output clock signals with different delay times from the plurality of delay clock output terminals. The selection circuit can select and output the most suitable clock signal in the clock signals outputted from the plurality of delay clock output terminals of the delay circuit according to the phase comparison signal and the phase switch signal. In this way, with the phase of the clock signal for driving the sequential circuit being controlled so that the phase of the output signal of the sequential circuit approaches the phase of the reference clock signal by the phase comparison circuit, the delay circuit and the selection circuit, the clock for driving the sequential circuit can be supplied.

According to the second aspect of the present invention, the integrated circuit device includes the delay circuit having the plurality of stages of delay elements connected in series, the clock signal input terminal connected to the input end of the first stage of delay elements and to which the reference clock signal is inputted and the plurality of delay clock output terminals connected to respective output ends of the plurality of delay elements, the selection circuit having the plurality of delay clock input terminals respectively connected to the corresponding ones of the plurality of delay clock output terminals of the delay circuit, the output terminal and the first and the second control terminals for selecting any of the plurality of dock signals inputted from the delay clock input terminals according to the signals inputted to the first and the second control terminals to output the signal to the sequential circuit from the output terminal, and the phase comparison circuit having the first input terminal connected to the feed back means and to which the output signal of the sequential circuit is inputted, the second input terminal receiving the clock signal from the clock signal input terminal of the delay circuit, and the first and second control signal output terminals respectively corresponding to the first and second control terminals of the selection circuit for comparing the phases of the signals respectively inputted from the first input terminal and the second input terminal to output the phase comparison signal indicating a result of checking advance/delay in phase to the first control terminal from the first control signal output terminal and outputting the phase switching signal indicating timing of selection to the second control terminal form the second control signal output terminal, therefore the clocks for driving the sequential circuit can be supplied so that the phase of the output signal of the sequential circuit approaches the phase of the reference clock signal, which has the effects that the phase synchronization with high degree of freedom can be obtained and the integrated circuit device can be operated at high speed.

Preferably, according to the third aspect of the present invention, the selection circuit in the integrated circuit device further comprises a shift register connected to the first and second control terminals of the selection circuit and having a plurality of registers corresponding to the plurality of delay clock input terminals, respectively, one of the registers for storing data being selected according to a reset signal, for determining a shift direction of the data according to the phase comparison signal outputted from the phase comparison circuit, and performing shift operation of the data according to the phase switch signal, and selects the clock signal inputted from the delay clock input terminal which corresponds to the register storing the data.

According to the third aspect of the present invention, the shift register can instruct switch of selection signals by the high-speed operation of moving the data stored in the register in response to the inputted phase comparison signal and the phase switch signal, so that it can be adapted even if the frequency of the reference clock signal become high.

According to the third aspect of the present invention, the integrated circuit device further comprises the shift register connected to the first and second control terminals of the selection circuit and having the plurality of registers corresponding to the plurality of delay clock input terminals, respectively, one of the registers for storing the data being selected according to the reset signal, for determining the shift direction of the data corresponding to the phase comparison signal outputted from the phase comparison circuit and performing the shift operation of the data in accordance with the phase switch signal, in which the clock signal inputted from the delay clock input terminal corresponding to the register storing the data is selected, so that the delay clock outputted by the delay circuit can be selected in a short time in the selection circuit, which produces an effect that it can be adapted to speed up of the operation of the integrated circuit device. It also has an effect that the small-sizing of the integrated circuit device can be enabled by means of the shift register.

Preferably, according to the fourth aspect of the present invention, the selection circuit of the integrated circuit device further comprises reset signal generating means connected to the shift register for outputting the reset signal to the shift register when the data is moved to the register at the first stage or the final stage of the shift register.

According to the fourth aspect of the present invention, in the resetable shift register, the reset signal is outputted to the shift register by the reset signal generating means when the data is moved to the register at the first stage or the final stage in the shift register, so that reset is made when the data is moved to the register at the first or final stage in the shift register due to an abnormal operation, for example, if the phase synchronization is broken, to enable the shift resister to return to the normal operation.

According to the fourth aspect of the present invention, the integrated circuit device includes the reset signal generating means connected to the shift register for outputting the reset signal to the shift register when the data is moved to the first or the final stage of the register in the shift register, so that it has an effect that an integrated circuit device can be obtained which is capable of self-recovery if a malfunction occurs, for example, if the phase of the clock signal gets out of synchronization.

Preferably, according to the fifth aspect of the present invention, the phase-locked circuit of the integrated circuit device further comprises shift control means connected to the first control signal output terminal of the phase comparison circuit and the first control terminal of the selection circuit for outputting a signal for forcing the shift register to shift in the direction opposite to the direction indicated by the phase comparison signal to the first control terminal when the data is moved to the register at the first stage or the final stage in the shift register and holding the opposite direction shift state until the phase comparison signal changes.

According to the fifth aspect of the present invention, if the data is moved to the first stage or the final stage of register in the shift register due to an abnormal operation, for example, when the phase synchronization is broken, the shift control means outputs the signal for forcing the shift register to shift in the direction opposite to the direction indicated by the phase comparison signal to the first control terminal and holds the state of the opposite direction shift until the phase comparison signal changes, so that the shift register can be forced to return to the normal condition.

According to the fifth aspect of the present invention, the integrated circuit device includes the shift control means connected to the first control signal output terminal of the phase comparison circuit and the first control terminal of the selection circuit for outputting the signal for forcing the shift register to shift in the direction opposite to the direction indicated by the phase comparison signal to the first control terminal when the data is moved to the first or final stage of the resister in the shift register and holding the opposite direction shift state until the phase comparison signal changes, so that it has an effect that an integrated circuit device can be obtained which is capable of self-recovery if a malfunction occurs, for example, if the clock signal gets out of synchronization.

Preferably, according to the sixth aspect of the present invention, in the integrated circuit device, the integrated circuit includes a first and a second integrated circuits, and the phase-locked circuit is provided in the first integrated circuit, the sequential circuit is provided in the second integrated circuit, and the first integrated circuit is formed on a substrate which is different from the second integrated circuit.

According to the sixth aspect of the present invention, the first and the second integrated circuits are formed on different substrates, so that only the first integrated circuit having the phase-locked circuit provided therein can be designed and produced, for example. Also the second integrated circuit can be designed and produced without consideration of the delay of the output signals outputted from the sequential circuit.

According to the integrated circuit of the sixth aspect of the present invention, the phase-locked circuit is provided in the first integrated circuit, the sequential circuit is provided in the second integrated circuit, and the first integrated circuit is formed on the substrate which is different from the second integrated circuit, which produces an effect that an integrated circuit device operating at high speed can be easily obtained.

Preferably, according to the seventh aspect of the present invention, in the integrated circuit device, the integrated circuit further comprises a first buffer for buffering the reference clock signal inputted from the outside, and the feed back means comprises a second buffer having an amount of delay the same as the first buffer.

According to the seventh aspect of the present invention, since the second buffer has the same amount of delay as the first buffer, the delay time occurring in the first buffer when the reference clock signal is inputted into the integrated circuit from the outside can be included in the adjustment of phase in the phase-locked circuit by feeding back the output signal of the sequential circuit to the phase-locked circuit through the second buffer.

According to the integrated circuit device of the seventh aspect of the present invention, the integrated circuit further comprises the first buffer for buffering the reference clock signal inputted from the outside, and the feed back means comprises the second buffer having amount of delay the same as the first buffer, so that the delay in the first buffer can be compensated for by the second buffer to make the delay occurring when the output signal of the sequential circuit is outputted small with respect to the reference clock signal, which produces the effect that the phase synchronization having high degree of freedom can be obtained and the speed of the operation of the integrated circuit device can be increased.

In another aspect of the present invention, an integrated circuit device comprises: a first integrated circuit including a first sequential circuit operating in response to a clock signal and receiving a reference clock signal from the outside; a second integrated circuit including a second sequential circuit operating in response to a clock signal and receiving a reference clock signal from the outside; wherein the first integrated circuit further includes feed back means for feeding back an output signal of the first sequential circuit, and a first phase-locked circuit connected to the fed back means and receiving the output signal of the first sequential circuit and the reference clock signal for supplying the clock signal for driving the first sequential circuit to the first sequential circuit while controlling the phase of the clock signal for driving the first sequential circuit so that the phase of the output signal of the first sequential circuit approaches the phase of the reference clock signal; the second integrated circuit further includes feed back means for feeding back the clock signal for driving the second sequential circuit at the time of input to the second sequential circuit and a second phase-locked circuit connected to the feed back means and receiving the reference clock signal and the clock signal driving the second sequential circuit for supplying the clock signal driving the second sequential circuit to the second sequential circuit while controlling the phase of the clock signal driving the second sequential circuit at the time of the input so that the phase of the clock signal approaches the phase of the reference clock; and the output signal outputted from the first sequential circuit is processed in the second sequential circuit.

According to the eighth aspect of the present invention, the second sequential circuit in the second integrated circuit operates in response to a clock signal having phase which almost agrees with the reference clock signal, and inputs and processes the output signal having phase which almost agrees with the reference clock signal from the first sequential circuit of the first integrated circuit, so that the output signal of the first sequential circuit can be processed correspondingly even if the frequency of the clock signal increases. According to the eighth aspect of the present invention, the integrated circuit device includes the first integrated circuit including the first sequential circuit operating in response to the clock signal and receiving the reference clock signal from the outside, the second integrated circuit including the second sequential circuit operating in response to the clock signal and receiving the reference clock signal from the outside, wherein the first integrated circuit further includes the feed back means for feeding back the output signal of the first sequential circuit, and the first phase-locked circuit connected to the feed back means to receive the output signal of the first sequential circuit and the reference clock signal for controlling the phase of the clock signal for driving the first sequential circuit so that the phase of the output signal of the first sequential circuit approaches the phase of the reference clock signal and supplying the clock signal to drive the first sequential circuit to the first sequential circuit, the second integrated circuit further includes the feed back means for feeding back the clock signal for driving the second sequential circuit at the time of input into the second sequential circuit and the second phase-locked circuit connected to the feed back means and receiving the reference clock signal and the clock signal driving the second sequential circuit, for supplying the clock signal driving the second sequential circuit to the second sequential circuit while controlling the phase of the clock signal at the time of input so that the phase of the clock signal driving the second sequential circuit approaches the phase of the reference clock, and the output signal outputted from the first sequential circuit is processed in the second sequential circuit, so that it has the effect that the phase synchronization with high degree of freedom can be obtained and high speed processing in the second sequential circuit is enabled.

The present invention is also directed to a phase-locked circuit comprising: a delay circuit having a plurality of stages of delay elements connected in series, a clock signal input terminal connected to an input end of the first stage of the delay element and to which a reference clock signal is inputted and a plurality of clock output terminals connected to respective output terminals of the plurality of delay elements; a selection circuit having a plurality of delay clock input terminals connected to corresponding ones of the plurality of delay clock output terminals of the delay circuit, an output terminal and a first and a second control terminals, for selecting and outputting from the output terminal any of the plurality of clock signals inputted from the delay clock input terminals according to signals inputted to the first and second control terminals; and a phase comparison circuit having a first input terminal, a second input terminal receiving the reference clock signal from the clock signal input terminal of the delay circuit and a first and a second control signal output terminals respectively corresponding to the first and second control terminals of the selection circuit, for comparing the phases of signals respectively inputted from the first input terminal and the second input terminal to output a phase comparison signal indicating result of checking advance/delay in phase to the first control terminal from the first control signal output terminal and output a phase switch signal indicating timing of selection to the second control terminal from the second control signal output terminal; wherein the selection circuit further comprises a shift register connected to the first and second control terminals of the selection circuit and having a plurality of registers respectively correspond to the plurality of delay clock input terminals, one of the registers storing data being selected in response to a reset signal, for determining a shift direction of the data according to the phase comparison signal outputted from the phase comparison circuit and performing shift operation of the data in response to the phase switch signal; and selects the clock signal inputted from the delay clock input terminal corresponding to the register storing the data.

According to the ninth aspect of the present invention, the shift register in the selection circuit can instruct switch of selection signals in the high speed operation in which the data stored in the register is moved in response to the inputted phase comparison signal and the phase switch signal, so that it can be adapted even if the frequency of the reference clock signal becomes high.

According to the phase-locked circuit of the ninth aspect of the present invention, the selection circuit further comprises the shift register connected to the first and second control terminals of the selection circuit and having the plurality of registers respectively corresponding to the plurality of delay clock input terminals, one of the registers for storing the data being selected in response to the reset signal, for determining the shift direction of the data in response to the phase comparison signal outputted from the phase comparison circuit and performing the shift operation of the data in response to the phase switch signal, and selects the clock signal inputted from the delay clock input terminal corresponding to the register storing the data, so that the delay clock outputted from the delay circuit can be selected in a short time in the selection circuit, which produces an effect that it can be adapted to speed up of operation of the integrated circuit device. It also has an effect that the down-sizing of the integrated circuit device is enabled because the shift register is used.

In another aspect of the present invention, an integrated circuit device having an integrated circuit receiving a reference clock signal as input and including a sequential circuit operating in response to a clock signal synchronized with the reference clock signal, comprises: feed back means for feeding back a clock signal inputted to the sequential circuit for driving the sequential circuit; a delay circuit having a plurality of stages of delay elements connected in series, a clock signal input terminal connected to an input end of the first stage of the delay element and to which the reference clock signal is inputted and a plurality of delay clock output terminals connected to respective output ends of the plurality of delay elements; a selection circuit having a plurality of delay clock input terminals respectively connected to corresponding ones of the plurality of delay clock output terminals of the delay circuit, an output terminal, and a first and a second control terminals for selecting any of the plurality of clock signals inputted from the delay clock input terminals according to signals inputted to the first and second control terminals and outputting to the sequential circuit from the output terminal; and a phase comparison circuit having a first input terminal connected to the feed back means and receiving the clock signal inputted to the sequential circuit, a second input terminal receiving the clock signal from the clock signal input terminal of the delay circuit and a first and a second control signal output terminals respectively corresponding to the first and second control terminals of the selection circuit, for comparing phases of signals respectively inputted from the first input terminal and the second input terminal to output a phase comparison signal indicating a result of checking advance/delay in phase to the first control terminal from the first control signal output terminal and outputting a phase switch signal indicating timing of selection to the second control terminal from the second control signal output terminal; wherein the selection circuit further comprises a shift register connected to the first and second control terminals of the selection circuit and having a plurality of registers respectively corresponding to the plurality of delay clock input terminals, one of the registers for storing data being selected in response to a reset signal, for determining a shift direction of the data according to the phase comparison signal outputted from the phase comparison circuit and performing shift operation of the data according to the phase switch signal; and selects the clock signal inputted from the delay clock input terminal corresponding to the register storing the data.

According to the tenth aspect of the present invention, in the phase-locked circuit, the phase comparison circuit compares the inputted clock signal for driving the sequential circuit and the reference clock signal with the feed back means, and clocks for driving the sequential circuit can be supplied while the selection circuit selects the phase of the clock signal driving the sequential circuit so that the phase of the output signal of the sequential circuit approaches the phase of the reference clock signal. Accordingly, because the phase of the output signal outputted from the sequential circuit is close to the phase of the reference clock signal, it can be adapted to the high speed signal processing by processing the output signal of the sequential circuit in accordance with the reference clock signal in the integrated circuit in the integrated circuit device. At this time, the shift register in the selection circuit can instruct switch of the selection signal in the high speed operation of moving the data stored in the register in response to the phase comparison signal and the phase switch signal inputted from the phase comparison circuit, so that it can be adapted even if the frequency of the reference clock signal increases.

According to the tenth aspect of the present invention, the integrated circuit device includes the feed back means for feeding back the clock signal inputted to the sequential circuit for driving the sequential circuit, the selection circuit having the plurality of delay clock input terminals respectively connected to corresponding ones of the plurality of delay clock output terminals of the delay circuit, the output terminal, and the first and the second control terminals, for selecting any of the plurality of clock signals inputted from the delay clock input terminals according to the signals inputted to the first and second control terminals and outputting to the sequential circuit from the output terminal, and the phase comparison circuit connected to the feed back means and having the first input terminal receiving the clock signal inputted to the sequential circuit, the second input terminal receiving the clock signal from the clock signal input terminal of the delay circuit and the first and the second control signal output terminals respectively corresponding to the first and second control terminals of the selection circuit, for comparing the phases of the signals respectively inputted from the first input terminal and the second input terminal to output the phase comparison signal indicating the result of checking advance/delay in phase to the first control terminal from the first control signal output terminal and outputting the phase switch signal indicating the timing of selection to the second control terminal from the second control signal output terminal, wherein the selection circuit further comprises a shift register connected to the first and second control terminals of the selection circuit and having the plurality of registers respectively corresponding to the plurality of delay clock input terminals, one of the registers for storing data being selected in response to the reset signal, for determining the shift direction of the data according to the phase comparison signal outputted from the phase comparison circuit and performing the shift operation of the data according to the phase switch signal, and selects the clock signal inputted from the delay clock input terminal which corresponds to the register storing the data, so that the delay clock outputted by the delay circuit can be selected in a short time in the selection circuit, which produces an effect that it can be adapted to the speeding up of the operation of the integrated circuit device. It also has an effect that the down-sizing of the integrated circuit device is enabled because the shift register is used.

Preferably, in the integrated circuit device according to the eleventh aspect of the present invention, the integrated circuit comprises a first and a second integrated circuits, and the sequential circuit comprises a first sequential circuit provided in the first integrated circuit and a second sequential circuit provided in the second integrated circuit, wherein the output signal outputted from the first sequential circuit is processed in the second sequential circuit.

According to the eleventh aspect of the present invention, even if the scale of the first and second integrated circuits becomes larger and signals are inputted from the outside through a large number of buffers, the first and second sequential circuits in the first and second integrated circuits can compensate the delay in the buffers and operate in response to a clock signal having its phase which is almost matches with the reference clock signal. Also the phase synchronization with high degree of freedom can be obtained and the phase-locked circuit can be adapted to the seeding up, so that the operation of the integrated circuit device can be speeded up.

According to the integrated circuit device of the eleventh aspect of the present invention, the output signal outputted from the first sequential circuit is processed in the second sequential circuit, with the result that the high degree of freedom in phase synchronization can be obtained to produce an effect of enabling speed-up of the integrated circuit device.

Accordingly, the objects of the present invention are to determine the internal clock in a short time in the integrated circuit constituting the integrated circuit device, and to make the phase of data outputted from the integrated circuit coincide with the phase of the clock supplied to the integrated circuit.

These and other objects, features, aspects and advantages of the present invention will become more apparent from the following detailed description of the present invention when taken in conjunction with the accompanying drawings.

BRIEF DESCRIPTION OF THE DRAWINGS

FIG. 14 is a timing chart showing the operation of the integrated circuit device shown in FIG. 13.

FIG. 15 is a block diagram showing the structure of a phase-locked circuit according to the second preferred embodiment of the present invention.

FIG. 16 is a circuit diagram showing the structure of the phase comparison circuit shown in FIG. 15.

DESCRIPTION OF THE PREFERRED EMBODIMENTS

Figure 1:
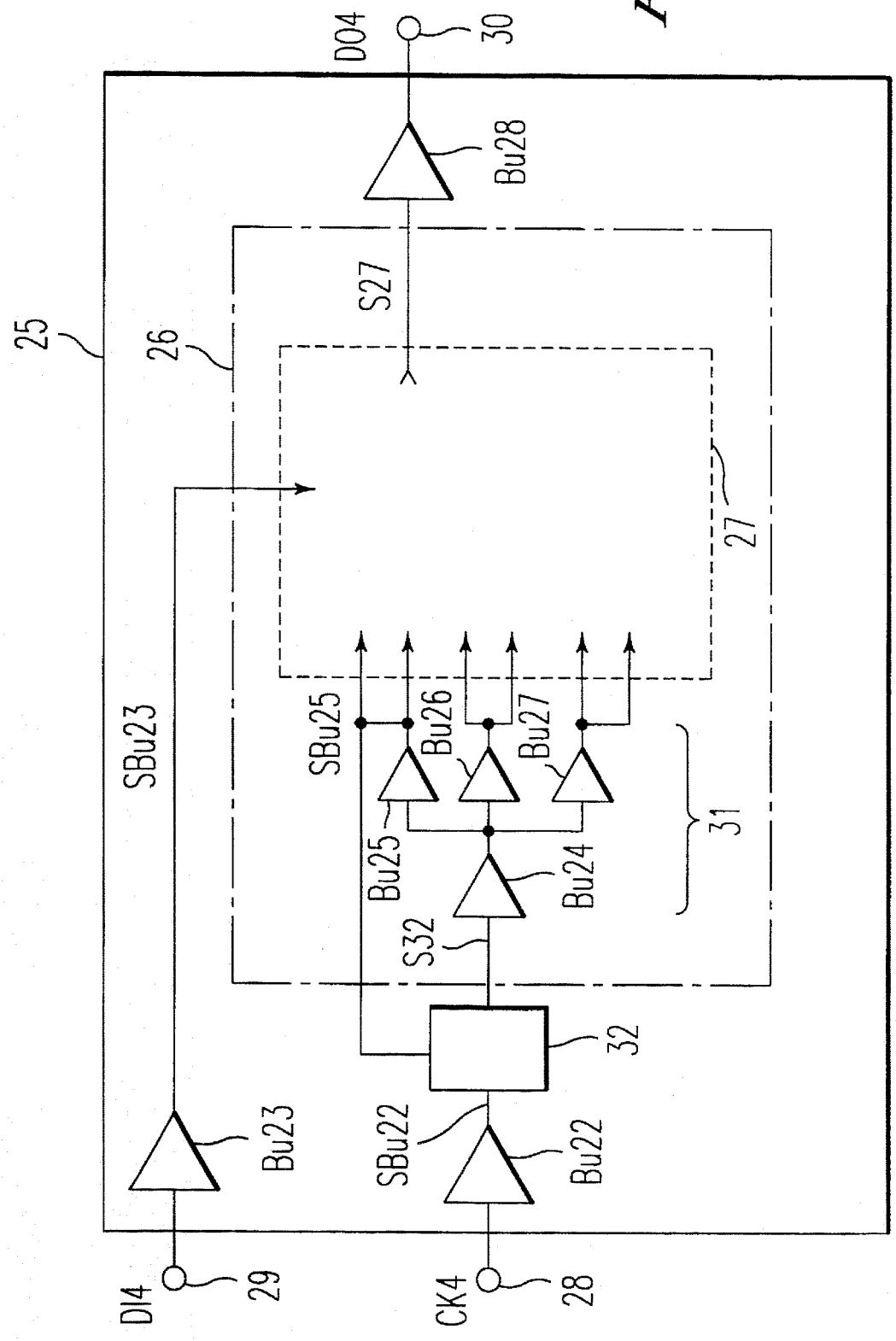
FIG. 1 is a block schematic diagram showing the structure of an integrated circuit according to the first preferred embodiment of the present invention.

The first preferred embodiment of the present invention will be described bellow referring to the figures. FIG. 1 is a block schematic diagram showing an integrated circuit having a phase-locked circuit provided therein.

In the figure, 25 denotes an integrated circuit, 26 denotes a logic circuit provided in the integrated circuit 25, 27 denotes a sequential circuit provided in the logic circuit 26, 28 denotes a clock input terminal receiving a clock signal CK4 inputted to the integrated circuit 25 from the outside, 29 denotes a data input terminal receiving input data DI4 inputted into the integrated circuit 25 from the outside, 30 denotes a data output terminal for outputting data processed in the integrated circuit 25 to the outside, Bu22 denotes a buffer having its input end connected to the clock input terminal 28 to capture the clock signal CK4 inputted from the outside into the integrated circuit 25, Bu23 denotes a buffer having its input end connected to the data input terminal 29 to capture the input data DI4 inputted from the outside into the integrated circuit 25, 32 denotes a phase-locked circuit connected to an output end of the buffer Bu22 for adjusting synchronization of internal clock of the sequential circuit 27, Bu24 denotes a main buffer provided in the logic circuit 26 and having its input end connected to the phase-locked circuit 32 for supplying the clock signal to the sequential circuit 27, Bu25–Bu27 denote buffers having output ends connected to the input end of the phase-locked circuit 32 and the sequential circuit 27 for directly supplying the clock signal to the sequential circuit 27, 31 denotes a clock buffer including the buffers Bu24–Bu27, and Bu28 denotes a buffer having its input end connected to the sequential circuit 27 and its output end connected to the data output terminal 30 for externally outputting the output data DO4 processed in the sequential circuit 27 from the integrated circuit 25.

The phase-locked circuit 32 is connected to the output end of the buffer Bu25 to adjust the phase of the internal clock signal using the output signal of the buffer Bu25.

A signal outputted from the buffer Bu22 is represented as SBu22, a signal outputted from the phase-locked circuit 32 is represented as S32, a signal outputted from the buffer Bu23 is represented as SBu23, a signal outputted from the buffer Bu25 is represented as SBu25, and a signal outputted from the sequential circuit 27 is represented as S27.

Next, the operation of the integrated circuit 25 shown in FIG. 1 will be described referring to FIG. 2. The input data DI4 is inputted to the data input terminal 29 in synchronization with the clock signal CK4 inputted to the clock input terminal 28. The input data DI4 includes a plurality of data such as dataF1, dataF2, dataF3 and the like which are sequentially inputted.

The clock signal CK4 inputted to the clock input terminal 28 is captured into the integrated circuit 25 through the buffer Bu22. That is, the buffer Bu22 outputs the signal SBu22 into the integrated circuit 25. The signal SBu22 has a certain propagation delay time added in the buffer Bu22 with respect to the clock signal CK4. Furthermore, the phase-locked circuit 32 which receives the output signal SBu22 of the buffer Bu22 outputs a signal S32 to the buffer Bu24. The output signal S32 of the phase-locked circuit 32 has its phase adjusted so that the phases of the output signal SBu25 and the like of the buffers Bu25–Bu27 agree with the clock signal CK4. The clock buffer 31 finally outputs the signal SBu25 and the like from the buffers Bu25–Bu27 to the sequential circuit 27. For example, the signal SBu25 is in phase with the clock signal CK4 at this time. That is, the propagation delay times of the clock signal in the buffer Bu22, the phase-locked circuit 32 and the clock buffer 31 have the same length as one cycle of the clock signal CK4.

On the other hand, the inputted input data DI4 is captured into the integrated circuit 25 through the buffer Bu23. That is, the buffer Bu23 outputs the signal SBu23 into the integrated circuit 25. The signal SBu23 has a certain time delay added in the buffer Bu23 with respect to the clock signal CK4.

Now, first transitions of the inputted clock signal CK4 for each clock are sequentially designated as $CK4_{31\ 1}$, $CK4_{-2}$, and $CK4_{-3}$. The data dataF2 is captured into the sequential circuit 27 to be processed at the first transition ($CK4_{-1}$) of the signal Su25 which corresponds to the first transition $CK4_{-1}$ of the clock signal CK4.

Then, the data processed in the sequential circuit 27 is outputted to the buffer Bu28 as the signal S27 in synchronization with the signal SBu25. The timing at which the signal S27 is outputted has a delay of a certain time $\Delta t21$ with respect to the signal SBu25. Due to the delay at the buffer Bu28, the output data DO4 which is outputted from the data output terminal 30 is further delayed from the signal S27, which has a delay propagation time of a certain time $\Delta t22$ with respect to the first transition of the clock signal CK4.

Figure 3:
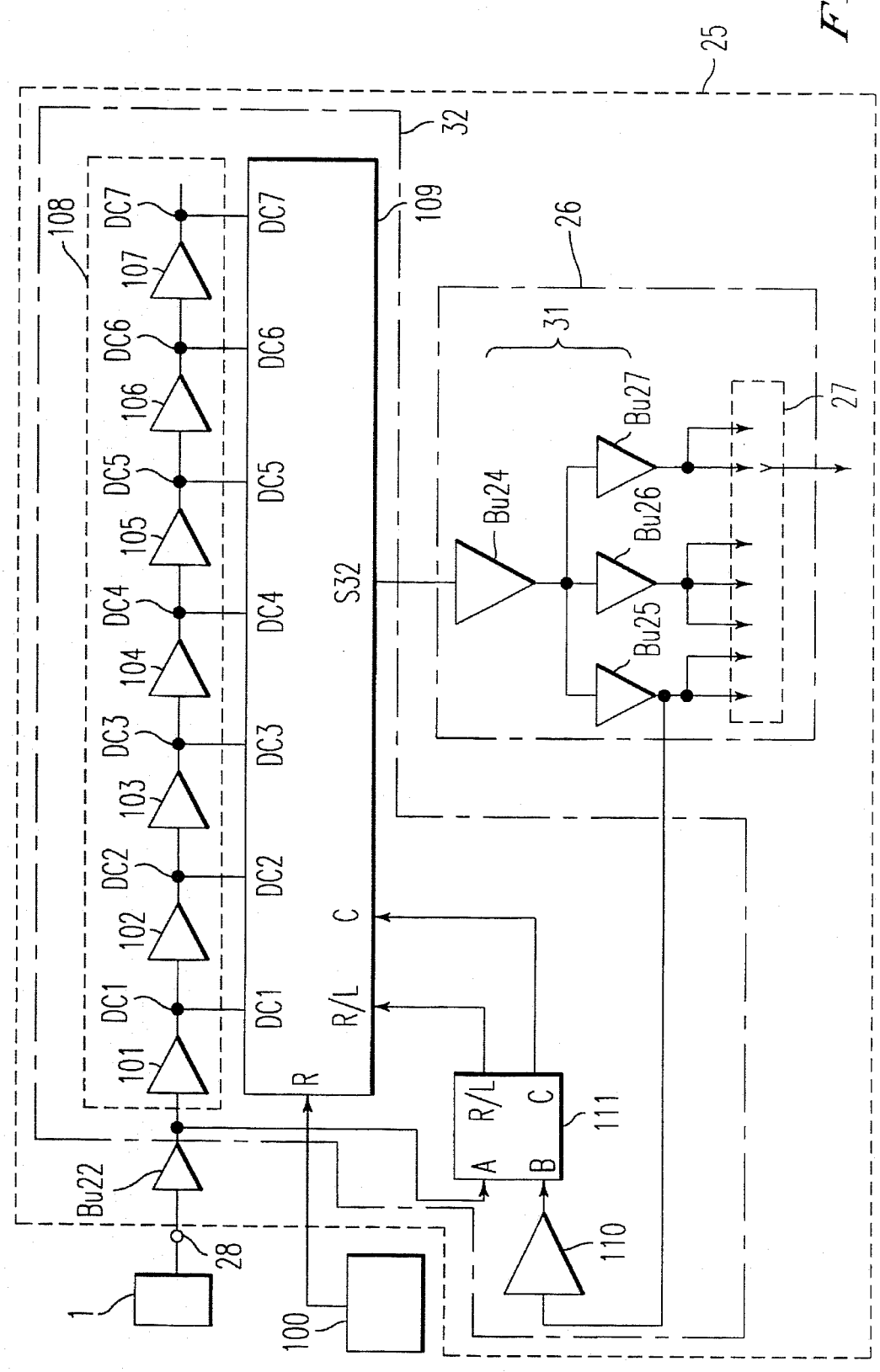
FIG. 3 is a block diagram showing the structure of the phase-locked circuit shown in FIG. 1.

Next, the structure of the phase-locked circuit 32 provided in the integrated circuit shown in FIG. 1 is shown in FIG. 3. In FIG. 3, 1 denotes a clock oscillation circuit provided out of the integrated circuit 25 for generating a clock signal CK to supply the clock signal CK to the clock input terminal 28, 100 denotes a reset circuit provided out of the integrated circuit 25 for generating an initialization signal R, Bu22 denotes a buffer having its input end connected to the clock input terminal 28, 108 denotes a delay circuit including delay elements 101–107 connected in series which receives the clock signal inputted through the buffer Bu22 as input of the delay element 101 and outputs delay clocks DC1 through DC7 which are sequentially delayed from each of taps connected to the output ends of the delay elements 101–107, 109 denotes a selection circuit having input ends respectively corresponding to the delay clocks DC1 through DC7 outputted from the delay circuit 108 which is initialized by an inputted initialization signal R for selecting and outputting only one of the delay clocks DC1 through DC7 inputted in accordance with a phase switch signal C and a phase comparison signal R/L, 26 denotes a logic circuit provided in the integrated circuit 25 and operating with an output signal S32 selected in the selection circuit 109, 31 denotes a clock buffer included in the logic circuit 26 and having buffers Bu24–Bu27 for distributing the output signal S32 of the selection circuit 109 into the logic circuit 26, 27 denotes a sequential circuit included in the logic circuit 26 and driven by output of the clock buffer 31, 110 denotes a buffer having its input end connected to the output end of the buffer Bu25 and having a delay amount the same as the buffer Bu22, and 111 denotes a phase comparison circuit for comparing phases of the input B which is the output of the sequential circuit 27 provided through the buffer 110 and the input A which is the output of the clock oscillation circuit 1 provided through the buffer Bu22 and outputting and providing to the selection circuit 109 the phase comparison signal R/L and the phase switch signal C in correspondence to the result.

Each of the delay elements 101–107 can be formed of a single buffer, and the delay time of the delay element is about 0.2–0.3 nS. The total of the delay time of the delay elements 101–107 is required to be not less than one cycle of the clock signal CK.

Figure 4:
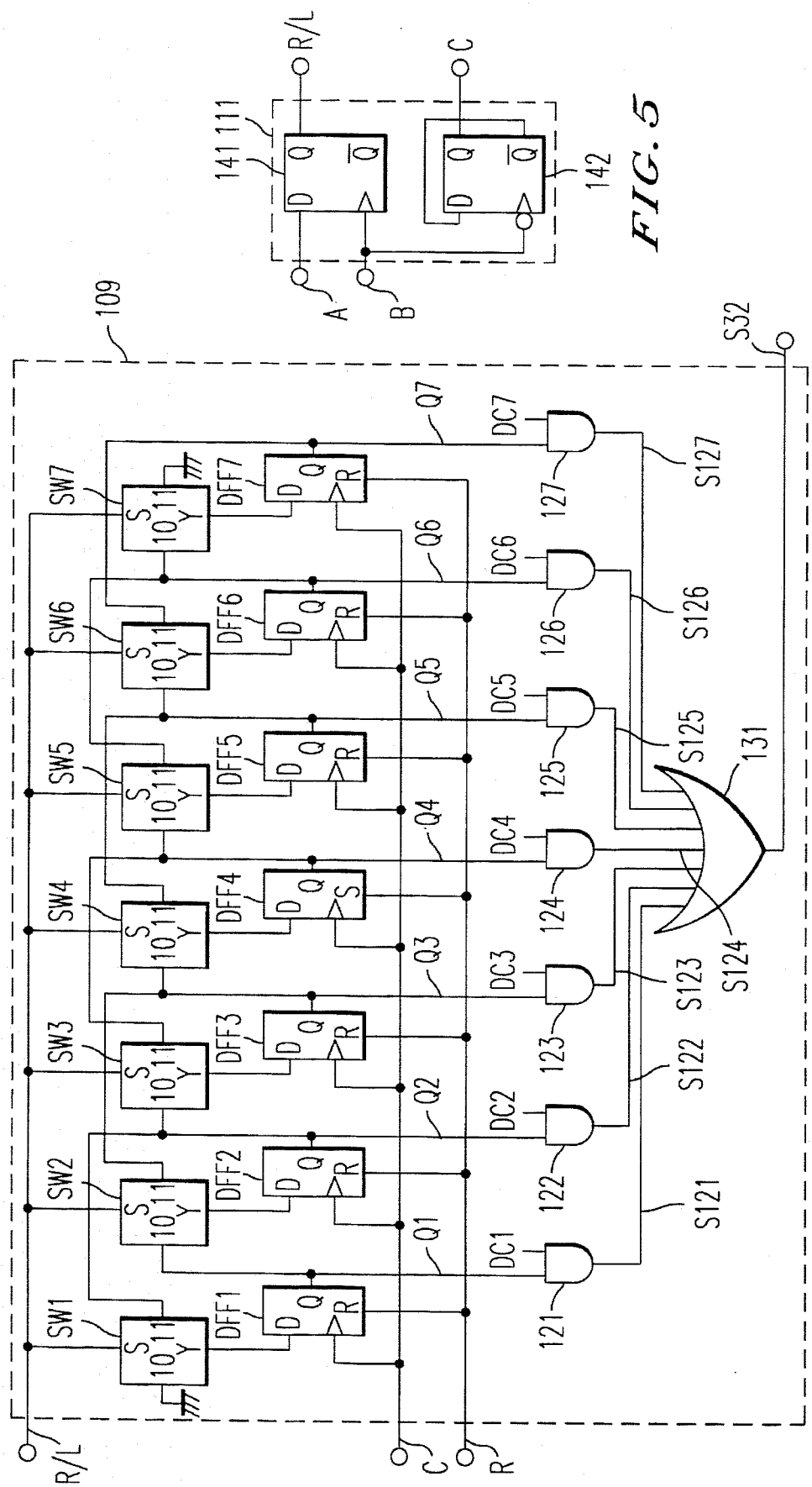
FIG. 4 is a circuit diagram showing the structure of the selection circuit shown in FIG. 3.

FIG. 4 is a diagram showing one manner of the selection circuit 109 shown in FIG. 3. In FIG. 4, DFF1–DFF7 denote D type flip-flops connected in common to the reset circuit for receiving the reset signal R at reset terminals of DFF1–DFF3, DFF5–DFF7 and set terminal of DFF4 and also for receiving in common the phase switch signal C of the phase comparison circuit 111 as input, 121–127 denote AND gates each receiving an output signal Q of corresponding one of the DFF1–DFF7 at one input end, and receiving the corresponding delay clock DC1–DC7 of the delay circuit 108 at the other end, and 131 denotes an OR gate inputting output signals S121–S127 of the AND gates 121–127. The output of the OR gate 131 is outputted as a phase-locked clock S32. In this structure, the delay clocks DC1 through DC7 are selected as the phase-locked clock S32 corresponding to one of the output signals Q1 through Q7 of the DFF1–7 which is outputting the "H" level.

SW1–SW7 denote selectors inputting the phase comparison signal R/L in common at a select input end S for a selection of outputting signals inputted at first and second input ends I0, I1 from an output end Y corresponding to the inputted phase comparison signal R/L. The output ends Y of the selectors SW1–SW7 are connected to input ends D of the corresponding D flip-flops DFF1–DFF7, respectively.

The first input end I0 of the selector SW1 is fixed to the ground potential (the "L" level), and the output signal Q2 of the DFF 2 is inputted to the second input end I1 of the selector SW1. The output signal Q1 of the DFF1 is inputted to the first input end I0 of the selector SW2 and the output signal Q3 of the DFF3 is inputted to the second input end I1 of the selector SW2. The output signal Q2 of the DFF2 is inputted to the first input end I0 of the selector SW3, and the output signal Q4 of the DFF 4 is inputted to the second input end I1 of the selector SW3. The output signal Q3 of the DFF3 is inputted to the first input end I0 of the selector SW4 and the output signal Q5 of the DFF5 is inputted to the second input end I1 of the selector SW4. The output signal Q4 of the DFF4 is inputted to the first input end I0 of the selector SW5, and the output signal Q6 of the DFF 6 is inputted to the second input end I1 of the selector SW5. The output signal Q5 of the DFF5 is inputted to the first input end I0 of the selector SW6 and the output signal Q7 of the DFF7 is inputted to the second input end I1 of the selector SW6. The output signal Q6 of the DFF6 is inputted to the first input end I0 of the selector SW7, and the second input end I1 of the selector SW7 is fixed to the ground potential (the "L" level).

The DFF1 through DFF7 are reset by the initialization signal R. Then, one of the signals Q1–Q7 outputted from the output ends Q of the DFF1–DFF7 is reset to attain the "H" level, and the remainders go to the "L" level. Now, assuming that only the DFF 4 outputs the "H" level when being reset, the delay clock DC4 is inputted in the OR gate 131 through the AND gate 124, and at the initialization, the delay clock DC4 is first outputted as the phase-locked clock S32.

The DFF1 through DFF7 constitute a shift register capable of changing between the right shift and the left shift together with the selectors SW1 through SW7. The switch of the right shift and the left shift is determined by the phase comparison signal R/L inputted to the select input ends S of the selectors SW1 through SW7, and the shift operation occurs at a rising edge of the phase switch signal C connected to the clock inputs of the DFF1 through DFF7.

The ground and output ends Q of the DFF on the left side are connected to the first input ends I0 of the selectors SW1 through SW7 respectively, and the output ends Q of the DFF2–DFF7 on the right side and the ground are connected to the second input ends I1 respectively, so that the signal inputted to the input end I1 is outputted from the output end Y and output of the DFF on the right side is shifted to the DFF on the left side to implement the left shift in each selector SW1–SW7 if the phase comparison signal R/L is at the "H" level, and on the other hand, if the phase comparison signal R/L is at the "L" level, the right shift is realized.

That is to say, in the state in which the delay clock DC4 is selected as the phase-locked clock S32, i.e., when the output signal Q4 is at the "H" level, if the right shift occurs, the output signal Q5 attains the "H" level and the output signals Q1, Q2, Q3, Q4, Q6 and Q7 attain the "L" level, where the delay clock DC5 is selected. One of the delay clocks DC1 through DC7 can be selected in the right shift and the left shift.

Figure 5:
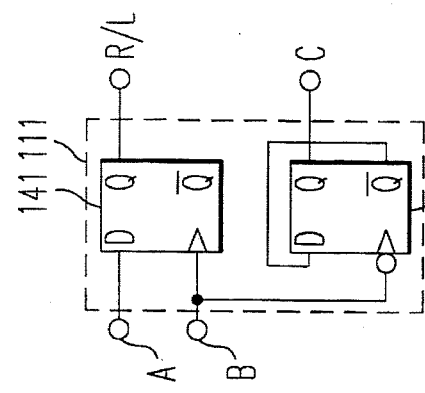
FIG. 5 is a circuit diagram showing the structure of the phase comparison circuit shown in FIG. 4.

Next, one manner of the phase comparison circuit 111 shown in FIG. 3 is shown in FIG. 5. In FIG. 5, 141 denotes a D type flip-flop having its data input end D connected to the input end A of the phase comparison circuit 111 and its clock input end connected to the input end B of the phase comparison circuit 111, for outputting a phase comparison signal R/L from its output end Q, and 142 denotes a toggle type flip-flop (referred to as a TFF, hereinafter) having its data input end D connected to an output end Q and its clock input end connected to the input end B of the phase comparison circuit 111 for inputting at the clock input end an inversion logic of the signal inputted at the input end B and outputting a signal from the output end Q as a phase switch signal C.

In the structure in which the selected delay clock DC1–DC7 is switched at the last transition of the clock signal inputted to the input end B and phase comparison is made about the signals respectively inputted to the input end A and the input end B again at the first transition of the clock signal inputted to the input end B immediately after that, if the cycle of the signal from the input end A is short as compared with the delay amount of data in the logic circuit 26, switch of the delay clock is not in time for the next phase comparison. At this time, the signal inputted to the input end B which was not in time and the signal inputted to the input end A are compared again for phase switch, therefore normal operation may not be performed. For example, right shift may be continuously performed twice when single right shift is enough. The TFF 142 lengthens the cycle of the phase switch signal C double the signal inputted to the input end B to solve the disadvantage described above. Or, the signals inputted to the input end A and the input end B may be interchanged with each other and the phase comparison signal R/L may be taken from the $\overline{Q}$ of the DFF 141.

The phase comparison circuit 111 outputs the "H" level as a phase comparison signal R/L if the signal inputted from the input end A is at the "H" level when a first transition of the signal inputted from the input end B occurs, and outputs the "L" level as the phase comparison signal R/L if the signal inputted from the input end A is at the "L" level. Accordingly, for example, if the clock signal CK inputted to the input end A leads the clock signal CK4 inputted to the input end B by ½ cycle or less, the phase comparison signal R/L is at the "H" level. On the contrary, if the clock signal CK inputted to the input end A lags behind the clock signal CK4 inputted to the input end B by not more than ½ cycle, the phase comparison signal R/L outputted from the phase comparison circuit 111 is at the "L" level.

A clock signal having a cycle double the clock signal inputted to the input end B and lagging by ½ cycle is used as the phase switch signal C so that the phase comparison signal R/L is determined at the first transition of the signal inputted to the input end B and the phase switch signal C rises at the second last transition of the signal inputted to the input end B considering the signal delay in the logic circuit 26.

Figure 6:
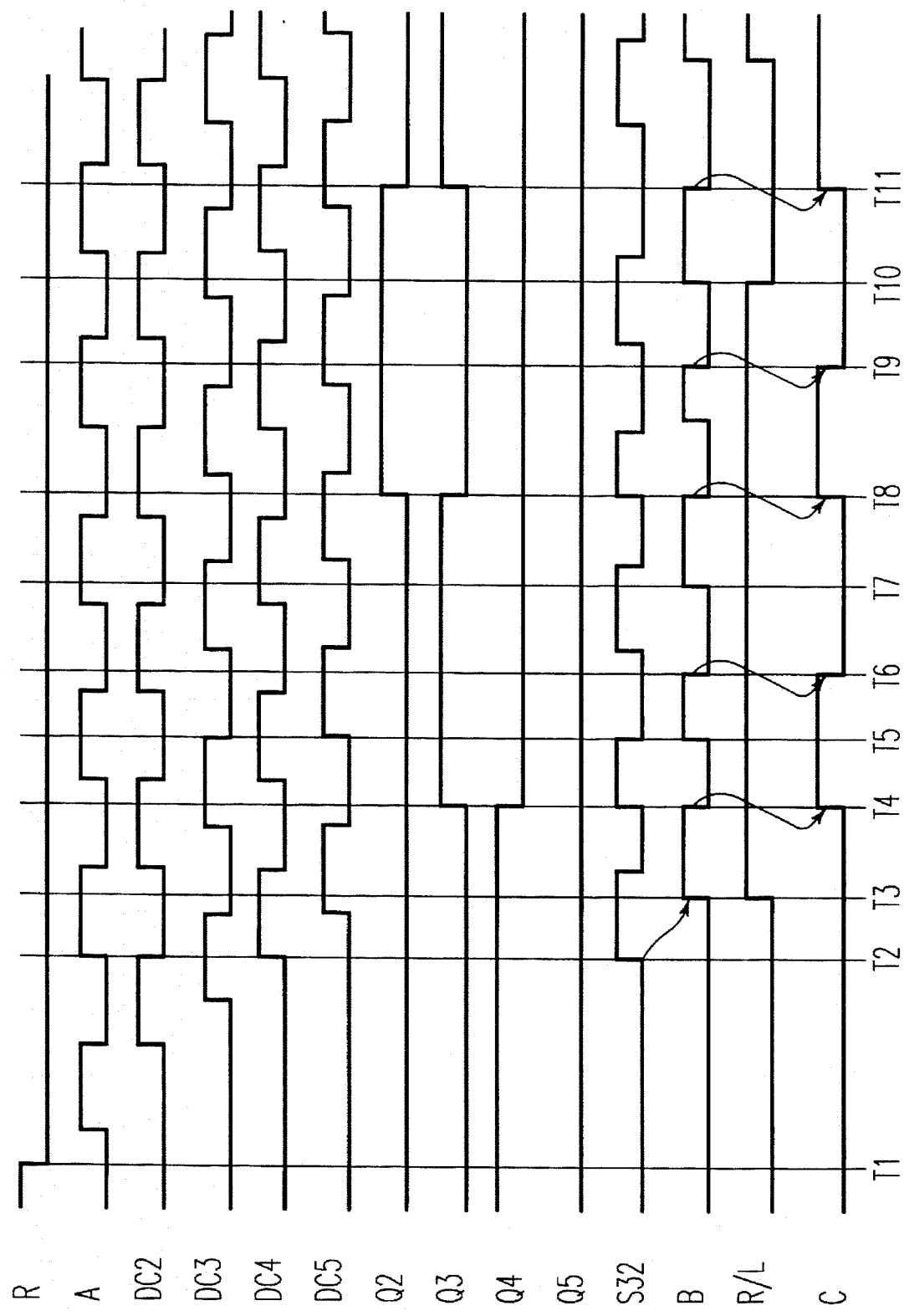
FIG. 6 is a timing chart showing the operation of the selection circuit shown in FIG. 4.

Next, the operation in each part of the integrated circuit device shown in FIGS. 3, 4 and 5 will be described referring to FIG. 6. FIG. 6 is a timing chart illustrating the operation of the phase-locked circuit 32 in the integrated circuit 25 shown in FIG. 1.

At the initialization (until the time T1), because the initialization signal R attains the "H" level, the selection circuit 109 is reset and only the output Q4 of the DFF4 in the selection circuit 109 attains the "H" level, and the outputs of the DFF1–3 and DFF5–7 go to the "L" level, so that the delay clock DC4 is outputted from the phase-locked circuit 32, and the waveform of the delay clock DC4 appears on the phase-locked clock S32 from the time T2. The signal S32 is outputted to the sequential circuit 27 via the clock buffer 31. The output signal of the buffer Bu25 is inputted to the input end B of the phase comparison circuit 111 via the buffer 110. Accordingly, the clock signal inputted to the input end B of the phase comparison circuit 111 has a certain propagation delay time with respect to the output signal S32 of the phase-locked circuit 32.

At the time T3, the clock signal inputted to the input end B rises in the DFF 141 and the clock signal inputted to the input end A is at the "H" level, so that the phase comparison signal R/L attains the "H" level. The phase witch signal C outputted from the TFF142 is at the "L" level.

That is to say, at the time T3, the clock signal inputted to the input end A leads the clock signal inputted to the input end B by ½ cycle or less. Now, in order to make smaller the phase difference between of the clock signal inputted to the input end B and the clock signal inputted to the input end A, only the clock signal inputted to the input end B is to lead, therefore the delay clock DC4 presently selected as the signal S32 outputted from the phase-locked circuit 32 should be replaced by the delay clock DC3 which is in the advanced phase than that. Accordingly, in the shift register including the selectors SW1–SW7 and DFF1–7 shown in FIG. 4, the output signal Q4 of the DFF4 is brought to the "L" level by shifting to the left side and also the output signal Q3 of the DFF3 is brought to the "H" level.

At the time T4, since the clock signal inputted to the input end B falls in the TFF 142, the phase switch signal C changes to the "H" level. At this time, the "H" level is still held as the phase comparison signal R/L in the DFF141. Accordingly, receiving these output signals from the phase comparison circuit 111, the selection circuit 109 performs left-hand shift and the phase-locked circuit 32 outputs the delay clock DC3 as the output signal S32.

At the time T5, when the clock signal inputted to the input end B of the phase comparison circuit 111 rises, the clock signal inputted to its input end A is at the "H" level because the clock signal inputted to the input end A is in the leading phase compared with the clock signal inputted to the input end B. AT this time the clock signal inputted to the input end B of the phase comparison circuit 111 rises, but the phase comparison signal R/L outputted from the DFF 141 is maintained at the "H" level since the input end A is at the "H" level.

At the time T6, the clock signal inputted to the input end B of the phase comparison circuit 111 falls and the phase switch signal C outputted from the TFF 142 changes to the "L" level. At the time T7, the clock signal inputted to the input end B rises, but the input end A is at the "H" level, and the phase comparison signal R/L maintains the "H" level.

Then, at the time T8, the phase switch signal C outputted from the TFF 142 changes to the "H" level when the clock signal inputted to the input end B of the phase comparison circuit 111 falls, and the shift register in the selection circuit 109 performs the left-hand shift accordingly. Therefore, the delay clock DC2 outputted from the delay circuit 108 is selected in the selection circuit 109, and the delay clock DC2 is outputted as the output signal S32 of the selection circuit 109.

At the time T9, when the clock signal inputted to the input end B of the phase comparison circuit 111 falls, the phase switch signal C outputted from the TFF 142 changes from the "H" level to the "L" level.

At the time T10, because the delay clock DC2 is selected in the selection circuit 109, the signal inputted to the input end A is delayed from the signal inputted to the input end B of the phase comparison circuit 111. When the clock signal inputted to the input end B of the phase comparison circuit 111 rises, the phase comparison signal R/L outputted from the DFF 141 changes to the "L" level since the input end A of the phase comparison circuit 111 is at the "L" level.

At the time T11, when the clock signal inputted to the input end B of the phase comparison circuit 111 falls, the phase switch signal C changes from the "L" level to the "H" level in the TFF 142. Accordingly, the right-hand shift is performed in the shift register in the selection circuit 109, and the delay clock DC3 is selected in place of the delay clock DC2. After that, the delay clocks DC2 and DC3 are selected alternately, and the phase of the clock signal inputted to the input end A of the phase comparison circuit 111 and the phase of the signal inputted to the input end B almost agree with each other.

The buffer 110 has a delay amount to the same extent as the buffer Bu22 between its input signal and output signal. Accordingly, agreement between the phase of the clock signal inputted to the input end A of the phase comparison circuit 111 and the signal inputted to the input end B means that the phase of the signal SBu25 outputted to the sequential circuit 27 from the buffer Bu25 and the phase of the clock signal CK outputted from the clock oscillation circuit 1 agree with each other. In this way, with the phase-locked circuit 32, the propagation delay times of the buffer Bu22 and the clock buffer 31 can be apparently cancelled in the integrated circuit 25.

Now, the buffer 110 may be removed from the phase-locked circuit 32 shown in FIG. 3, where the propagation delay time of the clock buffer 31 only is compensated for by the phase-locked circuit 32.

Figure 7:
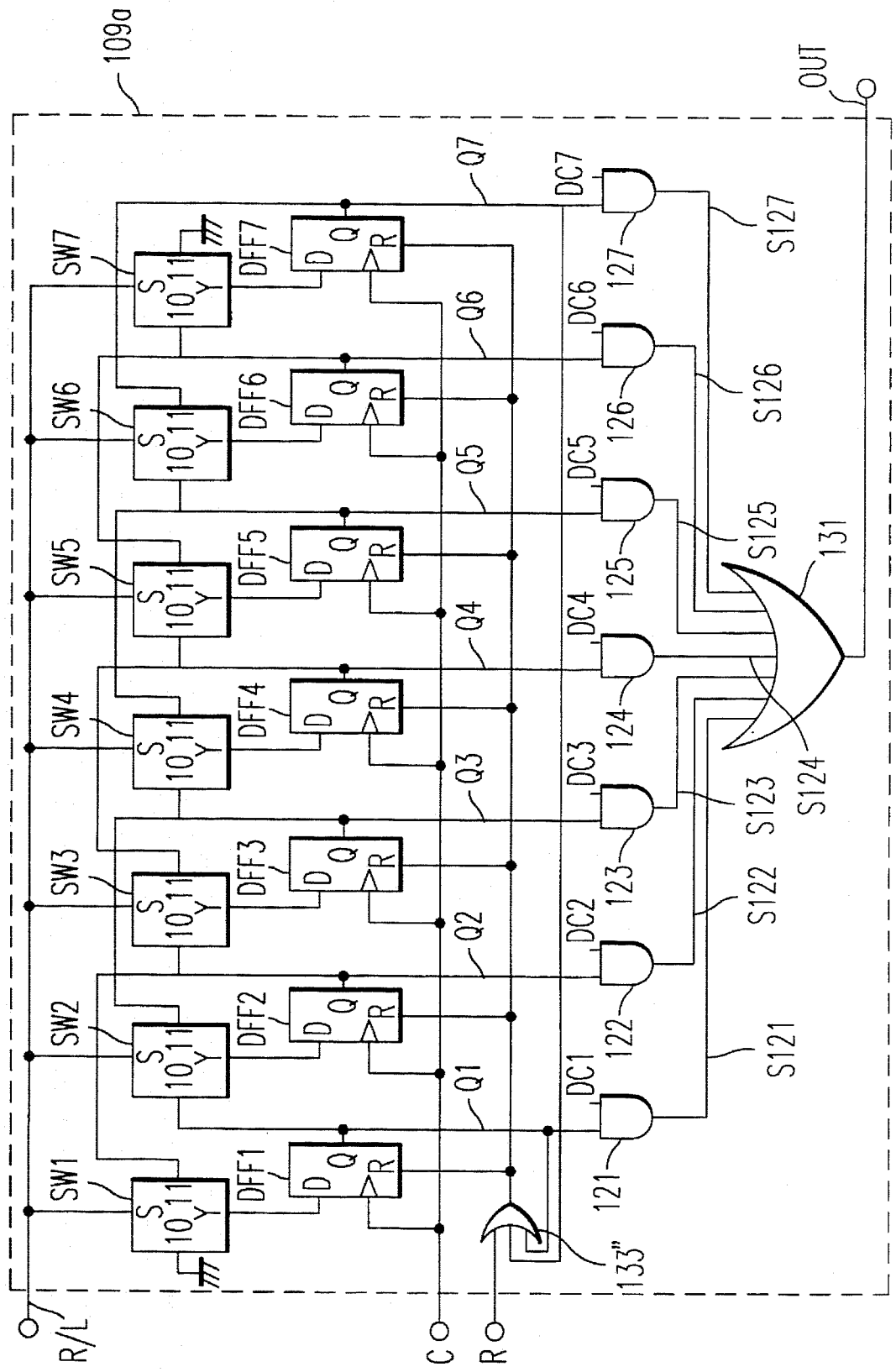
FIG. 7 is a circuit diagram showing another manner of selection circuit in the first preferred embodiment of the present invention.
Figure 8:
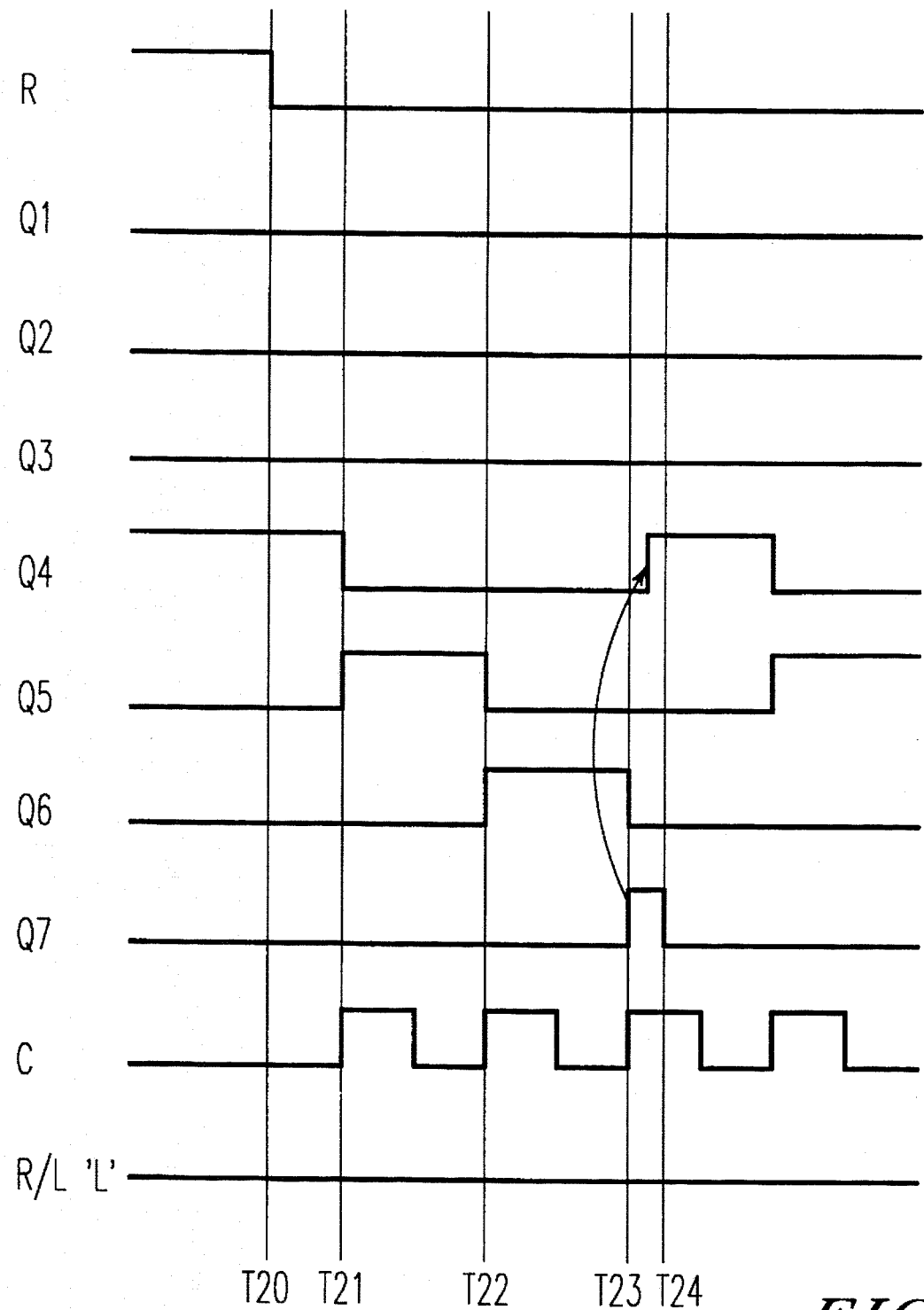
FIG. 8 is a timing chart showing the operation of the selection circuit shown in FIG. 7.

Next, FIGS. 7 and 8 show another manner of selection circuit. FIG. 7 is a circuit diagram showing the structure of the selection circuit. In FIG. 7, 133 denotes an OR gate receiving as input the reset signal R at a first input end, the output signal Q7 of the DFF 7 at a second input end, and the output signal Q1 of the DFF 1 at a third input end, and other characters the same as those in FIG. 4 denote corresponding parts in FIG. 4. The selection circuit 109a shown in FIG. 7 is different from the selection circuit 109 in that it has the OR gate 133. In the OR gate 133, a logical sum of the output signal Q1 of the DFF1 at the first stage, the output signals Q7 of the DFF 7 at the final stage and the initialization signal R inputted from the outside is taken, and its output serves as an initialization signal. By providing the OR gate 133, the structure is realized in which reset is made for the selection circuit 109a even when the output signal Q1 of the DFF 1 or the output signal Q7 of the DFF7 attains the "H" level. For example, if the phase synchronization is broken to cause the DFF at the first stage or the final stage of the selection circuit 109a to be selected, the phase-locked circuit 32 can be forced to be initialized.

Operation of the selection circuit 109a will be described referring to the timing chart of FIG. 8. In FIG. 8, until the time T20, with the reset signal R inputted in the selection circuit 109a from the outside attaining the "H" level, the selection circuit 109a is reset, and the output signal Q4 of the DFF 4 only is at the "H" level and output signals of other DFF 1–3, DFF 5–7 are at the "L" level.

Now, description will be given on the case where the phase synchronization is broken and the phase comparison signal R/L is fixed to the "L" level, for example. At this time every time the phase switch signal C is inputted from the phase comparison circuit 111 to the selection circuit 109a, the selection circuit 109a shifts the internal shift registers to the right to sequentially bring the output signals Q4–Q7 of the DFF 4 to the DFF 7 to the "H" level (time T21–T23).

Then, at the time T23, when the output signal Q7 of the DFF 7 attains the "H" level, the output of the OR gate 133 changes to the "H" level and the selection circuit 109a is reset. Accordingly, the output signal Q4 of the DFF 4 goes to the "H" level and the output signal Q7 of the DFF 7 goes to the "L" level.

For example, if the phase comparison signal R/L is fixed to the "H" level to the contrary to the above-described case, every time the phase switch signal C is inputted to the selection circuit 109a from the phase comparison circuit 111, the selection circuit 109a shifts the internal shift registers to the left to sequentially bring the output signals Q4–Q1 of the DFF 4-DFF 1 to the "H" level. Then with the output signal Q1 of the DFF 1 attaining the "H" level, the selection circuit 109a is forced to be reset similarly to the above-described case.

Figure 9:
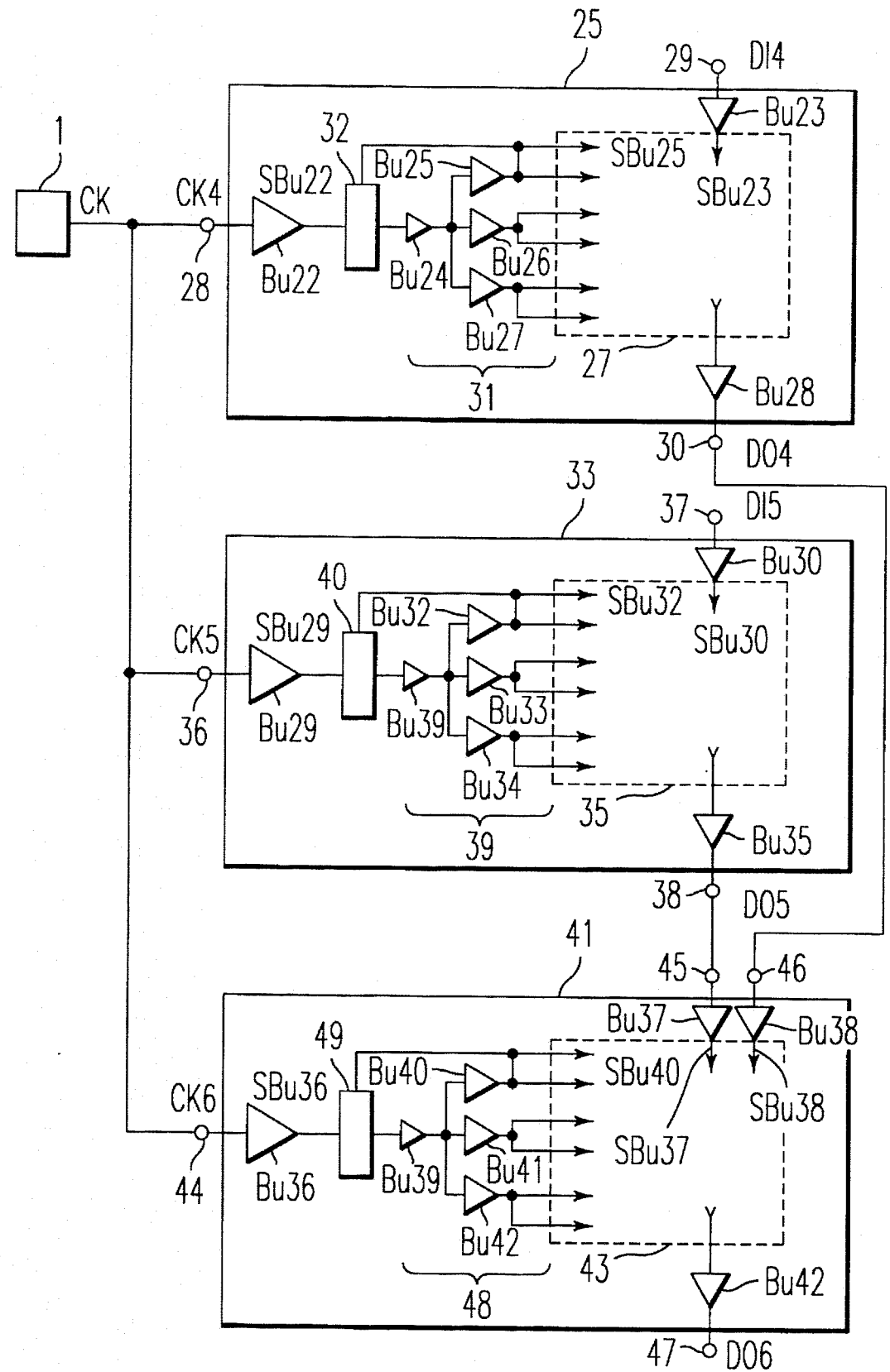
FIG. 9 is a block schematic diagram showing the structure of an integrated circuit device having a plurality of integrated circuits according to the first preferred embodiment of the present invention.

Next, relation among each clock signal, input data and output data in the case where a plurality of integrated circuits described above are connected will be described referring to FIG. 9. In FIG. 9, 1 denotes a clock oscillation circuit for outputting the clock signal CK, 25 denotes an integrated circuit having a function equivalent to the integrated circuit 25 shown in FIG. 1, and 33 and 41 denote integrated circuits having the sequential circuits and the phase-locked circuits in the same way as the integrated circuit 25. In FIG. 9, the same reference characters as those in FIG. 1 denote corresponding parts in FIG. 1.

In the figure, 35 and 43 denote sequential circuits provided in the integrated circuits 33 and 41, respectively, 36 and 44 denote clock input terminals for receiving clock signals CK5 and CK6 inputted in the integrated circuits 33 and 41 from the outside, 37 denotes a data input terminal for receiving input data DI5 inputted in the integrated circuit 33 from the outside, 45 and 46 denote data input terminals receiving input data inputted in the integrated circuit 41 from the outside, 38 and 47 denote data output terminals for outputting to the outside the data processed in the integrated circuits 33 and 41, Bu29 and Bu36 denote buffers having input terminals connected to the clock input terminals 36 and 44 for capturing the clock signals CK5 and CK6 inputted from the outside into the integrated circuits 33 and 41, Bu30 denotes a buffer having its input end connected to the data input terminal 37 for capturing the input data DI5 inputted from the outside into the integrated circuit 33, Bu37 and Bu38 denote buffers having input ends connected respectively to the data input terminals 45 and 46 for capturing into the integrated circuit 41 the input data inputted from the outside, 40 and 49 denote phase-locked circuit in the integrated circuits 33 and 41 connected to the output ends of the buffers Bu29 and Bu36, respectively, Bu31 and Bu39 denote main buffers provided in the integrated circuits 33 and 41 and having input terminals connected to the phase-locked circuits 40 and 49 for supplying the clock signals to the sequential circuits 35 and 43 respectively, Bu32–Bu34 and Bu40–Bu42 denote buffers having input ends connected to the output ends of the buffers Bu31 and Bu39 and output ends connected to the sequential circuits 35 and 43 for directly supplying the clock signals to the sequential circuits 35 and 43, respectively, 39 and 48 denote clock buffers including the buffers Bu32–Bu34 and the buffers Bu40–Bu42, respectively, Bu35 denotes a buffer having its input end connected to the sequential circuit 35 and its output end connected to the data output terminal 38 for externally outputting the output data DO5 processed in the sequential circuit 35 from the integrated circuit 33, and 47 denotes a data output terminal receiving as input at its input end the output of the sequential circuit 43 through the buffer Bu42 for outputting the output data DO6 processed in the sequential circuit 43 to out of the integrated circuit 41.

A signal outputted from the buffer Bu32 is designated as SBu32 and a signal outputted from the buffer Bu40 is designated as SBu40. Also, signals outputted from the buffer Bu37 and Bu38 are designated as SBu37 and SBu38.

Now, the integrated circuit 25 and the integrated circuit 33 are first integrated circuits. The integrated circuit 41 is the second integrated circuit. The integrated circuit 25 captures the input data DI4 into the sequential circuit 27 from the data input terminal 29 in synchronization with the clock signal CK4 (SBu25) supplied from the outside to the clock input terminal 28, processes the data in the sequential circuit 27, and outputs the output data DO4 produced in the sequential circuit 27 from the data output terminal 30 to the outside. The integrated circuit 33 captures the input data DI5 into the sequential circuit 35 from the data input terminal 37 in synchronization with the clock signal CK5 (SBu32) supplied to the clock input terminal 36 from the outside, processes the data in the sequential circuit 35, and outputs the output data DO5 produced in the sequential circuit 35 from the data output terminal 38 to the outside. The clock signals CK4, CK5 and CK6 are different from the clock signal CK outputted from the clock oscillation circuit 1 since the wave forms become less steep and slight delays are caused during transmission, but they are treated as the same ones as the clock signal CK because the differences are very small.

The integrated circuit 41 has its data input terminal 46 connected to the data output terminal 30 of the integrated circuit 25 and its data input terminal 45 connected to the data output terminal 38 of the integrated circuit 33. The integrated circuit 41 receives the data DO4 and DO5 processed in the integrated circuit 25 and the integrated circuit 33 as input data at the data input terminal 46 and the data input terminal 45, respectively. The inputted data DO4 and DO5 are inputted in the sequential circuit 43 as the signals SBu38 and SBu37 through the buffer Bu38 and the Buffer Bu37, respectively. In the sequential circuit 43, the signals SBu37 and SBu38 inputted from the clock buffers Bu37 and Bu38 are processed in synchronization with the signal SBu40.

Figure 10:
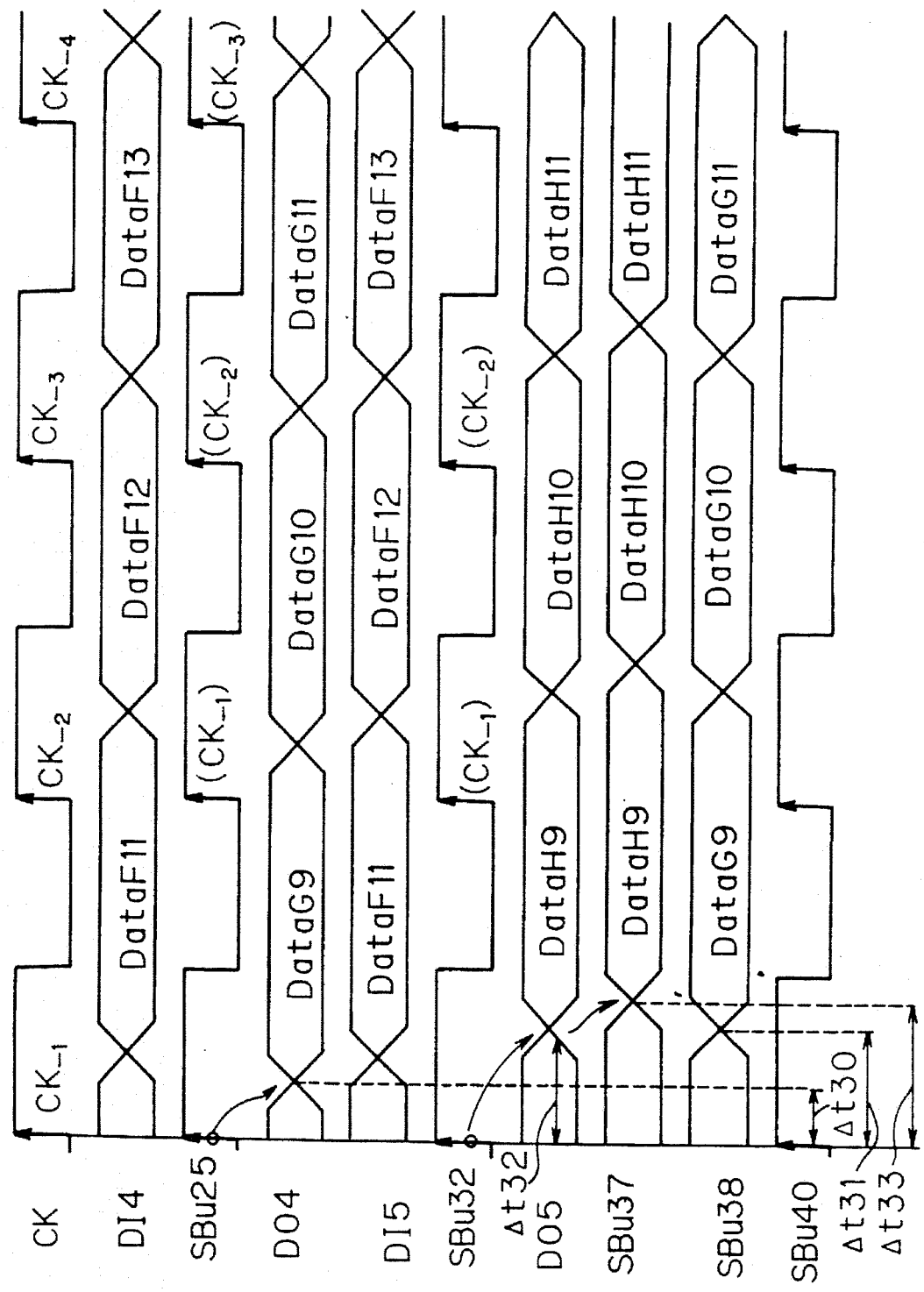
FIG. 10 is a timing chart showing the operation of the integrated circuit device shown in FIG. 9.

Operations of the integrated circuit 25, the integrated circuit 33 and the integrated circuit 41 described above are shown in FIG. 10. In the sequential circuit 27 in the integrated circuit 25, the input data DI4 such as the data dataF11, dataF12, dataF13 inputted from the data input terminal 29 are processed in synchronization with the signal SBu25, and the output data DO4 such as produced data dataG9, dataG10, dataG11 are outputted from the data output terminal 30 in synchronization with the signal SBu25. The signal SBu25 has a delay corresponding just to one cycle with respect to the clock signal CK, so that the phases of the clock signal CK and the clock signal CK4 agree. This delay is caused in the buffer Bu22, the phase-locked circuit 32 and the clock buffer 31. By passing through the process in the sequential circuit 27 and the buffer Bu28, the output data DO4 is outputted being a little delayed from the first transition of the signal SBu25. Accordingly, the output data DO4 is delayed by a certain time Δt30 with respect to the clock signal CK.

Similarly, in the sequential circuit 35 of the integrated circuit 33, the input data DI5 such as data dataF11, dataF12, dataF13 inputted from the data input terminal 37 are processed in synchronization with the signal SBu32, and the output data DO5 such as produced data dataH9, dataH10, dataH11 are outputted from the data output terminal 38 in synchronization with the signal SBu32. The signal SBu32 has a delay corresponding just to one cycle with respect to the clock signal CK, so that the phases of the clock signal CK and the clock signal CK5 agree with each other. This delay occurs in the buffer Bu29, the phase-locked circuit 40 and the clock buffer 39. Then, by passing through the process in the sequential circuit 35 and the buffer Bu35, the output data DO5 is outputted being slightly delayed from the first transition of the signal SBu32. Accordingly, the timing of output of the output data DO5 is delayed by a certain time Δt32 with respect to the first transition of the clock signal CK.

In the integrated circuit 41, the output data DO5 and the output data DO4 inputted to the data input terminal 45 and the data input terminal 46 are transmitted to the sequential circuit 43 through the buffer Bu37 and the buffer Bu38 to be further delayed by a certain time. The signal SBu37 is added with a delay in the sequential circuit 35 and the buffers Bu35 and Bu37, and inputted in the sequential circuit 43 being delayed by a certain time Δt33 with respect to the clock signal CK. The signal SBu38 is added with a delay in the sequential circuit 27 and the buffers Bu28 and Bu38, and inputted in the sequential circuit 43 being delayed by a certain time Δt31 with respect to the clock signal CK. Now, the delay times Δt33 and Δt31 of the signals SBu37 and SBu38 inputted in the sequential circuit 43 have been made short because the propagation delay time in the buffer Bu22 and the clock buffer 31, and the buffer Bu29 and the clock buffer 39 are removed by the phase-locked circuits 32 and 40.

However, since the delay time in the sequential circuit 35, the buffers Bu35 and Bu37 differs from the delay time in the sequential circuit 27 and the buffers Bu28 and Bu38, the range of permitting fluctuation in timing of the internal clock signal SBu40 for capturing the signals SBu37 and SBu38 into the sequential circuit 43 and processing them is small, with a result that the data transmission/reception becomes difficult. Also, the processing speed of the integrated circuit 41 is slow to hinder the speed-up since the data processing and the like are performed with the skew between the signals SBu37 and SBu38.

Figure 11:
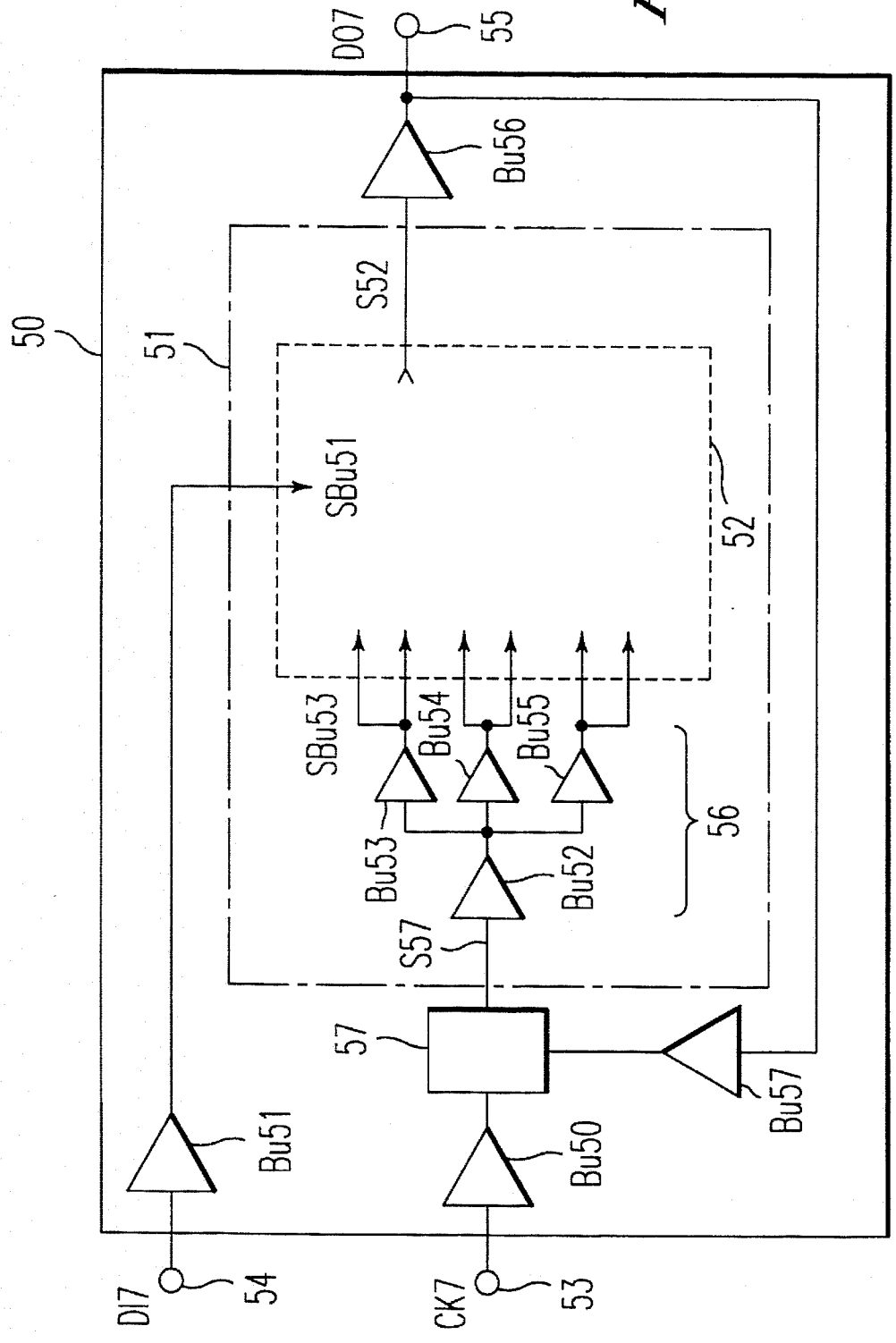
FIG. 11 is a block schematic diagram showing the structure of an integrated circuit according to the second preferred embodiment of the present invention.

Next, the second preferred embodiment of the present invention will be described referring to the figures. FIG. 11 is a diagram showing an integrated circuit having a phase-locked circuit provided therein.

In the figure, 50 denotes an integrated circuit, 51 denotes a logic circuit provided in the integrated circuit 50, 52 denotes a sequential circuit provided in the logic circuit 51, 53 denotes a clock input terminal receiving a clock signal CK7 inputted in the integrated circuit 50 from the outside, 54 denotes a data input terminal receiving input data DI7 inputted in the integrated circuit 50 from the outside, 55 denotes a data output terminal for outputting the data processed in the integrated circuit 50 to the outside, Bu50 denotes a buffer having its input end connected to the clock input terminal 53 for capturing into the integrated circuit 50 the clock signal CK7 inputted from the outside, Bu51 denotes a buffer having its input end connected to the data input terminal 54 for capturing into the integrated circuit 50 the input data DI7 inputted from the outside, 57 denotes a phase-locked circuit connected to the output end of the buffer Bu50 for adjusting synchronization of internal clock of the integrated circuit 50, Bu52 denotes a main buffer provided in the logic circuit 51 and having its input end connected to the phase-locked circuit 57 for supplying the clock signal to the sequential circuit 52, Bu53–Bu54 denote buffers having input ends connected to the output end of the phase-locked circuit 57 and output ends connected to the sequential circuit 52 for directly supplying the clock signal to the sequential circuit 52, 56 denotes a clock buffer including the buffers Bu53–Bu55, and Bu56 denotes a buffer having its input end connected to the sequential circuit 52 and its output end connected to the data output terminal 55 for externally outputting the output data DO7 processed in the sequential circuit 52 from the integrated circuit 50.

The phase-locked circuit 57 is connected to the output end of the buffer Bu56 to adjust timing of internal clock using output signals of the buffer Bu56.

A signal outputted from the buffer Bu50 is represented as SBu50, a signal outputted from the phase-locked circuit 57 is represented as S57, a signal outputted from the buffer Bu51 is represented as SBu51, a signal outputted from the buffer Bu53 is represented as SBu53, and a signal outputted from the sequential circuit 52 is represented as S52.

Figure 12:
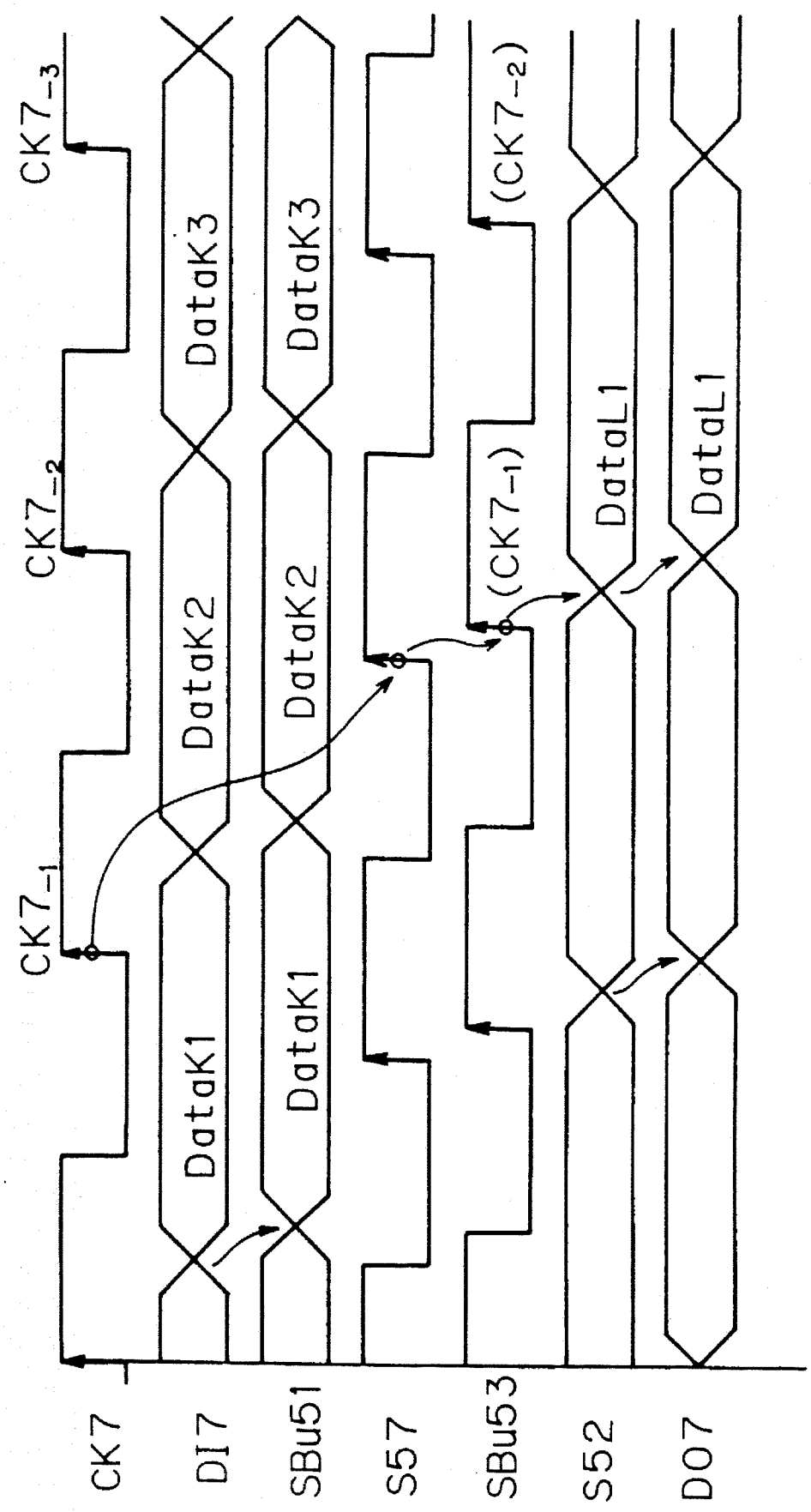
FIG. 12 is a timing chart showing the operation of the integrated circuit shown in FIG. 11.

Next, the operation of the integrated circuit 50 shown in FIG. 11 will be described referring to FIG. 12. The input data DI7 is inputted from the data input terminal 54 in synchronization with the clock signal CK7 inputted to the clock input terminal 53. The input data DI7 includes a plurality of data such as dataK1, dataK2, dataK3 which are sequentially inputted.

The clock signal CK7 inputted to the clock input terminal 53 is captured into the integrated circuit 50 through the buffer Bu50. That is, the buffer Bu50 outputs the signal SBu50 into the integrated circuit 50. The signal SBu50 has a delay of a certain time with respect to the clock signal CK7 which is added in the buffer Bu50. The phase-locked circuit 57 which has received the output signal SBu50 of the buffer Bu50 outputs the signal S57 to the buffer Bu52. The output signal S57 of the phase-locked circuit 57 has its phase adjusted so that the output signal DO7 of the buffer Bu56 agree with the phase of the clock signal CK7. That is, the propagation delay time of the clock signal in the buffer Bu50, Bu56, the phase-locked circuit 57, the sequential circuit 52 and the clock buffer 56 has just the same length as one cycle of the clock signal CK7.

The inputted input data DI7 is captured into the integrated circuit 50 via the buffer Bu51. That is to say, the buffer Bu51 outputs the signal SBu51 into the integrated circuit 50. This signal SBu51 has a delay of a certain time added in the buffer Bu51 with respect to the clock signal CK7.

Now, first transitions of the inputted clock signal CK7 for each clock are sequentially represented as $CK7_{-1}$, $CK7_{-2}$, and $CK7_{-3}$. The data dataK2 is captured into the sequential circuit 52 to be processed at the first transition ($CK7_{-1}$) of the signal Su53 which corresponds to the first transition $CK7_{-1}$ of the clock signal CK7.

The data processed in the sequential circuit 52 is outputted to the buffer Bu56 as the signal S52 which is in synchronization with the signal SBu53. The timing of outputting the signal S52 has a delay of a certain time with respect to the signal SBu53. The output data DO7 outputted from the data output terminal 55 is further delayed from the signal S52 due to the delay in the buffer Bu56, and the output timing of the output data DO7 has a skew corresponding just to one cycle of the clock signal CK7 with respect to a first transition of the clock signal CK7. Accordingly, first transitions of the clock signal CK7 and the timing of each data dataL1, L2 and L3 at the output starting time coincide with each other.

Figure 13:
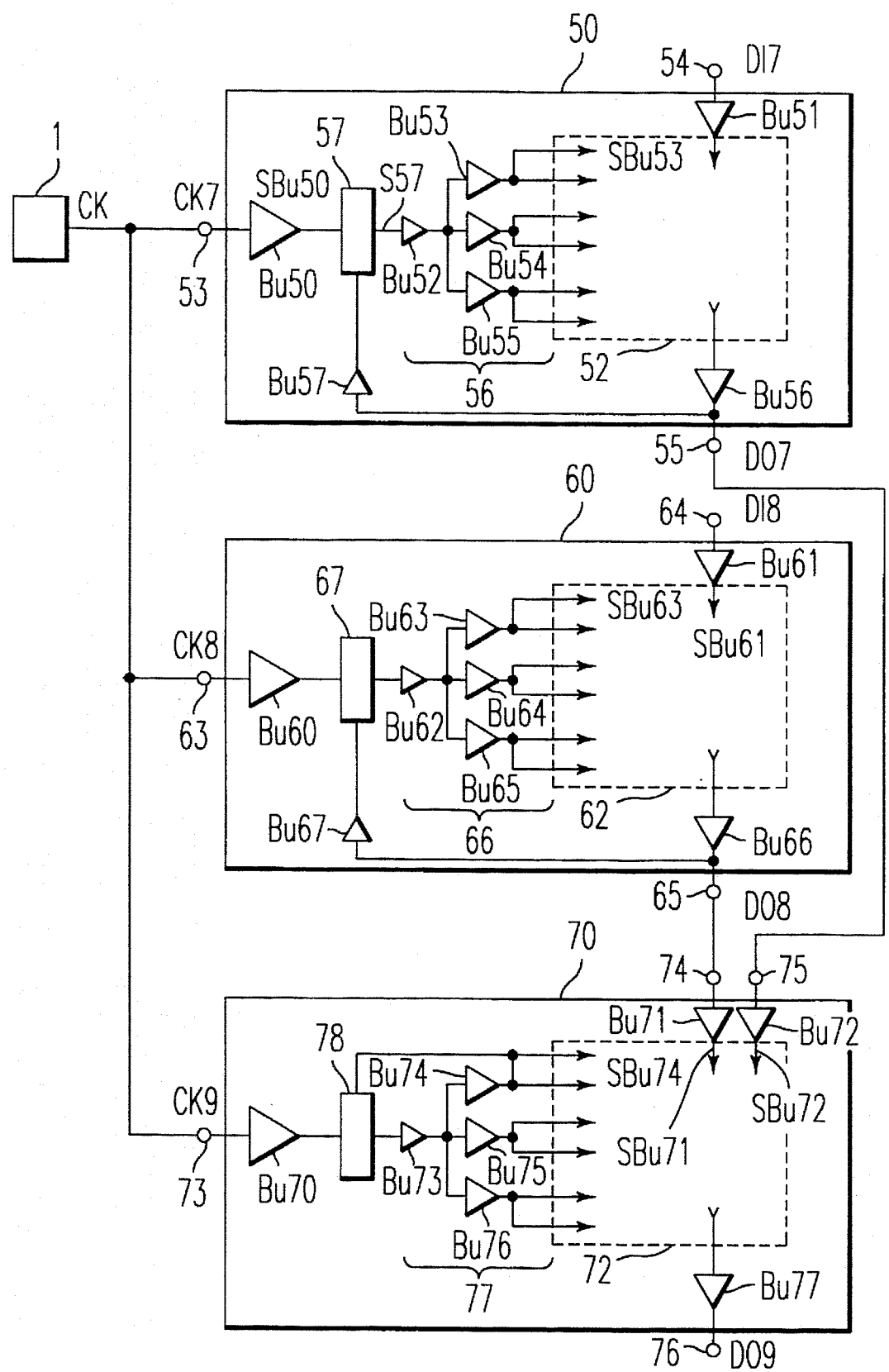
FIG. 13 is a block schematic diagram showing the structure of an integrated circuit device having a plurality of integrated circuits according to the second preferred embodiment of the present invention.

Next, relation among each clock signal, the input data and the output data in the case where a plurality of integrated circuits described above are connected will be described referring to FIG. 13. In FIG. 13, 1 denotes a clock oscillation circuit for outputting the clock signal CK, 50 denotes an integrated circuit having functions equivalent to the integrated circuit 50 shown in FIG. 1, and 60 and 70 denote integrated circuits having sequential circuits and phase-locked circuits similarly to the integrated circuit 50. In FIG. 13, the same reference characters as those in FIG. 11 denote corresponding parts in FIG. 1.

In the figure, 62 and 72 respectively denote sequential circuits provided in the integrated circuits 60 and 70, 63 and 73 respectively denote dock input terminals for receiving clock signals CK8 and CK9 inputted to the integrated circuits 60 and 70 from the outside, 64 denotes a data input terminal for receiving the input data DI8 inputted in the integrated circuit 60 from the outside, 74 and 75 denote data input terminals for receiving the input data inputted to the integrated circuit 70 from the outside, 65 and 76 denote data output terminals for externally outputting the data processed in the integrated circuits 60 and 70, Bu60 and Bu70 denote buffers having input ends connected to the clock input terminals 63 and 73 for capturing the clock signals CK8 and CK9 inputted from the outside into the integrated circuits 60 and 70, Bu61 denotes a buffer having its input end connected to the data input terminal 64 for capturing into the integrated circuit 60 the input data DI8 inputted from the outside, Bu71 and Bu72 denote buffers having input ends connected to the data input terminals 74 and 75 for capturing into the integrated circuit 70 respective input data inputted from the outside, 67 denotes a phase-locked circuit in the integrated circuit 60 connected to the output end of the buffer Bu60, 78 denotes a phase-locked circuit in the integrated circuit 70 connected to the output ends of the buffer Bu70 and Bu74, Bu62 and Bu73 denote main buffers provided in the integrated circuits 60 and 70 and having input terminals connected to the phase-locked circuits 67 and 78 for supplying the clock signals to the sequential circuits 62 and 72 respectively, Bu63–Bu65 and Bu74–Bu76 denote buffers having input ends connected to the output ends of the buffers Bu62 and Bu73 and output ends connected to the sequential circuits 62 and 72 for directly supplying the clock signals to the sequential circuits 62 and 72, 66 and 77 denote clock buffers respectively including the buffers Bu63–Bu65 and the buffers Bu74–Bu76, Bu66 denotes a buffer having its input end connected to the sequential circuit 62 and its output end connected to the data output terminal 65 for outputting the output data DO8 processed in the sequential circuit 62 out of the integrated circuit 60, Bu67 denotes a buffer having an input and connected to the output end of the buffer Bu66 and an output end connected to the phase-locked circuit 67, and 76 denotes a data output terminal receiving the output of the sequential circuit 72 as input at its input end through the buffer Bu76 for outputting the output data DO9 processed in the sequential circuit 72 out of the integrated circuit 70.

Then, a signal outputted from the buffer Bu63 is represented as SBu63 and a signal outputted from the buffer Bu74 is represented as SBu74. Also, signals outputted from the buffers Bu71 and Bu72 are represented as SBu71 and SBu72.

Now, the integrated circuit 50 and the integrated circuit 60 are the first integrated circuits. The integrated circuit 70 is the second integrated circuit. The integrated circuit 50 captures the input data DI7 from the data input terminal 54 into the sequential circuit 52 in synchronization with the clock signal CK7 (SBu53) supplied to the clock input terminal 53 from the outside, processes the data in the sequential circuit 52, and outputs the output data DO7 produced in the sequential circuit 52 from the data output terminal 55 to the outside. The integrated circuit 60 captures the input data DI8 into the sequential circuit 62 from the data input terminal 64 in synchronization with the clock signal CK8 (SBu63) supplied to the clock input terminal 63 from the outside, processes the data in the sequential circuit 62, and outputs the output data DO8 produced in the sequential circuit 62 from the data output terminal 65 to the outside. The clock signals CK7, CK8 and CK9 are different from the clock signal CK outputted from the clock oscillation circuit 1 since the waveforms become less steep and slight delays are caused during transmission, but the differences are so small that they are treated as the same as the clock signal CK.

The integrated circuit 70 has its data input terminal 75 connected to the data output terminal 55 of the integrated circuit 50, and its data input terminal 74 connected to the data output terminal 65 of the integrated circuit 60. The integrated circuit 70 inputs the data DO7 and DO8 respectively processed in the integrated circuit 50 and the integrated circuit 60 from the data input terminal 75 and the data input terminal 74 as the input data. The inputted data DO7 and DO8 are inputted into the sequential circuit 72 as signals SBu72 and SBu71 through the buffer Bu72 and the buffer Bu71, respectively. The sequential circuit 72 is driven by the signal SBu74 to process the inputted signals SBu71 and SBu72.

The operations of the integrated circuit 50, the integrated circuit 60 and the integrated circuit 70 described above are shown in FIG. 14. In the sequential circuit 52 of the integrated circuit 50, the input data DI7 including data dataK11, dataK12, dataK13 and the like which have been inputted from the data input terminal 54 are processed in synchronization with the signal SBu53, and the output data DO7 including produced data dataL9, dataL10, dataL1 and the like are outputted from the data output terminal 55 in synchronization with the signal SBu53. The signal SBu53 has a certain propagation delay time with respect to the clock signal CK, therefore the phase of the clock signal CK7 is delayed from the clock signal CK. This delay is caused in the buffer Bu50, the phase-locked circuit 57 and the clock buffer 56. Then, by passing through the process in the sequential circuit 52 and the buffer Bu28, the output timing of the output data DO7 lags from the first transition of the signal SBu53. The output timing of the output data DO7 is delayed just by one cycle of the clock signal CK with respect to a first transition of the clock signal CK. That is, the output timing of the output data DO7 agree with the phase of the clock signal CK.

Similarly, in the sequential circuit 62 of the integrated circuit 60, the input data DI8 inputted from the data input terminal 64 is processed in synchronization with the signal SBu63, and the produced output data DO8 is outputted from the data output terminal 65 in synchronization with the signal SBu63. The signal SBu63 has a certain propagation delay time with respect to the clock signal CK, so that the clock signal CK8 is delayed from the clock signal CK. This delay is caused in the buffer Bu60, the phase-locked circuit 67 and the clock buffer 66. Then by passing through the process in the sequential circuit 62 and the buffer Bu66, the output timing of the output data DO8 is delayed from a first transition of the signal SBu63. Then, the output timing of the output data DO8 lags just by one cycle of the clock signal CK behind the clock signal CK. That is to say, the timing of beginning to output each of the output data DO8 and the first transitions of the clock signal CK coincide with each other.

In the integrated circuit 70, the clock signal SBu74 for driving the sequential circuit 72 is adjusted so that its phase coincides with the clock signal CK9 by the phase-locked circuit 78. On the other hand, the output data DO8 and the output data DO7 inputted to the data input terminal 74 and the data input terminal 75 are transmitted to the sequential circuit 72 through the buffer Bu72 and the buffer Bu71, so that both data are delayed by a certain time Δt40 if the delay times in the buffers Bu71 and Bu72 are set to be the same. The signal SBu71 and the signal SBu72 inputted in the sequential circuit 72 have the same delay time to widen the range of permitting swings of the internal clock signal SBu74 for processing in the sequential circuit 72, resulting in easy data transmission and reception. Also, since the phases of the signals SBu71 and SBu72 agree with each other, the data processing speed can be increased to speed up the integrated circuit device.

Next, the structure of the phase-locked circuit provided in the integrated circuit shown in FIG. 11 is shown is FIG. 15. In FIG. 15, 1 denotes a clock oscillation circuit provided out of the integrated circuit 50 for generating a clock signal CK to supply the clock signal CK to the clock input terminal 53, 100 denotes a reset circuit provided out of the integrated circuit 50 for generating an initialization signal, Bu50 denotes a buffer having its input end connected to the clock input terminal 53, 208 denotes a delay circuit including delay elements 201–207 connected in series for receiving the clock signal inputted via the buffer Bu50 as input to the delay element 201 and outputting delay clocks DC1 through DC7 which are sequentially delayed from each of taps connected to the output ends of the delay elements 201–207 connected in series, 209 denotes a selection circuit having input ends respectively corresponding to the delay clocks DC1–DC7 outputted from the delay circuit 208, and which are initialized by the inputted initialization signal R for selecting and outputting only one of the inputted delay clocks DC1 through DC7 according to a phase switch signal C and a phase comparison signal R/L, 51 denotes a logic circuit provided in the integrated circuit 50 and operating with the output signal S57 outputted from the selection circuit 209, 56 denotes a clock buffer included in the logic circuit 51 and including buffers Bu50–Bu55 for distributing output S57 of the selection circuit 209 into the logic circuit 51, 52 denotes a sequential circuit included in the logic circuit 51 and driven by output of the clock buffer 56, Bu57 denotes a buffer having its input end connected to the output end of the sequential circuit 52 and having the same delay amount as the buffer Bu50, and 210 denotes a phase comparison circuit for comparing phases of the input B which is the output of the sequential circuit 52 provided through the buffer Bu57 and the input A which is the output of the clock oscillation circuit 1 provided through the buffer Bu50 to output a phase comparison signal R/L and a phase switch signal C in accordance with its result and provide them the selection circuit 209. Now, each of the delay elements 201–207 can be formed of one buffer, and the dock skew of the delay element is about 0.2–0.3 nS. And the total of the delay time of the delay elements 201–207 is required to be not less than one cycle of the clock signal CK.

The structure the same as the selection circuit 109 shown in FIG. 4 is used as the selection circuit 209.

Also, a selection circuit having the same structure as the selection circuit 109a shown in FIG. 7 can be used.

Next, FIG. 16 is a circuit diagram showing one manner of the phase comparison circuit 210 shown in FIG. 15. The input end A of the phase comparison circuit 210 is connected to the data input end D of the DFF 241 and the input end B is connected to the clock input end, where the phase comparison signal R/L is taken out from the output end Q of the DFF 241. The signal inputted from the input end B is inverted by the inverter 242 to be taken out as a phase switch signal C.

The phase comparison circuit 210 outputs the "H" level as the phase comparison signal R/L if the signal inputted from the input end A is at the "H" level when a first transition of the signal inputted from the input end B occurs, and outputs the "L" level as the phase comparison signal R/L if the signal inputted from the input end A is at the "L" level. Accordingly, if the clock signal CK inputted to the input end A of the phase comparison circuit 210 leads the clock signal CK7 inputted to the input end B by ½ cycle or less, for example, the phase comparison signal R/L is at the "H" level. On the contrary, however, if the clock signal CK inputted to the input end A lags the clock signal CK7 inputted to the input end B by less than ½ cycle, the phase comparison signal R/L outputted from the phase comparison circuit 210 is at the "L" level.

Furthermore, the clock signal inputted to the input end B of the phase comparison circuit 21 is inverted to become the phase switch signal C, in which the phase comparison signal R/L is determined at the first transition of the signal inputted to the input end B and the phase switch signal C is generated at the last transition of the signal inputted to the input end B.

Figure 17:
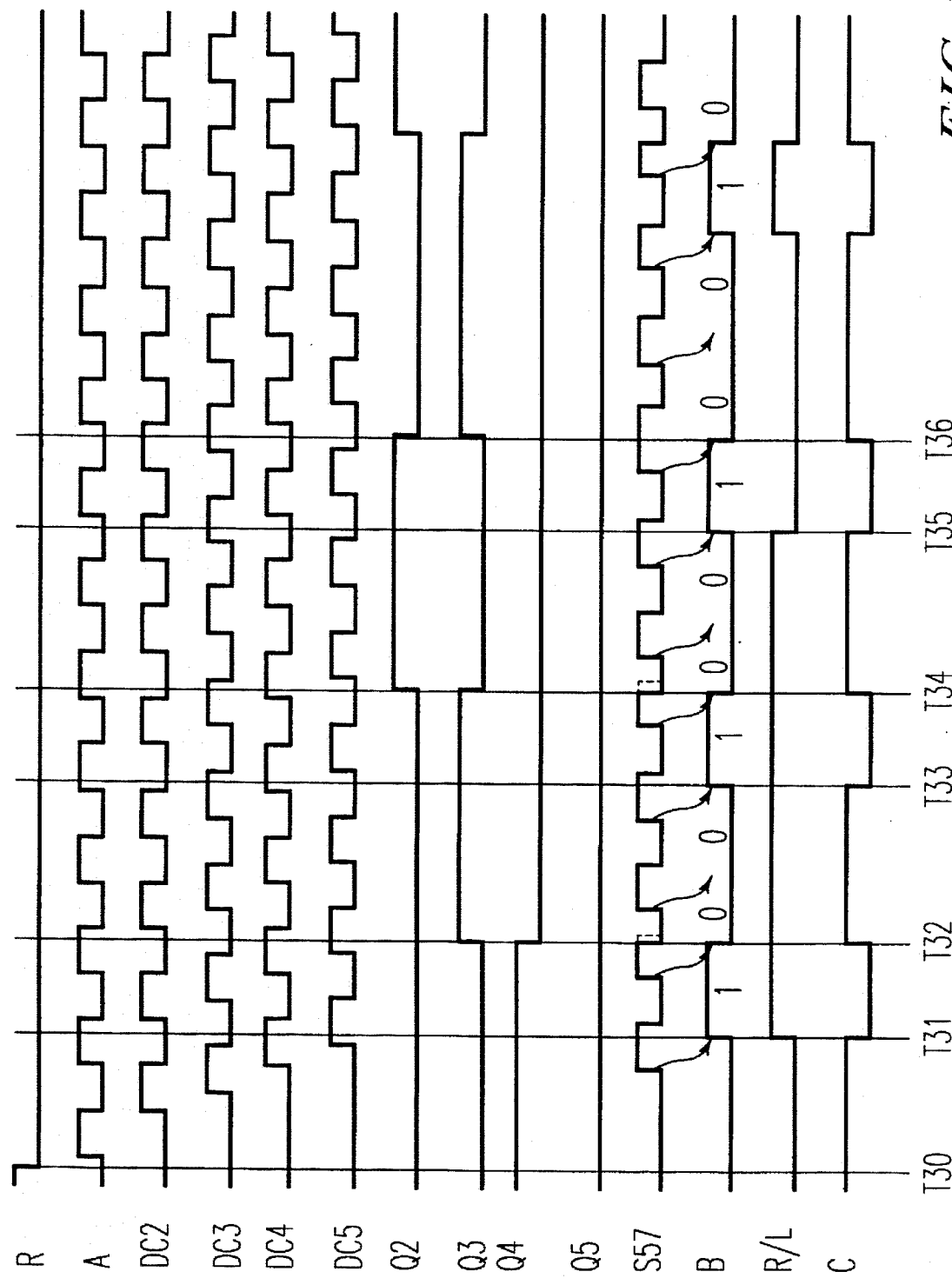
FIG. 17 is a timing chart showing the operation of the phase-locked circuit shown in FIG. 15.

Next, the operation in each part of the integrated circuit device shown in FIG. 15, FIG. 4 and FIG. 16 will be described referring to FIG. 17. FIG. 17 is a timing chart showing the operation of the phase-locked circuit 57 in the integrated circuit 50 shown in FIG. 15.

The output of the sequential circuit 52 is assumed to change as "1" "0" "0" "1" "0" "0". . . in synchronization with the output of the clock buffer 56. Occurrence of some change is enough in practice, but the assumption is made for simplification.

At the initialization (until the time T30), with the initialization signal R attaining the "H" level, the selection circuit 209 is reset so that only the output signal Q4 of the DFF 4 in the selection circuit 209 attains the "H" level and the outputs of the DFF 1–3, DFF 5–7 go to the "L" level, therefore the delay clock DC4 appears in the phase-locked clock S57 outputted from the phase-locked circuit 57. The signal S57 is outputted to the sequential circuit 52 via the clock buffer 56.

At the time T31, as the sequential circuit 52 operates as described above, the signal inputted to the input end B of the phase comparison circuit 210 changes from the "L" level to the "H" level. At this time the phase of the clock signal inputted to the input end A is advanced with respect to the signal inputted to the input end B of the phase comparison circuit 210, so that the signal inputted to the input end B of the phase comparison circuit 210 is at the "H" level and the phase comparison output R/L outputted from the DFF 241 is at the "H" level. On the other hand, the phase switch signal C is an inversion logic of the signal inputted to the input end B, which changes from the "H" level to the "L" level.

Now, in order to make the phase of the clock signal inputted to the input end B and the phase of the clock signal inputted to the input end A closer, the clock signal inputted to the input end A should is be held as it is, and the clock signal inputted to the input end B only should be advanced in phase, which means that the selection should be changed to the clock DC3 which is in the leading phase than the delay clock DC4 presently selected.

At the time T32, the phase switch signal C rises from the "L" level to the "H" level, and the shift register in the selection circuit 209 performs the shift operation. At this time, because the phase comparison signal R/L is at the "H" level, it is in the left shift state. Together with the left shift, the output signal Q4 of the DFF 4 changes from the "H" level to the "L" level, and the output signal Q3 of the DFF3 changes from the "L" level to the "H" level, and the DC3 is outputted as S57 in place of DC4.

At the time T33, DFF 241 captures as data the signal inputted to the input end D as the signal inputted to the input end B changes from the "L" level to the "H" level. At this time, the signal inputted to the input end A leads the signal inputted to the input end B, and the signal inputted to the input end A is at the "H" level. Thus, the phase comparison signal R/L is maintained at the "H" level.

At the time T34, as the signal inputted to the input end B changes from the "H" level to the "L" level, the phase switch signal C changes from the "L" level to the "H" level. At this time, because the phase comparison signal R/L is at the "H" level, left shift is performed in the selection circuit 209, and the signal DC2 is outputted as S57 from the selection circuit 209 in place of the signal DC3.

At the time T35, because the clock signal inputted to the input end A is in the delayed phase with respect to the signal inputted to the input end B and the signal inputted to the input end A is at the "L" level, the phase comparison signal R/L outputted from the DFF 241 changes to the "L" level.

At the time T36, the phase switch signal C changes from the "L" level to the "H" level as the signal inputted to the input end B changes from the "H" level to the "L" level. At this time the phase comparison signal R/L is at the "L" level, so that the shift register in the selection circuit 209 shifts to the right, and thus the signal DC3 is outputted as S57 from the selection circuit 209 in place of the signal DC2.

After that, the phase of the signal inputted to the input end A is repeatedly advanced and delayed from the signal inputted to the input end B every time the signal inputted to the input end B changes, where the output signals DC3 and DC2 are alternately selected.

In such a state, because the skews, i.e., the synchronization accuracy, of the signal inputted to the input end A and the signal inputted to the input end B can be approximated to the clock phase difference of DC2 and DC3, the synchronization accuracy is improved as the delay time for each stage of delay element is made shorter.

With this effect, the phase of the signal inputted to the input end A and the leading edge of the signal inputted to the input end B match with each other with high accuracy, in other words, leading edge of the clock signal CK of the clock oscillation circuit 1 and the timing of starting to output each data of the sequential circuit 52 match with each other if the buffer Bu50 and the buffer Bu57 are the same element, so that the propagation delay times of the buffer Bu50 and the sequential circuit 52 can be apparently cancelled.

Figure 18:
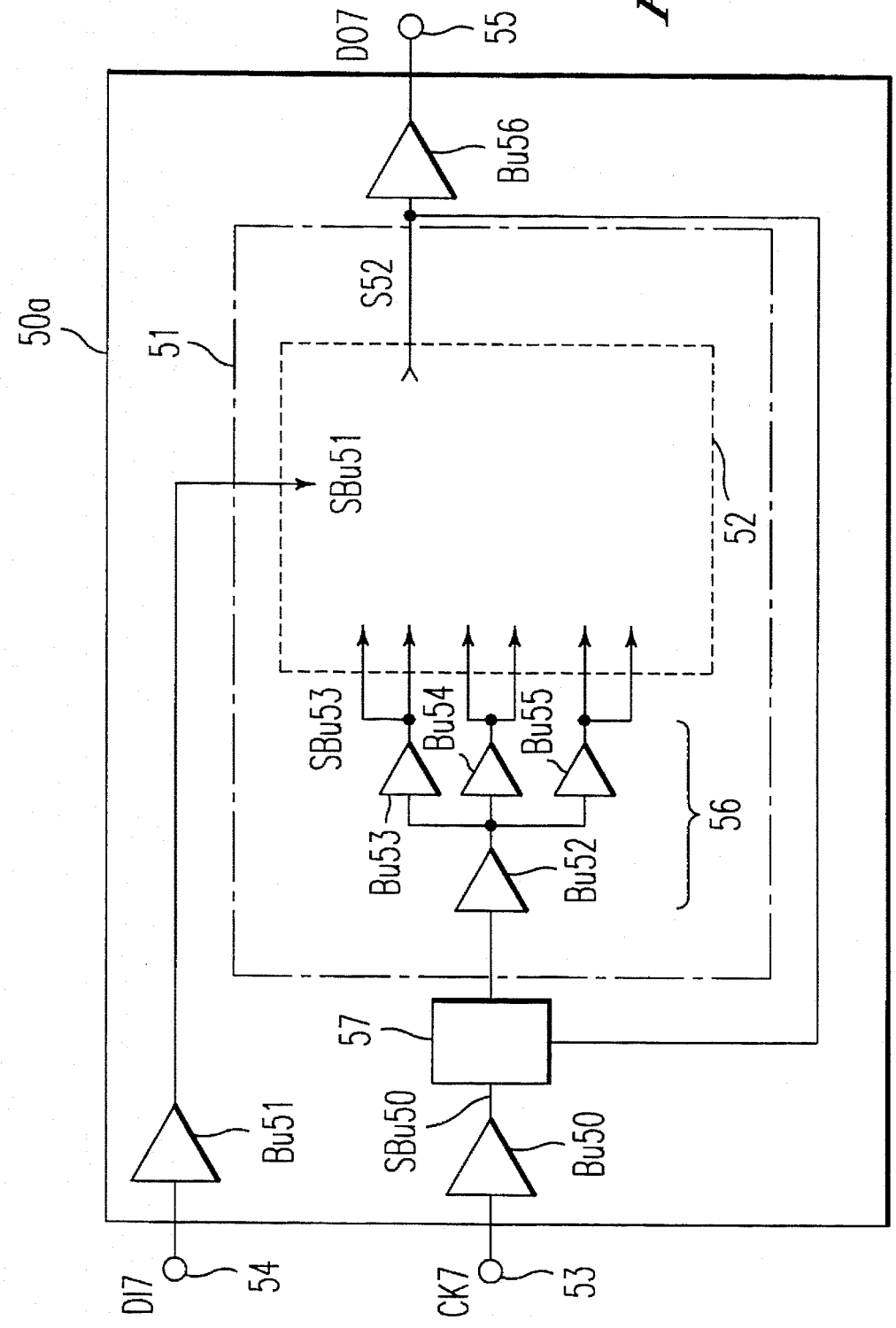
FIG. 18 is a block schematic diagram showing another manner of integrated circuit according to the second preferred embodiment of the present invention.
Figure 19:
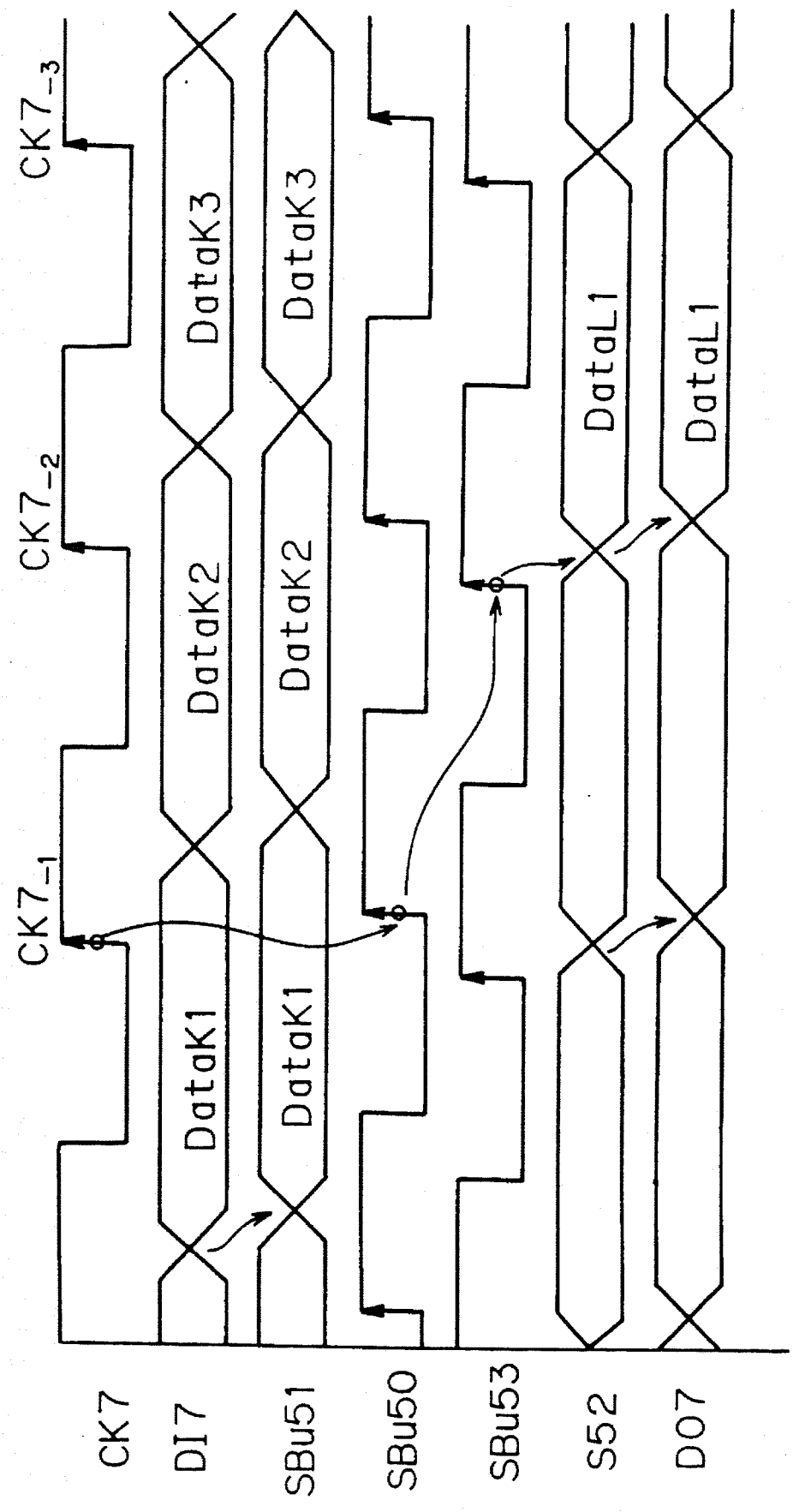
FIG. 19 is a timing chart showing the operation of the integrated circuit shown in FIG. 18.

As shown in FIG. 18, in the integrated circuit 50 shown in FIG. 11, the buffer Bu57 used to feed back the clock signal to the phase-locked circuit 57 can be removed. In this case,the propagation delay times in the clock buffer 56, the sequential circuit 52 and the buffer Bu56 only are compensated by the phase-locked circuit 57. FIG. 19 is a timing chart illustrating the operation of the integrated circuit 50a. In this case, as shown in FIG. 19, the first transition of the clock signal SBu50 outputted from the buffer Bu50 and the timing of starting to output each of the output data DO7 outputted from the data output terminal 55 agree with each other.

Figure 20:
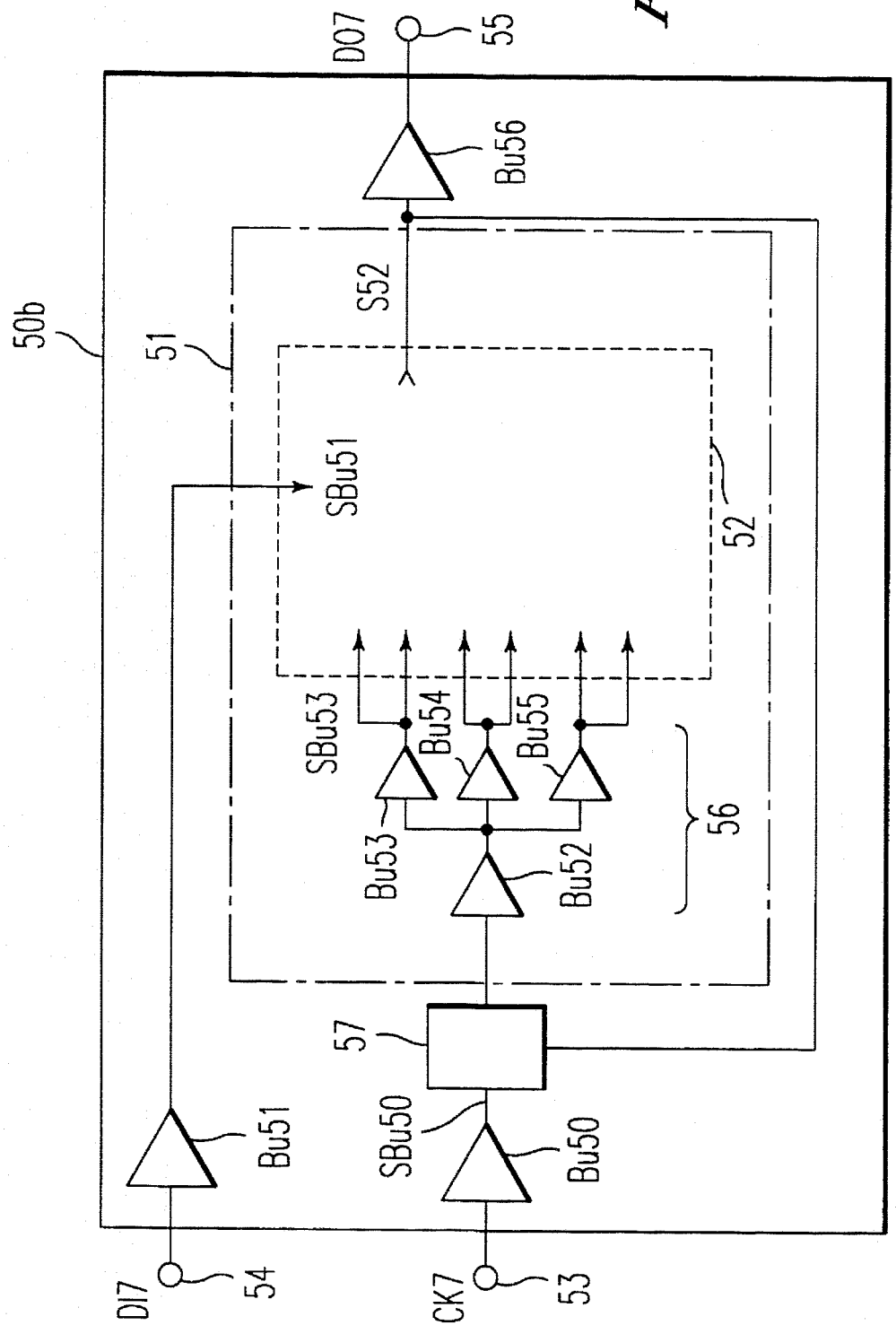
FIG. 20 is a block schematic diagram showing another manner of integrated circuit according to the second preferred embodiment of the present invention.
Figure 21:
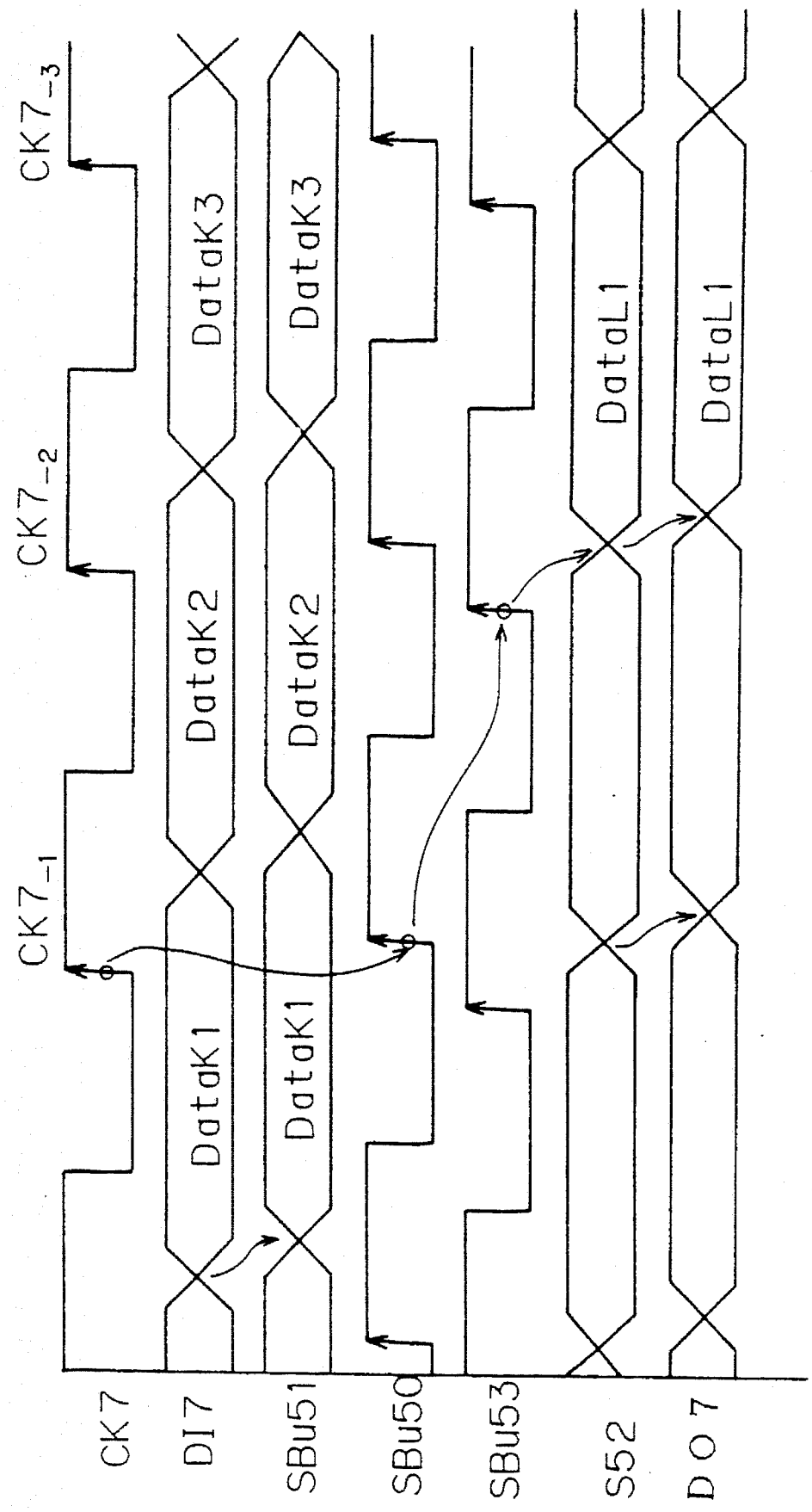
FIG. 21 is a timing chart showing the operation of the integrated circuit shown in FIG. 20.

Also, in the integrated circuit 50 shown in FIG. 11, the buffer Bu57 used to feed back the clock signal to the phase-locked circuit 57 is removed, and, as shown in FIG. 20, the structure can be introduced in which the output signal S52 of the sequential circuit 52 is fed back to the phase-locked circuit 57. In this case, the propagation delay times only of the clock buffer 56 and the sequential circuit 52 are compensated for by the phase-locked circuit 57. FIG. 21 is a timing chart illustrating the operation of the integrated circuit 50b. In this case, as shown in FIG. 21, the first transition of the clock signal SBu50 outputted from the buffer Bu50 and the timing of outputting each data (Data L1 et al.) signal S52 outputted from the sequential circuit 52 coincide with each other.

Figure 22:
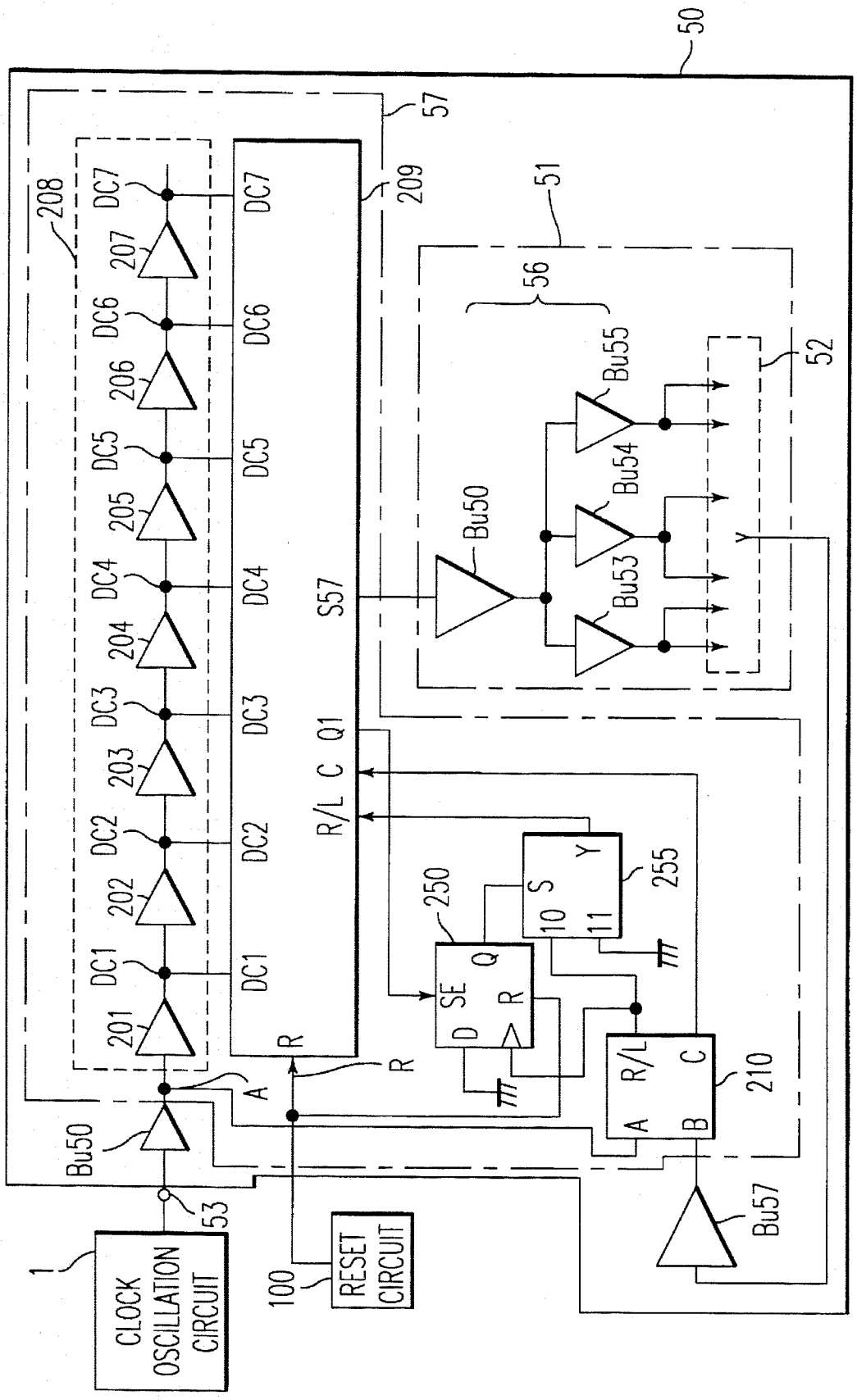
FIG. 22 is a block diagram showing another manner of phase-locked circuit according to the second preferred embodiment of the present invention.

Next, another manner of the phase-locked circuit used in the second preferred embodiment is shown in FIG. 22.

In FIG. 22, 250 denotes a D-type flip-flop circuit having set reset which has its clock input end connected to the phase comparison signal output end R/L of the phase comparison circuit 210, its data input end D fixed to the ground potential, its reset signal input end R receiving as input the initialization signal outputted from the reset circuit 100 and its set signal input end SE receiving the signal Q1 outputted from the selection circuit 209 as input. 255 denotes a selector having its input end I0 connected to the phase comparison signal output end R/L of the phase comparison circuit 210, its input end I1 fixed to the ground potential, its select input end S receiving the output signal Q of the DFF 250 as input and its output end Y connected to the phase comparison signal input end R/L of the selection circuit 209.

Figure 23:
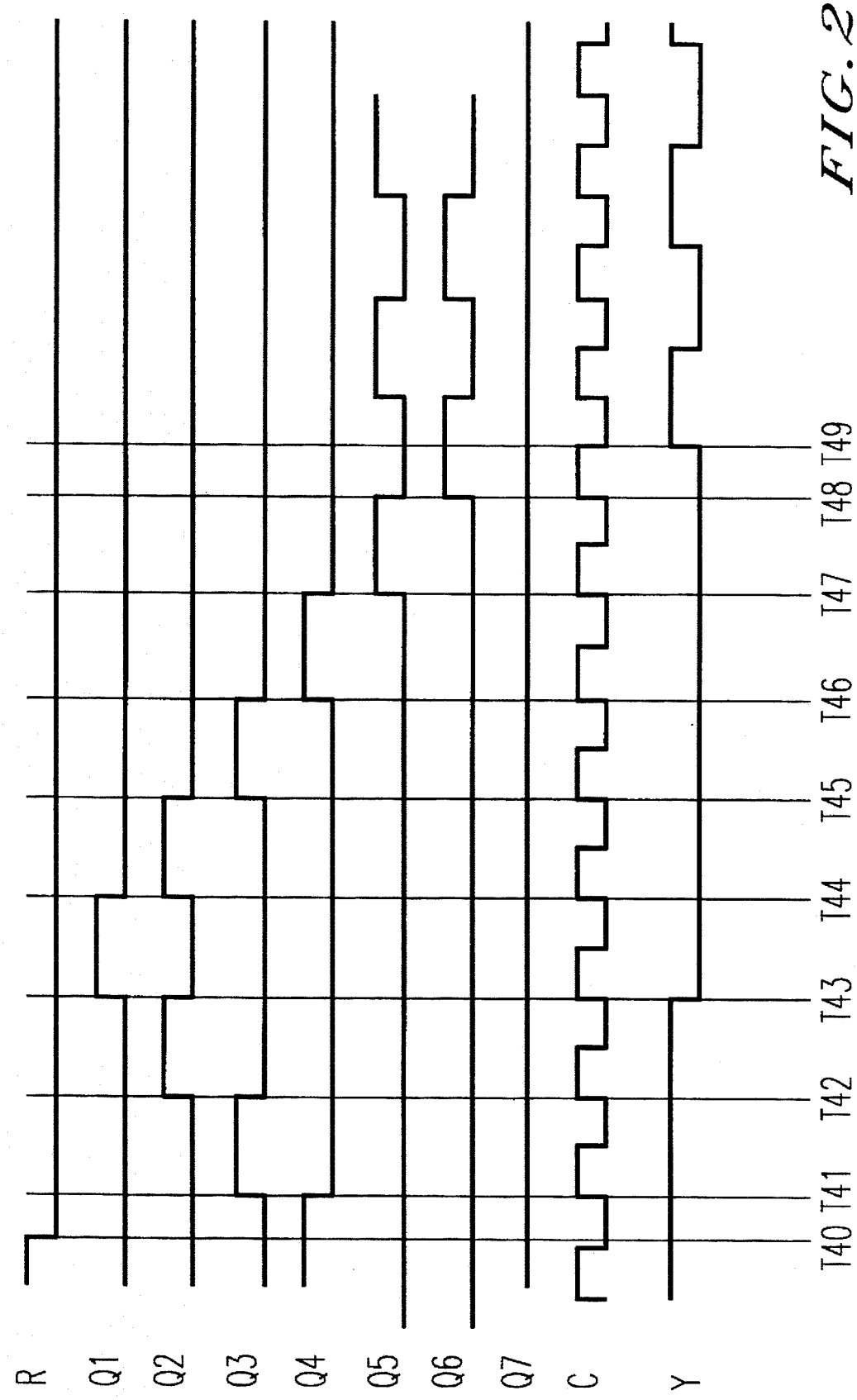
FIG. 23 is a timing chart for illustrating the operation of the phase-locked circuit shown FIG. 22.

Next, the operation will be described referring to FIG. 23 in which this phase-locked circuit is used as the phase-locked circuit 57 of the integrated circuit 50 shown in FIG. 11. For example, it is assumed that the phase comparison signal R/L of the phase comparison circuit 210 is fixed to the "H" level with lack of synchronization after the initialization signal R is inputted to start the operation until the time T49. Then, it is assumed that the selection circuit 209 selects an advanced-phase clock, that is, performs the left-hand shift operation and the output signals Q4–Q1 of the DFF 4- DFF 1 sequentially go to the "H" level (from the time T40 to the time T43). Or, it is assumed that the phases of the signals inputted to the input end A and the input end B do not coincide and the delay clock DC1 at the final stage is finally being selected.

At the time T43, the output signal Q1 of the DFF 1 of the selection circuit 209 attains the "H" level. At this time, the DFF 250 is set, the output signal Q of the DFF 250 goes to the "H" level, and the selector 255 selects the "L" level inputted to the input end I1 to output it from the output end Y, so that the selection circuit 209 is forced to select the delay-phase clock. That is to say, in the time T44–T48, the shift register in the selection circuit 209 sequentially performs the right shift. The selection of the delay-phase clock is maintained until the phase comparison signal R/L of the phase comparison circuit 210 changes from the "L" level to the "H" level. Then, when the signal inputted to the input end B at the time T49 rises from the "L" level to the "H" level, the phase comparison signal R/L inputted to the clock input end of the DFF 250 changes from the "L" level to the "H" level to bring the output signal Q of the DFF 250 to the "L" level, and the selector 255 outputs the phase comparison signal R/L outputted from the phase comparison circuit 210 to the selection circuit 209 as an output signal. That is to say, the selector 255 comes in the normal state in which it selects the phase comparison signal R/L outputted from the phase comparison circuit 210 and outputs it. In this way, delay clocks on following stages are selected until the phase agrees.

As a result, the operation dose not become impossible when the phase synchronization is broken, and, as the phase of the phase-locked clock S57 is continuously changed, such a problem as spike to the signal S57 can be avoided.

Such structure of the circuit can also be used in which the left-hand shift is forced when the "H" level is outputted from the DFF 7 by changing connections of circuits so that the output signal Q7 of the DFF 7 in the selection circuit 209 is inputted to the reset signal input end SE of the DFF 250 and the input end I1 of the selector 255 is fixed to the "H" level.

Figure 24:
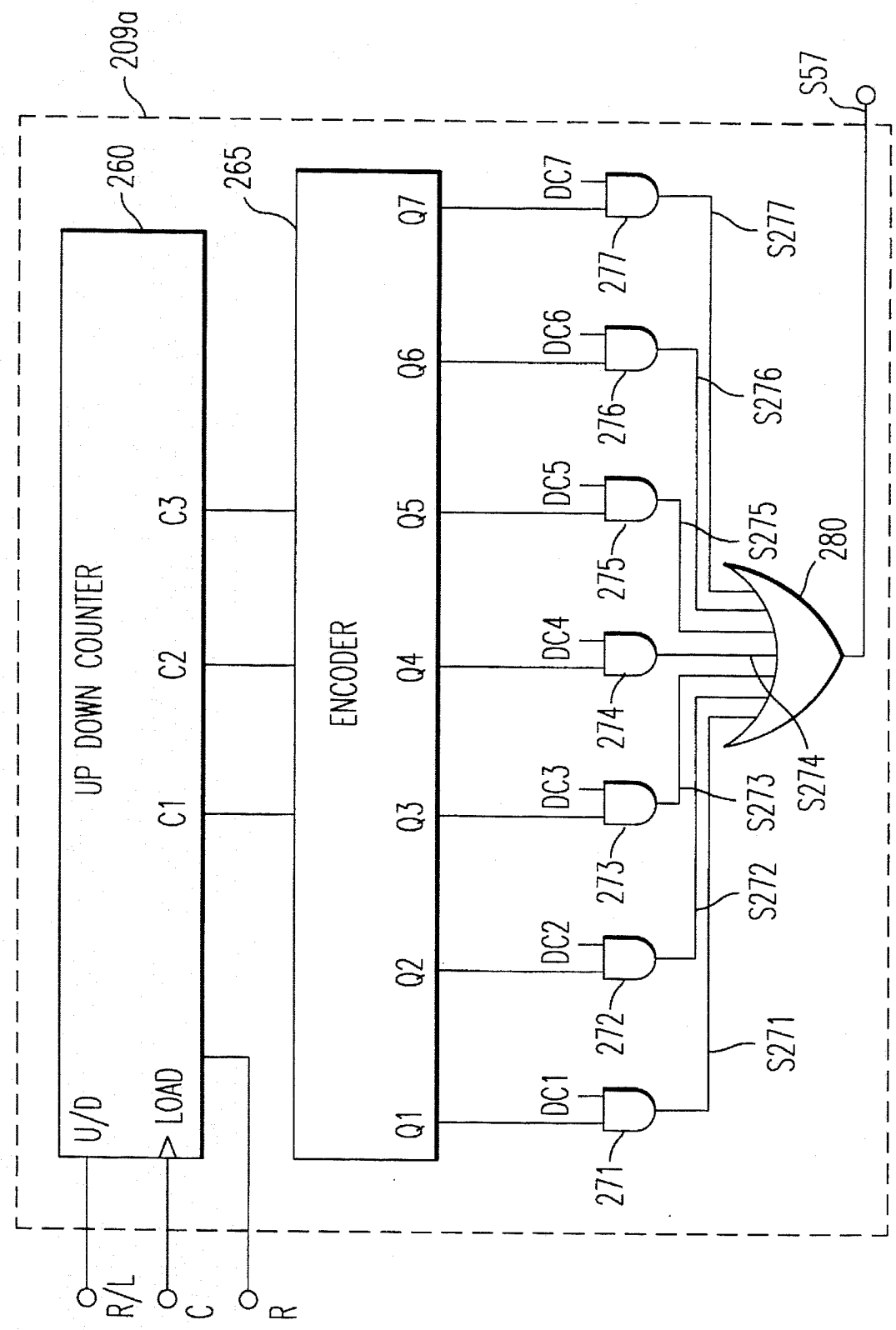
FIG. 24 is a block diagram showing the second manner of phase-locked circuit according to the second preferred embodiment of the present invention.

Next, FIG. 24 shows another manner of selection circuit. It is not preferred because it takes a long time until the phases agree, but the selection circuit can be made using a counter. The selection circuit 209a includes an up-down counter 260, an encoder 265, AND gates 271–277 and an OR gate 280.

The up-down counter 260 receives the phase comparison signal R/L at its up-down input end U/D, the phase switch signal C at its count input end and the initialization signal R at its load input end LOAD. The encoder 265 is connected to output ends C1–C3 of the up-down counter 260 for encoding signals C1–C3 outputted from the up-down counter 260. The AND gates 271–277 each has its one input end connected to each of output signals Q1–Q7 of the encoder 265 and the other input end connected to corresponding one of the delay docks DC1–DC7. The OR gate 280 receives the output signals S271–S277 of the AND gates 271–277 at its corresponding input ends and takes out the output signal as the phase-locked clock S57.

A truth table of the up-down counter 260 is shown in Table 1.

TABLE 1

| Load | Count input | U/D | C1 | C2 | C3 |
|---|---|---|---|---|---|
| H | — | — | 1 | 0 | 0 |
| L | ↑ | H | Down count | | |
| L | ↑ | L | Up count | | |

Figure 2:
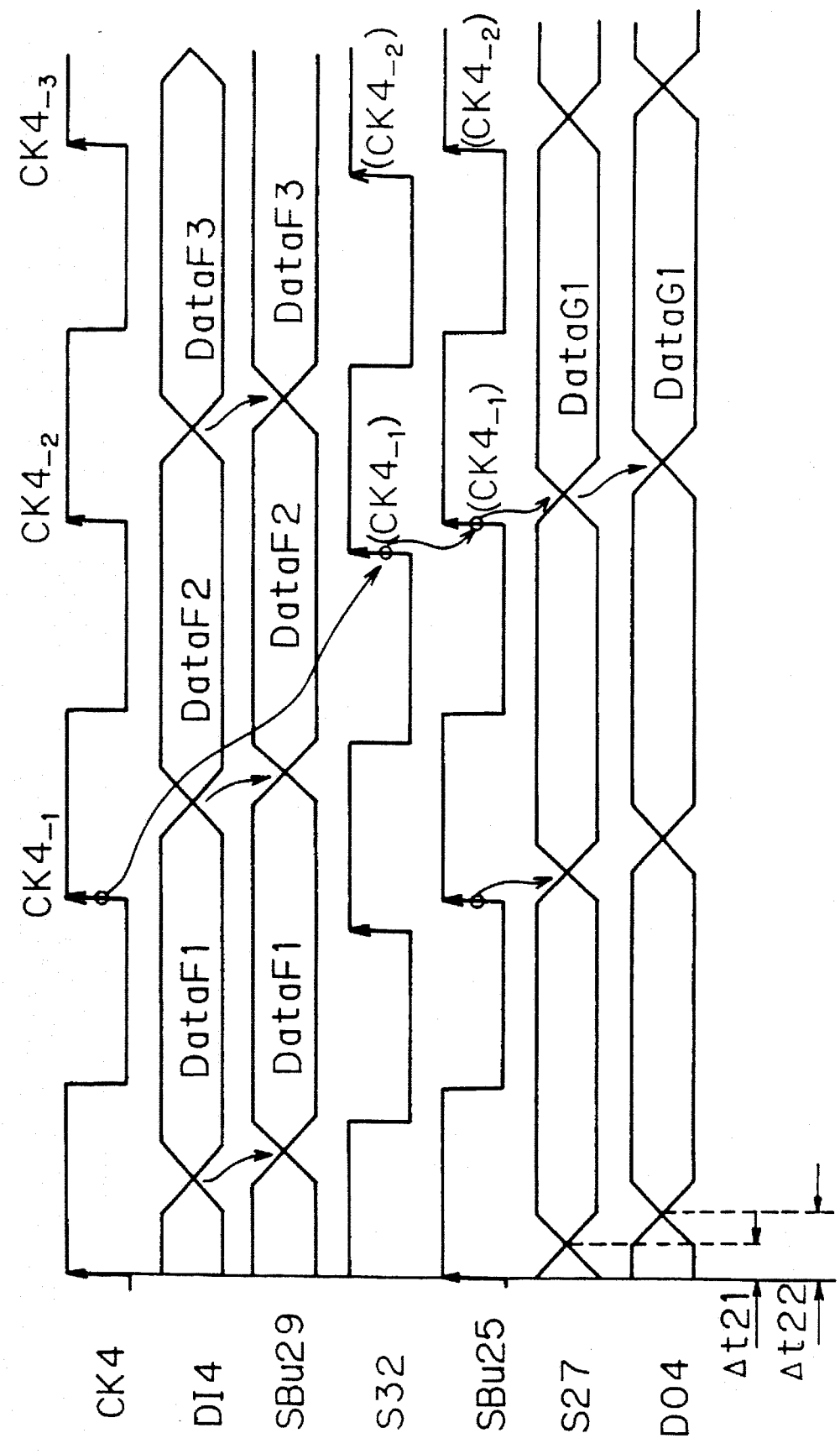
FIG. 2 is a timing chart showing the operation of the integrated circuit shown in FIG. 1.

A truth table of the encoder 265 is shown in FIG. 2.

TABLE 2

| C1 | C2 | C3 | Q1 | Q2 | Q3 | Q4 | Q5 | Q6 | Q7 |
|---|---|---|---|---|---|---|---|---|---|
| 0 | 0 | 0 | 0 | 0 | 0 | 0 | 0 | 0 | 0 |
| 0 | 0 | 1 | 1 | 0 | 0 | 0 | 0 | 0 | 0 |
| 0 | 1 | 0 | 0 | 1 | 0 | 0 | 0 | 0 | 0 |
| 0 | 1 | 1 | 0 | 0 | 1 | 0 | 0 | 0 | 0 |
| 1 | 0 | 0 | 0 | 0 | 0 | 1 | 0 | 0 | 0 |
| 1 | 0 | 1 | 0 | 0 | 0 | 0 | 1 | 0 | 0 |
| 1 | 1 | 0 | 0 | 0 | 0 | 0 | 0 | 1 | 0 |
| 1 | 1 | 1 | 0 | 0 | 0 | 0 | 0 | 0 | 1 |

At the initialization, the counter output ="100" and the encoder output Q4 ="H". When the phase comparison signal R/L is at the "H" level, the counter performs down counting and the encoder 265 changes the selection to a delay clock in the advanced phase, so that the same operation as the selection circuit 209 can be performed.

Figure 25:
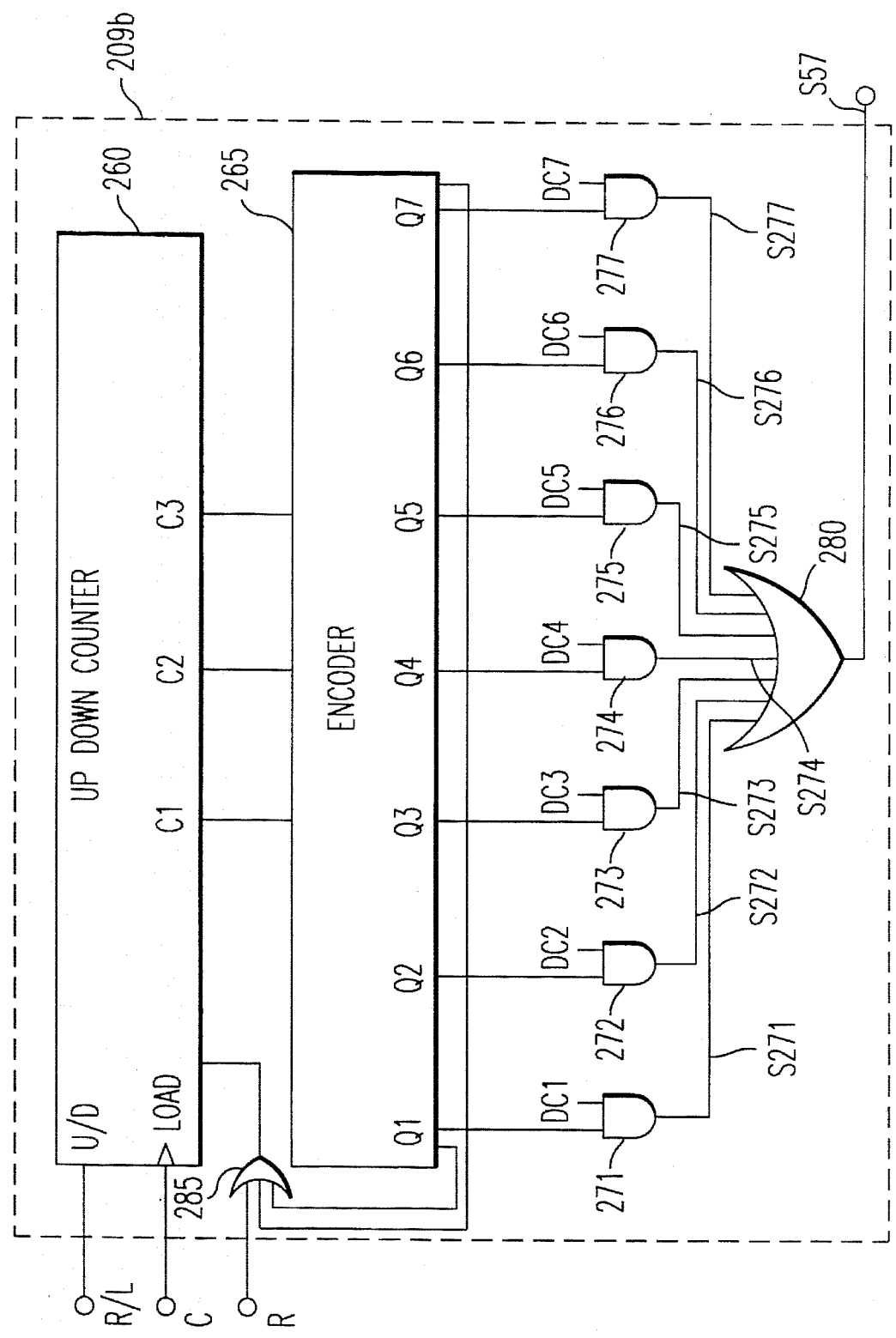
FIG. 25 is a block diagram showing the third manner of phase-locked circuit according to the second preferred embodiment of the present invention.

Next, another manner of the selection circuit is shown in FIG. 25. FIG. 25 is a circuit diagram showing the structure of the selection circuit. In FIG. 25, 285 denotes an OR gate receiving as input the reset signal R at its first input end, the output signal Q7 of the encoder 265 at its second input end and the output signal Q1 of the encoder 265 at its third input end, and the reference characters the same as those in FIG. 24 denote the corresponding parts in FIG. 24. The selection circuit 209b shown in FIG. 25 is different from the selection circuit 209a shown in FIG. 24 in that the OR gate 285 is provided therein. The OR gate 285 takes a logical sum of the output signals Q1 and Q7 of the encoder 265 and the initialization signal input R, of which output is used as an initialization signal. By providing the OR gate 285, the selection circuit 209b can be reset even when the output signal Q1 or Q7 of the encoder 265 goes to the "H" level. For example, if phase synchronization is broken and the delay clock DC1, DC7 outputted from the delay elements at the first or the final stage of the delay circuit 108 is selected, forced initialization can be exerted on the phase-locked circuit 57.

Figure 26:
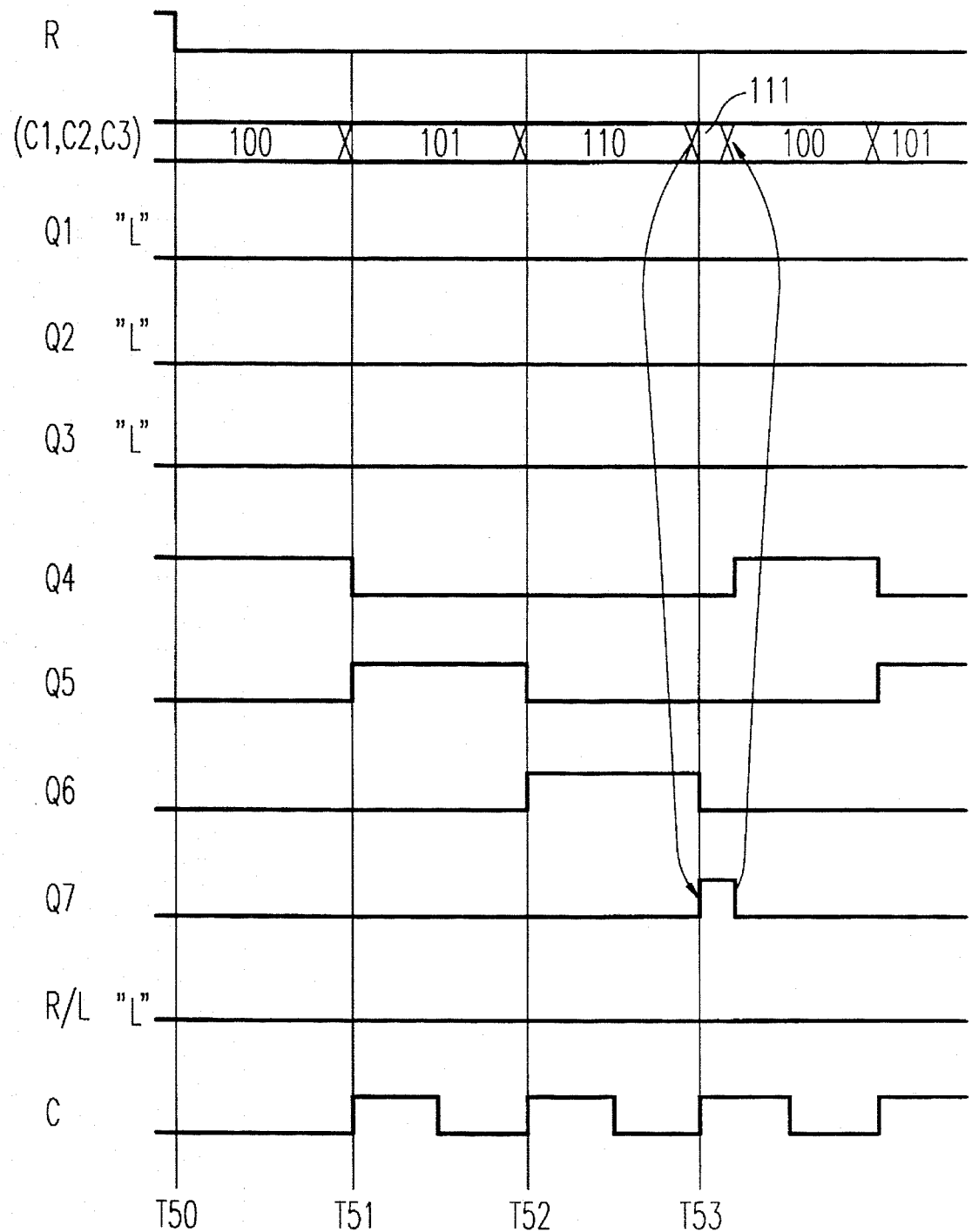
FIG. 26 is a timing chart for illustrating the operation of the phase-locked circuit shown in FIG. 25.

The operation of the selection circuit 209b will be described referring to the timing chart of FIG. 26. In FIG. 26, until the time T50, with the reset signal R attaining the "H" level, the selection circuit 209b is reset, (1, 0, 0) is outputted from the up-down counter 260 as the output signal (C1, C2, C3), and the output signal Q4 of the encoder 265 only is at the "H" level and other output signals Q1–Q3, Q5–Q7 are at the "L" level.

Now, the case in which the phase synchronization is broken and the phase comparison signal R/L is fixed to the "L" level will be described. At this time every time the phase switch signal C is inputted in the selection circuit 209b from the phase comparison circuit 210, the up-down counter 260 in the selection circuit 209b counts up to sequentially bring respective output signals Q4–Q7 of the encoder 265 to the "H" level (time T52–T53).

Then, at T53, when the output signal Q7 of the encoder 265 attains the "H" level, the output of the OR gate 285 changes to the "H" level and the up-down counter 260 is reset (time T54). Accordingly, the output signal Q4 of the encoder 265 attains the "H" level, and the output signal Q7 of the DFF 7 goes to the "L" level.

For example, if the phase comparison signal R/L is fixed to the "H" level to the contrary to the above-described case, every time the phase switch signal C is inputted from the phase comparison circuit 210 to the selection circuit 209b, the up-down counter 260 in the selection circuit 209b counts down to sequentially bring the output signals Q4-Q1 of the encoder 265 to the "H" level.

Figure 27:
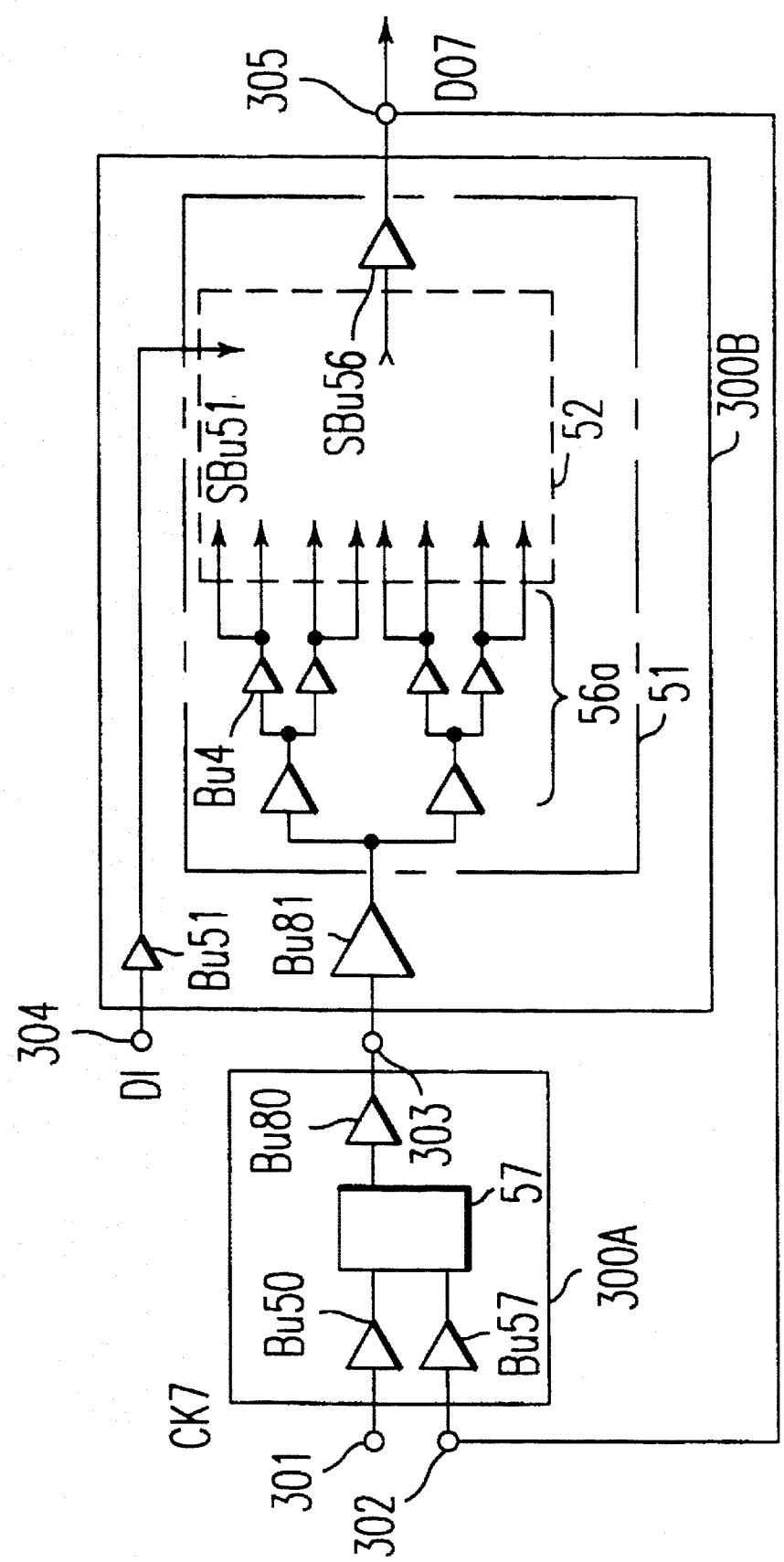
FIG. 27 is a block schematic diagram for illustrating an integrated circuit device according to the third preferred embodiment of the present invention.

Next, the third preferred embodiment of the present invention will be described using FIG. 27. FIG. 27 is a diagram illustrating an integrated circuit and a phase-locked circuit for supplying clock signals to the integrated circuit formed on different substrates. In the figure, 300A denotes an integrated circuit including a phase-locked circuit, and 300 B denotes an integrated circuit including a logic circuit 51 having a sequential circuit 52. In the figure, Bu80 denotes a buffer provided in the integrated circuit 300A having its input end connected to output of the phase-locked circuit 57 for outputting the output signal of the phase-locked circuit 57 out of the integrated circuit 300A, Bu81 denotes a buffer provided in the integrated circuit 300B having its output end connected to a clock buffer 56a for inputting the clock signal from the outside, 301 denotes a clock signal input terminal receiving the clock signal CK7 as input and connected to the input end of a buffer Bu50, 302 denotes an input terminal connected to an input end of a buffer Bu57 for receiving the clock signal fed back to the phase-locked circuit 57, 303 denotes a connection point for connecting the output end of the buffer Bu80 and the input end of the buffer Bu81, 304 denotes a data input terminal to which the input data DI7 is inputted and connected to an input end of a buffer Bu51, 305 denotes a data output terminal connected to an output end of a buffer Bu56 for outputting data processed in the integrated circuit 300B, 56a denotes a clock buffer for distributing to the sequential circuit 52 the clock signal outputted from the buffer Bu81, and the same reference characters as those in FIG. 11 denote parts having equivalent functions to those in FIG. 11. The function of combination of the integrated circuit 300A and the integrated circuit 300B is the same as the integrated circuit 50 shown in FIG. 15.

For example, it is difficult to make the phase of the clock signal CK7 inputted from the connection point 303 coincide with the phase of the output data DO7 only with the integrated circuit 300B. When it is required to make the phases of the output data DO7 and the clock signal CK7 coincide, the integrated circuit 300A in which the phase-locked circuit is formed is connected to the connection point 303 which is a clock signal input terminal of the integrated circuit 300B, the data output terminal 305 and the input terminal 302 are connected, and the clock signal CK7 is inputted to the clock signal input terminal 301 of the integrated circuit 300A. By connecting the integrated circuit 300A to the integrated circuit 300B, the clock signal inputted in the integrated circuit 300B is adequately delayed in the integrated circuit 300A to make the phase of the output data DO7 outputted from the integrated circuit 300B and the phase of the clock signal CK7 coincide with each other.

Figure 28:
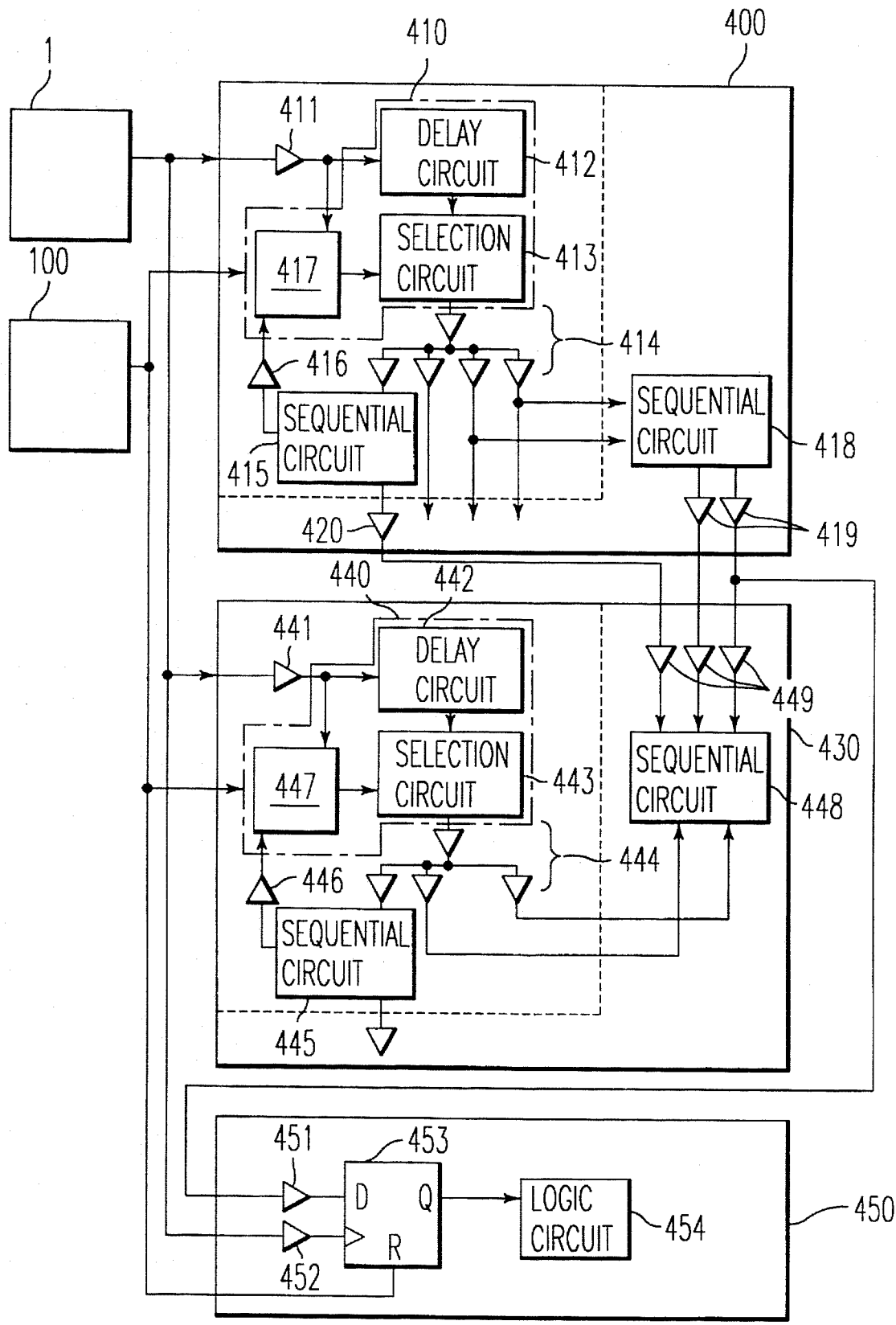
FIG. 28 is a block schematic diagram for illustrating an integrated circuit device of the present invention.
Figure 29:
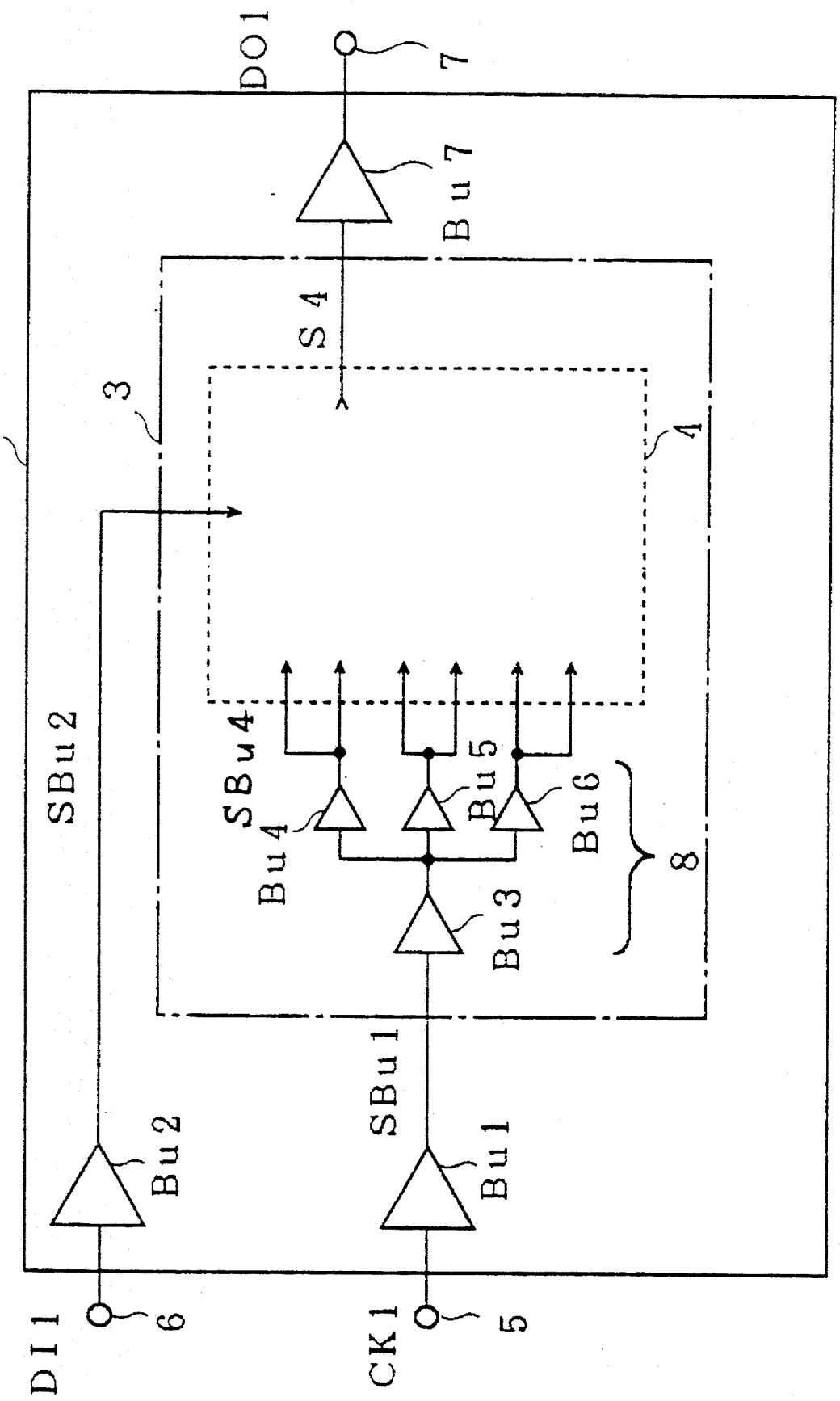
FIG. 29 is a block schematic diagram for illustrating the structure of a conventional integrated circuit.
Figure 30:
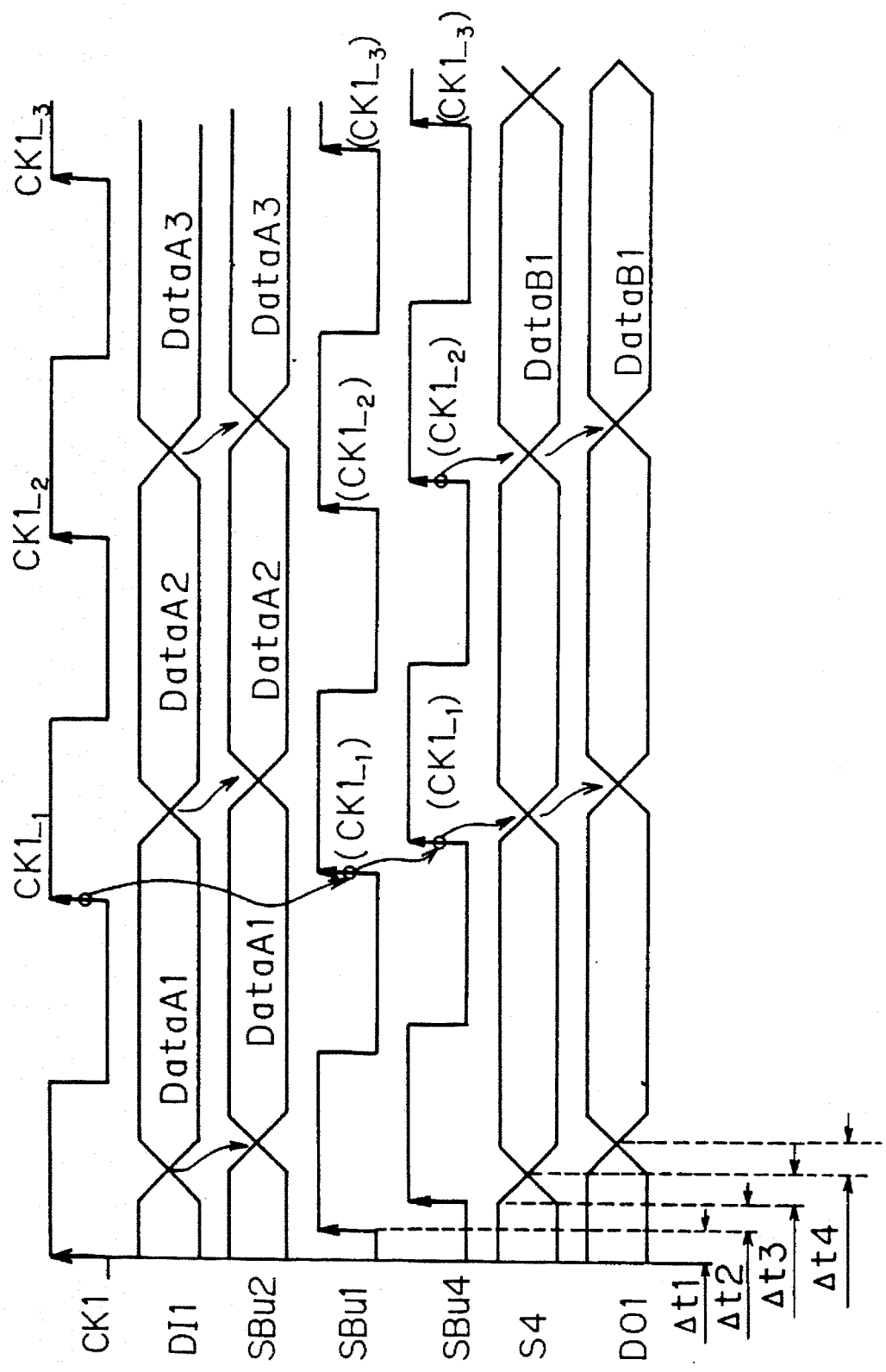
FIG. 30 is a timing chart for illustrating the operation of the conventional integrated circuit.
Figure 31:
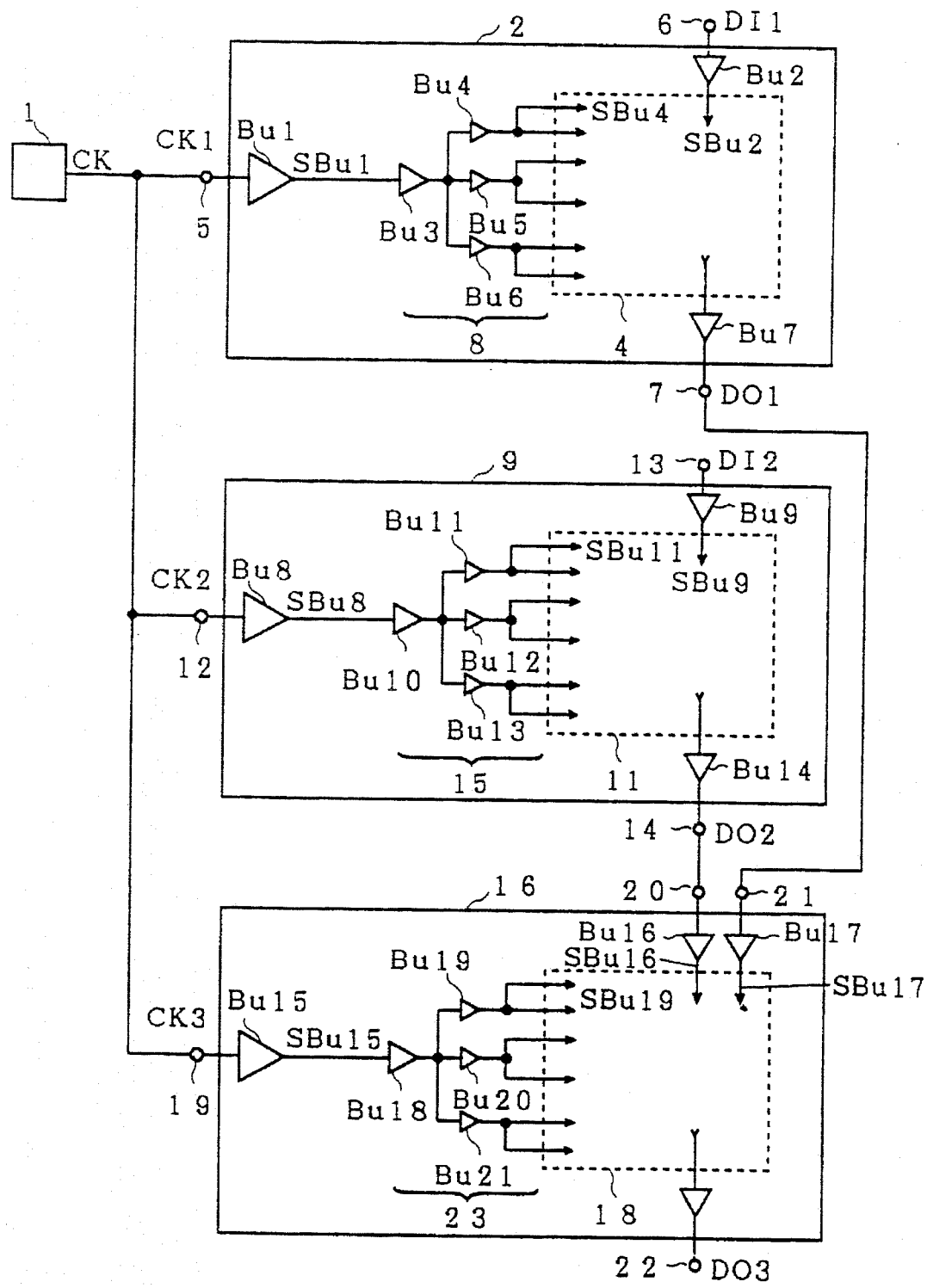
FIG. 31 is a block schematic diagram for illustrating the structure of a conventional integrated circuit device.
Figure 32:
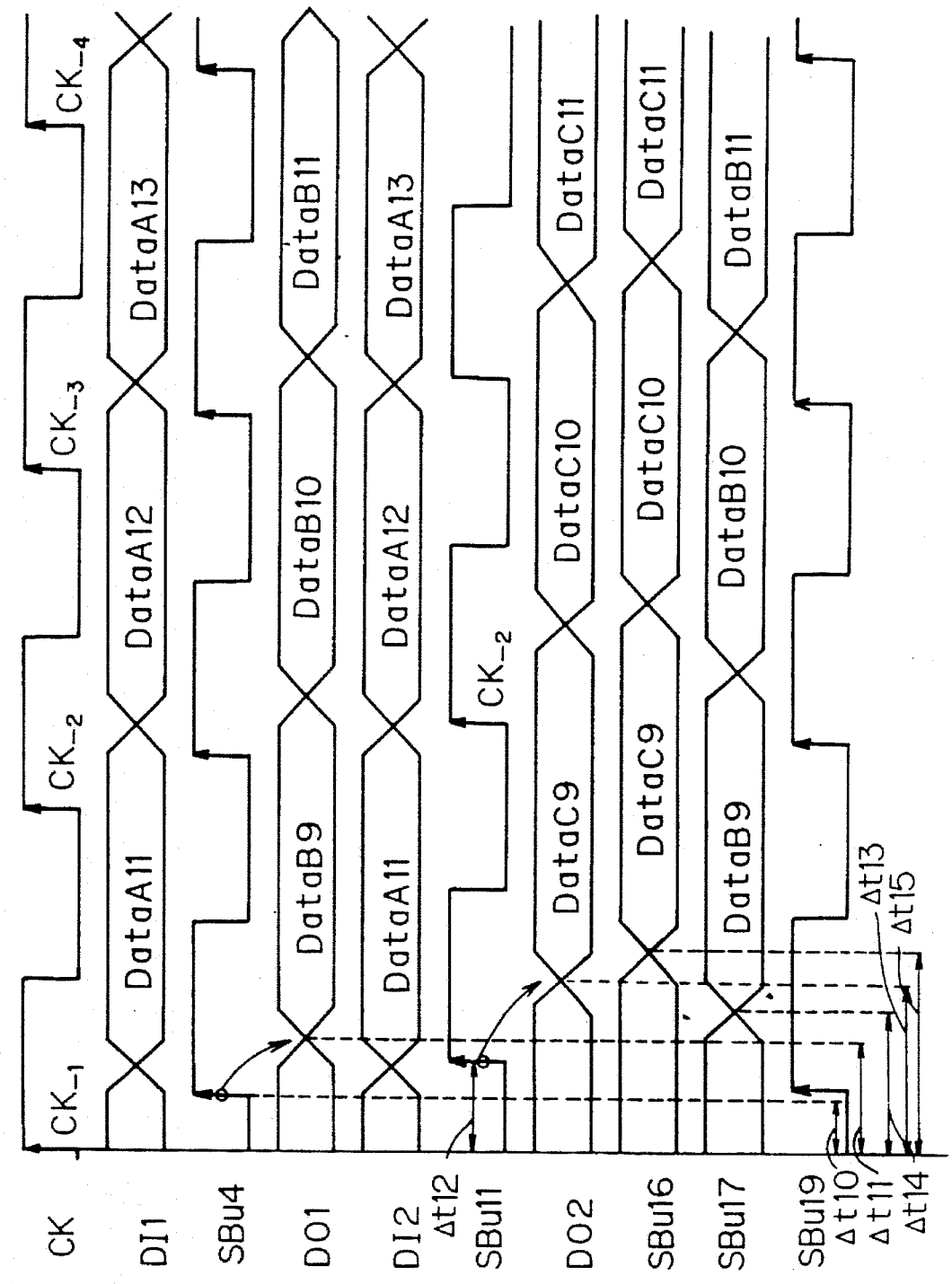
FIG. 32 is a timing chart for illustrating the operation of the conventional integrated circuit device.

Next, the phase synchronization system of the plurality of integrated circuits including the phase-locked circuit is illustrated in FIG. 28. In FIG. 28, 400 denotes an integrated circuit, 411 denotes an input buffer for inputting the clock signal supplied from the external clock oscillation circuit 1 into the integrated circuit 400, 410 denotes a phase-locked circuit receiving the clock signal as input from the input buffer 411 for adjusting the phase of the clock signal, 414 denotes a clock buffer receiving the clock signal outputted from the phase-locked circuit 410 as input for supplying the clock signal to each circuit in the integrated circuit 400, 415 and 418 denote sequential circuits driven by the clock signal outputted from the clock buffer, 419 denotes an output buffer receiving output of a sequential circuit 418 as input for outputting the output signal of the sequential circuit 418 out of the integrated circuit 400 and 420 denotes an output buffer receiving output of the sequential circuit 415 as input for outputting the output signal of the sequential circuit 415 out of the integrated circuit 400. The phase-locked circuit 410 includes a delay circuit 412, a phase comparison circuit 417 and a selection circuit 413. The delay circuit 412 receives output of the input buffer 411 as input to output a plurality of delay clocks having different delay times to the selection circuit 413. The selection circuit 413 selects a delay clock outputted from the delay circuit corresponding to a control signal outputted from the phase comparison circuit 417 and outputs the same to the clock buffer 414. The output from the sequential circuit 415 is inputted into the phase comparison circuit 417 through the buffer 416. The phase comparison circuit 417 compares the clock signal inputted from the input buffer 411 and the clock signal inputted from the buffer 416 to output a control signal to the selection circuit on the basis of the comparison result.

Also, in the figure, 430 denotes an integrated circuit, 441 denotes an input buffer, 440 denotes a phase-locked circuit, 444 denotes a clock buffer, 445 denotes a sequential circuit, 442 denotes a delay circuit, 447 denotes a phase comparison circuit and 443 denotes a selection circuit, where the part surrounded with the dotted line in the integrated circuit 430 has the structure the same as the part surrounded with the dotted line in the integrated circuit 400. 448 denotes a sequential circuit provided in the integrated circuit 430, receiving the output of the integrated circuit 400 via an input buffer 449 and driven by the clock signal inputted from the clock buffer 444.

In the figure, 450 denotes an integrated circuit for capturing the output of the integrated circuit 400 into a DFF 453 using the clock signal of the clock oscillation circuit 1 to process it in a logic circuit 454.

The phase-locked circuit 410 can cancel the delay in the clock buffer 414, the sequential circuit 415 and the input buffer 411 and the phase-locked circuit 440 can cancel the delay in the clock buffer 444, the sequential circuit 445 and the input buffer 441, so that the transmission of data sent from the integrated circuit 400 to the integrated circuit 430 can be facilitated. Furthermore, in some cases, like the data transmission from the integrated circuit 400 to the integrated circuit 450, the data can be captured directly using the clock signal from the clock oscillation circuit 1 in the DFF 453 on the integrated circuit 450. In practice, the optimum phase match circuit should be selected depending on the transmission speed and delay amount inside the integrated circuit.

At the same time, although the phase-locked circuits 410 and 440 in this preferred embodiment compare phases of outputs of the sequential circuits 415 and 445, it can be of the type which compares the phases of outputs of the clock buffers 414 and 444 as in the preferred embodiment descried above. As to the connections among a plurality of integrated circuits, the type of the phase-locked circuit and the combination of the integrated circuits including the phase-locked circuits may be selected depending on the conditions in use.

While the invention has been shown and described in detail, the foregoing description is in all aspects illustrative and not restrictive. It is therefore understood that numerous modifications and variations can be devised without departing from the scope of the invention.

I claim:

1. An integrated circuit device having an integrated circuit receiving a reference clock signal as input and including a sequential circuit operating in response to a generated clock signal synchronized with said reference clock signal, comprising:

feed back means for feeding back an output signal of said sequential circuit; and a phase-locked circuit connected to said feed back means to receive said output signal of said sequential circuit as input and also supplying said generated clock signal to said sequential circuit while controlling the phase of said generated clock signal so that the skew of said output signal of said sequential circuit in accordance with said reference clock signal is made small whereby said sequential circuit receives data, process said data in accordance with said generated clock signal and outputs a result of the processing as the output signal.

2. The integrated circuit device according to claim 1, wherein said phase-locked circuit comprises;

a delay circuit having a plurality of stages of delay elements connected in series, a clock signal input terminal connected to an input end of the first stage of said delay element and to which said reference clock signal is inputted and a plurality of delay clock output terminals connected to respective output ends of said plurality of delay elements, a selection circuit having a plurality of clock input terminals respectively connected to corresponding ones of said plurality of delay clock output terminals of said delay circuit, an output terminal and a first and a second control terminals, for selecting any of a plurality of clock signals inputted from said delay clock input terminals in response to signals inputted to said first and second control terminals and outputting said generated clock signal to said sequential circuit from said output terminal, and a phase comparison circuit having a first input terminal connected to said feed back means and to which said output signal of said sequential circuit is inputted, a second input terminal receiving said reference clock signal from said clock signal input terminal of said delay circuit, and a first and a second control signal output terminals which correspond to said first and second control terminals of said selection circuit, respectively, for comparing the phases of signals respectively inputted from said first input terminal and said second input terminal to output a phase comparison signal indicating a result of checking advance/delay in phase to said first control terminal from said first control signal output terminal and outputting a phase switch signal indicating timing of selection to said second control terminal from said second control signal output terminal.

3. The integrated circuit device according to claim 2, wherein said delay element includes a buffer circuit for buffering the clock signal.

4. The integrated circuit device according to claim 3, wherein said phase comparison circuit comprises;

a first D flip-flop having a clock input terminal connected to said first input terminal of said phase comparison circuit, a data input terminal connected to said second input terminal and an output terminal connected to said first control signal output terminal, for latching data inputted from said data input terminal and outputting from said output terminal in response to an first transition of the clock signal inputted from said clock input terminal, and a second D flip-flop having a clock input terminal connected to said first input terminal of said phase comparison circuit, an output terminal connected to said second control signal output terminal, an inversion output terminal and a data input terminal connected to said inversion output terminal, for latching the data inputted from said data input terminal and outputting from said output terminal in response to a last transition of the clock signal inputted from said clock input terminal and outputting an inversion logic of the signal outputted from said output end from said inversion output terminal.

5. The integrated circuit device according to claim 2, wherein said selection circuit further comprises;

a shift register connected to said first and second control terminals of said selection circuit and having a plurality of registers which respectively correspond to said plurality of delay clock input terminals, one of said registers for storing data being selected in response to a reset signal, for determining a shift direction of said data in response to said phase comparison signal outputted from said phase comparison circuit and performing shift operation of said data in response to said phase switch signal, and selects said clock signal inputted from said delay clock input terminal which corresponds to said register storing said data.

6. The integrated circuit device according to claim 5, wherein said shift register includes;

a D flip-flop having a data input terminal for data input, a clock input terminal for inputting the phase switch signal inputted in common to said plurality of registers and an output terminal, for latching the data inputted from said data input terminal and outputting from the output terminal in response to the phase switch signal inputted from said clock input terminal, and said selection circuit comprises;

a plurality of AND gates each having a first input terminal connected to corresponding one of said plurality of delay clock input terminals, a second input terminal connected to said output terminal of said D flip-flop provided corresponding to the same delay clock input terminal and an output terminal, switch means provided respectively corresponding to said D flip-flops and having an output terminal connected to said data input terminal of corresponding D flip-flop, a right input terminal connected to said output terminal of said D flip-flop corresponding to the phase switch signal having a delay larger than the phase switch signal selected by corresponding said D flip-flop, a left input terminal connected to said output terminal of said D flip-flop corresponding to the phase switch signal having a delay smaller than the phase switch signal selected by said corresponding D flip-flop and said first control signal input terminal to which said first control signal is inputted, for selecting and outputting from said output terminal one of the two data inputted from said right and left input terminals in response to said first control signal, and an OR gate provided between said plurality of AND gates and said output terminal of said selection circuit and to which outputs of said plurality of AND gates are inputted for taking a logical sum of all the inputs and outputting from said output terminal of said selection circuit.

7. The integrated circuit device according to claim 5, wherein said selection circuit further includes reset signal generating means connected to said shift register for outputting said reset signal to said shift register when the data is moved to said register at the first stage or the final stage of said shift register.

8. The integrated circuit device according to claim 7, wherein each of said plurality of registers comprises:

a D flip-flop having a data input terminal for data input, a clock input terminal for inputting the phase switch signal inputted in common to said plurality of registers, an output terminal and a reset terminal to which the reset signal is inputted, for holding predetermined data at an "H" level or an "L" level in response to the reset signal, latching the data inputted from said data input terminal and outputting in response to the phase switch signal inputted from said clock input terminal, said selection circuit further comprises; a plurality of AND gates each having a first input terminal connected to corresponding one of said plurality of delay clock input terminals, a second input terminal connected to said output terminal of said D flip-flop provided corresponding to the same delay clock input terminal and an output terminal, switch means provided respectively corresponding to said D flip-flops and having an output terminal connected to said data input terminal of corresponding said D flip-flop, a right input terminal connected to said output terminal of said D flip-flop which corresponds to the phase switch signal having a delay larger than the phase switch signal selected by corresponding said D flip-flop, a left input terminal connected to said output terminal of said D flip-flop which corresponds to the clock signal having a delay smaller than the phase switch signal selected by said corresponding D flip-flop and said first control signal input terminal to which a selection signal is inputted, for selecting and outputting from said output terminal one of the two data inputted from said right and left input terminals in response to said first control signal, and a first OR gate provided between said plurality of AND gates and said output terminal of said selection circuit and to which outputs of said plurality of AND gates are inputted for taking a logical sum of all the inputs and outputting from said output terminal of said selection circuit, and said reset signal generating means comprises;

a second OR gate having first and second input terminals with one input terminal connected to the output terminal of said D flip-flop included in said register at the first stage of said shift register, and the other input terminal to which said reset signal is inputted and an output terminal connected to the reset terminals of said plurality of D flip-flops.

9. The integrated circuit device according to claim 7, wherein each of said plurality of register includes:

a D flip-flop having a reset function having a data input terminal for data input, a clock input terminal for inputting the phase switch signal inputted to said plurality of registers in common, an output terminal and a reset terminal to which the reset signal is inputted, for holding data at an "H" level or an "L" level in response to the reset signal, latching the data inputted from said data input terminal and outputting in response to the phase switch signal inputted from said clock input terminal, said selection circuit further includes;

a plurality of AND gates each having a first input terminal connected to corresponding one of said plurality of delay clock input terminals, a second input terminal connected to the output terminal of said D flip-flop provided corresponding to the same delay clock input terminal and an output terminal, switch means corresponding to said D flip-flops respectively and having an output terminal connected to said data input terminal of corresponding said D flip-flop, a right input terminal connected to said output terminal of said D flip-flop which corresponds to the phase switch signal having a delay larger than the signal selected by corresponding said D flip-flop, a left input terminal connected to said output terminal of said D flip-flop which corresponds to the phase switch signal having a delay smaller than the phase switch signal selected by corresponding said D flip-flop and a selection signal input terminal to which said first control signal is inputted, for selecting and outputting from said output terminal one of the two data inputted from said right and left input terminals in response to inputted said first control signal, and a first OR gate provided between said plurality of AND gates and said output terminal of said selection circuit for inputting outputs of said plurality of AND gates and taking a logical sum of all the inputs and outputting from said output terminal of said selection circuit, and said reset signal generating means includes;

a second OR gate having first and second input terminals with one input terminal connected to the output terminal of said D flip-flop includes in said shift register at the final state of said shift register, and the other input terminal for inputting said reset signal and an output terminal connected to the reset terminals of said plurality of D flip-flops.

10. The integrated circuit device according to claim 5, wherein said phase-locked circuit further comprises shift control means connected to said first control signal output terminal of said phase comparison circuit and said first control terminal of said selection circuit for outputting to said first control terminal a signal for forcing said shift register to shift in a direction opposite to the direction indicated by said phase comparison signal when the data is moved to the register at the first or final stage in the shift register and holding the opposite direction state until said phase comparison signal changes.

11. The integrated circuit device according to claim 10, wherein said shift control means includes, a D flip-flop having a clock input terminal connected to said first control signal output terminal of said phase comparison circuit, a data input terminal fixed to ground, a reset terminal receiving said reset signal for resetting said selection circuit and a set terminal receiving output of said first stage of register of said shift register, and for latching as data the "L" level when being reset by said reset signal, being set when said first stage of register outputs the "H" level to latch the "H" level as data, latching the data inputted from said data input terminal and outputting from said output terminal in response to an up edge of the first control signal inputted from said clock input terminal, and signal selecting means having a first input terminal connected to the first control signal output terminal of said phase comparison circuit, a second input terminal fixed to the "L" level, a select terminal connected to said output terminal of said D flip-flop and an output terminal connected to the first control terminal of said selection circuit for outputting a signal inputted to said first or second input terminal from said output terminal in response to output of said D flip-flop inputted from said select terminal.

12. The integrated circuit device according to claim 1, wherein said integrated circuit includes a first and a second integrated circuits, and said phase-locked circuit is provided in said first integrated circuit, said sequential circuit is provided in said second integrated circuit, and said first integrated circuit is formed on a different substrate from said second integrated circuit.

13. The integrated circuit device according to claim 1, wherein said integrated circuit further comprises a first buffer circuit for buffering the inputted reference clock signal, and said feed back means comprises a second buffer circuit having the same delay amount as said first buffer circuit.

14. The integrated circuit device according to claim 13, wherein said feed back means further comprises a signal line having one end connected to the output terminal of said sequential circuit from which said output signal of said sequential circuit is outputted and the other end connected to an input terminal of said second buffer circuit, and said phase-locked circuit comprises;

a delay circuit having a plural stages of delay elements connected in series, a clock signal input terminal connected to the input end of said delay element at the first stage and to which said reference clock signal is inputted through said first buffer circuit and a plurality of delay clock output terminals connected to respective output terminals of said plurality of delay elements, a selection circuit having a plurality of clock input terminals connected respectively to corresponding ones of said plurality of delay clock output terminals of said delay circuit, an output terminal and a first and a second control terminals, for selecting any of the plurality of clock signals inputted from said delay clock input terminals in response to the signals inputted to said first and second control terminals and outputting to said sequential circuit from said output terminal, and a phase comparison circuit having a first input terminal connected to the output terminal of said second buffer circuit and to which said output signal of said sequential circuit is inputted, a second input terminal receiving said reference clock signal from an output terminal of said first buffer circuit and first and second control signal output terminals which correspond respectively to said first and second control terminals of said selection circuit, for comparing the phase of the signals respectively inputted from said first input terminal and said second input terminal to output a phase comparison signal indicating the result of determination of advance/delay of the phase from said first control signal output terminal to said first control terminal and outputting a phase switch signal indicating timing of selection from said second control signal output terminal to said second control terminal.

15. An integrated circuit device, comprising:

a first integrated circuit including a first sequential circuit which operates in response to a first clock signal and a reference signal as input; and a second integrated circuit including a second sequential circuit which operates in response to a second clock signal and said reference signal as input; wherein said first integrated circuit further includes first feed back means for feeding back an output signal of said first sequential circuit and a first phase-locked circuit connected to said first feed back means and receiving as input said output signal of said first sequential circuit and the reference signal for supplying said first clock signal for driving said first sequential circuit while controlling the phase of said first clock signal for driving said first sequential circuit so that the phase of said output signal of said first sequential circuit is substantially equal to the phase of said reference clock signal, said second integrated circuit further includes second feed back means for feeding back said second clock signal for driving said second sequential circuit at the time of input to said second sequential circuit, a second phase-locked circuit connected to said feed back means and receiving said reference clock signal and said second clock signal for driving said second sequential circuit for supplying said second clock signal for driving said second sequential circuit while controlling the phase of said second clock signal so that the phase of said second clock signal for driving said second sequential circuit at a said time of input is substantially equal to the phase of said reference clock, and said output signal outputted from said first sequential circuit is processed in said second sequential circuit whereby said first and second sequential circuit receive data, process said data in accordance with said first and second clock signals and outputs a result of the processing as the output signal.

16. The integrated circuit device according to claim 15, wherein said first integrated circuit further includes a first buffer circuit for buffering the inputted reference clock signal, and said feed back means includes a second buffer circuit having a delay amount the same as said first buffer circuit.

17. The integrated circuit device according to claim 16, wherein said feed back means of said first integrated circuit further includes;

a signal line having one end connected to an output terminal of said first sequential circuit from which said output signal of said first sequential circuit is outputted and the other end connected to the input terminal of said second buffer circuit, and said first phase-locked circuit includes;

a delay circuit having a plurality of stages of delay elements connected in series, a clock signal input terminal to which said reference clock signal is inputted through said first buffer circuit and a plurality of delay clock output terminals connected to respective output terminals of said plurality of delay elements, a selection circuit having a plurality of clock input terminals connected to corresponding ones of said plurality of delay clock output terminals of said delay circuit, an output terminal and a first and a second control terminals, for selecting any of a plurality of clock signals inputted from said delay clock input terminals in response to signals inputted to said first and second control terminals and outputting to said first sequential circuit from said output terminal, and a phase comparison circuit having a first input terminal connected to the output terminal of said second buffer circuit and to which said output signal of said first sequential circuit is inputted, a second input terminal receiving said reference clock signal from the output terminal of said first buffer circuit and first and second control signal output terminals which respectively correspond to said first and second control terminals of said selection circuit, for comparing the phase of signals respectively inputted from said first input terminal and said second input terminal to output a phase comparison signal indicating a result of determination of advance/delay of the phase from said first control signal output terminal to said first control terminal and outputting a phase switch signal indicating timing of selection from said second control signal output terminal to said second control terminal.

18. An integrated circuit device having an integrated circuit receiving a reference clock signal as input and including a sequential circuit operating in response to a generated clock signal synchronized with said reference clock signal, comprising:

feed back means for feeding back a clock signal inputted to said sequential circuit to drive the sequential circuit;

a delay circuit having a plurality of stages of delay elements connected in series, a clock signal input terminal connected to an input end of said delay element at a first stage and to which said reference clock signal is inputted and plurality of delay clock output terminals connected to respective output ends of said plurality of delay elements;

a selection circuit having a plurality of clock input terminals respectively connected to corresponding ones of said plurality of delay clock output terminals of said delay circuit, an output terminal and first and second control terminals, for selecting any of the plurality of clock signals inputted from said delay clock input terminals in response to signals inputted to said first and second control terminals and outputting to said sequential circuit from said output terminal; and a phase comparison circuit having a first input terminal connected to said feed back means, a second input terminal receiving said reference clock signal from said clock signal input terminal of said delay circuit, first and second control signal output terminals respectively corresponding to said first and second control terminals of said selection circuit, for comparing the phase of the signals inputted respectively from said first input terminal and said second input terminal to output a signal indicating result of determination of advance/delay of phase from said first control signal output terminal to said first control terminal and output a phase switch signal indicating timing of selection from said second control signal output terminal to said control terminal; and said selection circuit further includes;

a shift register connected to said first and second control terminals of said selection circuit and having a plurality of registers which correspond respectively to said plurality of delay clock input terminals, one of said registers being selected for storing data in response to a reset signal, for determining a shift direction of said data in response to said signals outputted from said first and second control terminal of said phase comparison circuit and performing shift operation of said data, and selects said clock signal inputted from said delay clock input terminal which corresponds to said one register which stores said data whereby said sequential circuit receives input data, process said input data in accordance with said generated clock signal and outputs a result of the processing as the output signal said integrated circuit device further comprising shift control means connected to said first control signal output terminal of said phase comparison circuit and an output terminal of a first register of said plurality of registers for outputting to said first control terminal a signal for forcing said shift register to shift in a direction opposite to the direction indicated by said phase comparison signal when the data is moved to the register at the first or final stage in said shift register and holding opposite direction shift state until said signals outputted from said first and second control terminals change changes.

* * * * *

UNITED STATES PATENT AND TRADEMARK OFFICE
CERTIFICATE OF CORRECTION

PATENT NO. : 5,539,344
DATED : July 23, 1996
INVENTOR(S) : Makoto HATAKENAKA

It is certified that error appears in the above-indentified patent and that said Letters Patent is hereby corrected as shown below:

On the title page, Item [54], the Title should read:

-- [54] PHASE-LOCKED CIRCUIT AND INTEGRATED CIRCUIT DEVICE --

Column 1, line 1, the title should read-- PHASE-LOCKED CIRCUIT AND INTEGRATED CIRCUIT DEVICE--.

Signed and Sealed this

Twenty-fourth Day of September, 1996

Attest:

BRUCE LEHMAN

Attesting Officer   Commissioner of Patents and Trademarks